US006466077B1

(12) United States Patent
Miyazaki et al.

(10) Patent No.: US 6,466,077 B1
(45) Date of Patent: Oct. 15, 2002

(54) SEMICONDUCTOR INTEGRATED CIRCUIT DEVICE INCLUDING A SPEED MONITOR CIRCUIT AND A SUBSTRATE BIAS CONTROLLER RESPONSIVE TO THE SPEED-MONITOR CIRCUIT

(75) Inventors: Masayuki Miyazaki, Tokyo; Koichiro Ishibashi, Warabi; Goichi Ono, Kokubunji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/661,371

(22) Filed: Sep. 13, 2000

(30) Foreign Application Priority Data

Sep. 13, 1999 (JP) .......................................... 11-258792
Apr. 18, 2000 (JP) ...................................... 2000-116521

(51) Int. Cl.[7] .................................................. H03K 3/01
(52) U.S. Cl. ....................... 327/534; 327/276; 327/278; 326/33; 326/34; 326/83
(58) Field of Search ................................ 327/276, 277, 327/278, 155, 158, 233, 237, 544, 534; 326/34, 33, 87, 98, 121, 83

(56) References Cited

U.S. PATENT DOCUMENTS 5,610,533 A * 3/1997 Arimoto et al. ............ 327/537
5,838,047 A * 11/1998 Yamauchi et al. .......... 257/372
6,046,627 A * 4/2000 Itoh et al. .................... 327/546
6,097,113 A * 8/2000 Teraoka et al. ............. 327/537
6,166,577 A * 12/2000 Mizuno et al. ............. 327/278

FOREIGN PATENT DOCUMENTS

| | | |
|---|---|---|
| JP | 8-274620 | 10/1996 |
| JP | 11122047 | 4/1999 |

OTHER PUBLICATIONS

U.S. application Ser. No. 08/622,389, filed on Mar. 1996.

* cited by examiner

*Primary Examiner*—Timothy P. Callahan
*Assistant Examiner*—An T. Luu
(74) *Attorney, Agent, or Firm*—Antonelli, Terry, Stout & Kraus, LLP.

(57) ABSTRACT

In a semiconductor integrated circuit device, for realizing high speed, as well as superior product yield rate and usability, while reducing circuit scale and improving on product yield rate and reliability thereof, a main circuit, constructed with CMOS elements, is coupled to a speed monitor circuit for forming a speed signal corresponding to an operating speed thereof and to a substrate bias controller for supplying corresponding substrate bias voltages to the main circuit in response to the speed monitor circuit.

18 Claims, 40 Drawing Sheets

FIG. 32

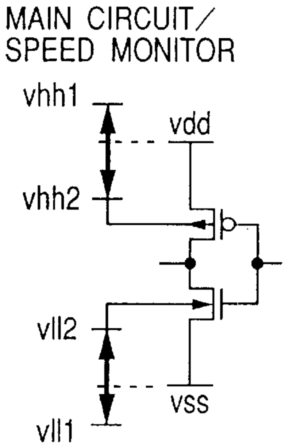

| POWER SUPPLY | VOLTAGE | STATUS | |
|---|---|---|---|
| vhh1<br>vdd<br>vhh2 | 3.3V<br>1.8V<br>1.3V | STANDBY<br>NORMAL OPERATION | ↕ DEVICE CHARACTERISTICS DISTRIBUTION CONTROLLING OPERATION |
| vll2<br>vss<br>vll1 | 0.5V<br>0.0V<br>−1.5V | NORMAL OPERATION<br>STANDBY | ↕ DEVICE CHARACTERISTICS DISTRIBUTION CONTROLLING OPERATION |

FIG. 33

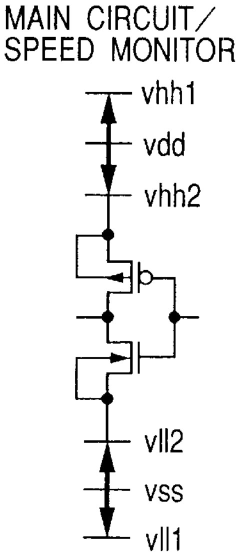

| POWER SUPPLY | VOLTAGE | STATUS | |
|---|---|---|---|
| vhh1<br>vdd<br>vhh2 | 3.3V<br>1.8V<br>1.3V | NORMAL OPERATION<br>STANDBY | ↕ DEVICE CHARACTERISTICS DISTRIBUTION CONTROLLING OPERATION |
| vll2<br>vss<br>vll1 | 0.5V<br>0.0V<br>−1.5V | STANDBY<br>NORMAL OPERATION | ↕ DEVICE CHARACTERISTICS DISTRIBUTION CONTROLLING OPERATION |

| POWER SUPPLY | VOLTAGE | STATUS |
|---|---|---|
| vhh1<br>vdd<br>vhh2 | 3.3V<br>1.8V<br>1.3V | <br>NORMAL OPERATION<br>STANDBY<br>↕ DEVICE CHARACTERISTICS DISTRIBUTION CONTROLLING OPERATION |
| vll2<br>vss<br>vll1 | 0.5V<br>0.0V<br>−1.5V | STANDBY<br>NORMAL OPERATION<br><br>↕ DEVICE CHARACTERISTICS DISTRIBUTION CONTROLLING OPERATION |

SEMICONDUCTOR INTEGRATED CIRCUIT DEVICE INCLUDING A SPEED MONITOR CIRCUIT AND A SUBSTRATE BIAS CONTROLLER RESPONSIVE TO THE SPEED-MONITOR CIRCUIT

FIELD OF THE INVENTION

The present invention relates to a semiconductor circuit device, and in particular relates to a technology, being effective when applied onto a MOS circuit which is operated at a plural number of operating speeds, or when applied onto a MOS circuit on which high speed operation is required.

BACKGROUND OF THE INVENTION

Due to a search made after accomplishing the present invention, though will be explained later, it appears that there is known Japanese Patent Laying-Open No. 11-122047 (1999) (hereinafter, prior art 1), as a prior art seeming to be relevant thereto. In the Patent Laying-Open of the prior art 1, for the purpose of reducing current consumption without deteriorating the process performance or property thereof, a voltage level of a back gate voltage, which is applied to a back gate of a MOS transistor contained within an interior circuit, is supplied by selecting an output voltage from a voltage generator for generating a plurality of voltages, being different in the voltage levels thereof, depending upon an operation mode from a mode signal, thereby changing a threshold level of the MOS transistor. Also, though being different from the above-mentioned prior art 1 in a premise thereof, an invention was already made by the inventors of the present patent application, for compensating process fluctuation of the MOS transistors by means of a substrate bias controlling scheme, and was proposed in Japanese Patent Laying-Open No. 8-274620 (1996) (hereinafter, prior art 2).

In the prior art 1 mentioned above, in order to change the back gate voltage of the MOS transistor for the purpose of a low electric power consumption therein, there are provided a number of the voltage generators, being corresponding to those. As such the voltage generators, for example, a charge pump circuit is used, as shown in attached FIG. 9 of the Patent Laying-Open mentioned above, in particular, in a case of producing a negative back gate voltage therefrom. This charge pump circuit is so-called a DC-DC. converter, however a voltage conversion efficiency is lower, then the power consumption thereof comes to be relative large.

In the prior art 1 mentioned above, when having the plural number of operation modes, as was mentioned in the above, it comes to be large in circuit scale (i.e., the number of transistors in the circuit), due to the necessity of the number of the voltage generators corresponding to them, and in such one, in which the back gates are generated corresponding to the plural number of the operation modes, as was mentioned in the above, on the contrary to that the necessary back gate is only one (1) in one (1) operation mode, there is a problem that wasteful consumption of current occurs for generating the back gate voltages which are not used. Then, it is sufficient that only the voltage generator corresponding thereto is operated when having only one (1) operation mode, while stopping the operation of the voltage generators corresponding to the other back gate voltages, however in such the case, it follows a victim of loosing a responsibility in changing over the operation modes.

For dissolving such the problem in the prior art 1 mentioned above, combining the prior art 2 which was invented previously with it, but from a view point being totally different from that, by the inventors of the present patent application, there is achieved a development of a semiconductor integrated circuit device constructed with CMOS components, with which not only a simplification in circuit and a low electric power thereof can be achieved in common, but also be able to cope with the process fluctuation, thereby enabling a great improvement in the yield of products, and/or a semiconductor integrated circuit device constructed with MOS components, with which can be achieved a high speed, while maintaining an improvements in the yield of products and in the reliability thereof, as well.

An object of the present invention is to provide a semiconductor integrated circuit device for achieving improvements on the low electric power and/or the yield of products, while reducing the scale of circuits (i.e., the number of transistors in the circuit). Other object of the present invention, in addition to the above, is to provide a semiconductor integrated circuit device for achieving an improvement in a usability thereof. A further other object of the present invention is to provide a semiconductor integrated circuit device for achieving a high speed while maintaining the improvements in the yield of products and/or the reliability thereof. And, a further other object of the present invention, in addition to the above, is to provide a semiconductor integrated circuit device, being adapted or suitable to controllability and/or miniaturization of elements or devices. Those objects of the present invention mentioned above and other(s), as well as the novel feature(s) thereof, will be apparent from the description of the present specification and the drawings attached thereto.

SUMMARY OF THE INVENTION

Briefly explaining on an outline of a representative one of the present invention disclosed in the present application, it is as follows. Namely, in a semiconductor integrated circuit device, according to the present invention, for a main circuit being constructed with CMOS are provided a speed monitor circuit for forming a speed signal corresponding to an operating speed thereof, and a substrate bias controller for supplying corresponding substrate bias voltages to semiconductor regions, where a P-channel type MOSFET and a N-channel type MOSFET are formed for constructing the main circuit and the speed monitor circuit mentioned above, respectively, wherein the substrate bias voltages are formed by means of the substrate bias controller mentioned above, so that a speed signal to be set at corresponding one of plural kinds of the operating speeds and the speed signal mentioned above are coincident with.

Briefly explaining on an outline of other representative one of the present invention disclosed in the present application, it is as follows. Namely, in a semiconductor integrated circuit device, according to the present invention, for a main circuit being constructed with CMOS are provided a speed monitor circuit for forming a speed signal corresponding to an operating speed thereof, and a substrate bias controller, thereby controlling substrate bias of the main circuit and the speed monitor circuit mentioned above, so that the speed signal being set corresponding to the plural kinds of operating speeds and the speed signal mentioned above are coincident with, by means of the substrate bias controller mentioned above.

Briefly explaining on an outline of further other representative one of the present invention disclosed in the present application, it is as follows. Namely, in a semiconductor integrated circuit device, according to the present invention, while supplying a positive bias voltage to the semiconductor regions where MOSFET is formed for constructing the main circuit, by means of the substrate bias circuit, there is provided a current limiting circuit for limiting the current supplied to the above-mentioned semiconductor region, in response to the substrate current flowing between the semiconductor region and the source thereof.

BRIEF DESCRIPTION OF THE DRAWINGS

Embodiments of the present invention are described below in conjunction with the figures, in which:

FIG. 32 is a structural diagram for showing a further other embodiment of the semiconductor integrated circuit, according to the present invention;

FIG. 33 is a structural diagram for showing a further other embodiment of the semiconductor integrated circuit, according to the present invention;

FIG. 36(*b*) is a graph for showing characteristic curves of the P-channel type MOSFET between a substrate bias and the threshold voltage, for the purpose of explaining the present invention;

DETAILED DESCRIPTION OF THE PREFERRED EMBODIMENTS

A description will be given of the present invention embodiments by reference to the accompanying drawings.

Figure 1:
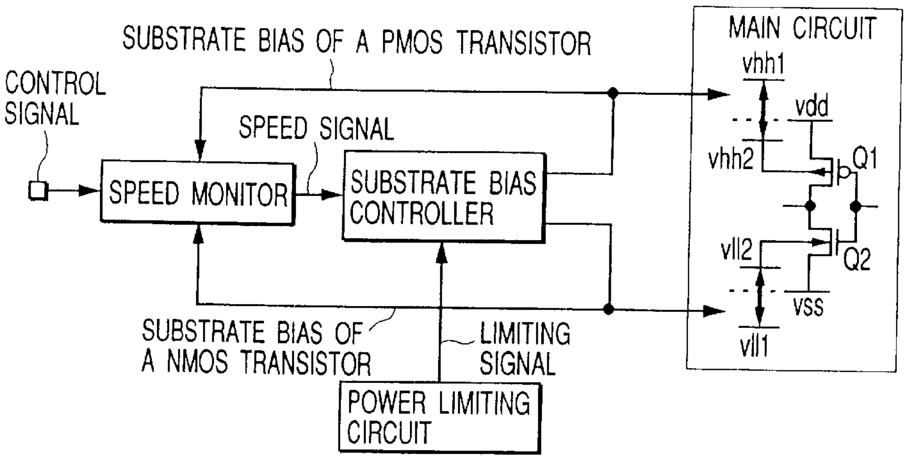
FIG. 1 is a basic block diagram for showing an embodiment of a semiconductor integrated circuit, according to the present invention.

In FIG. 1 is shown a basic block diagram of an embodiment of a semiconductor integrated circuit, according to the present invention. In the same figure, circuit block(s) relating to the present invention is/are taken out to be shown therein. Each of the circuit block(s), although should not be restricted only thereto in particular, it is formed on one (1) piece of a semiconductor substrate, such as a single crystal silicon, through a manufacturing technology for a conventional CMOS integrated circuit.

In the present application, essentially, a terminology “MOS” should be understood to call for or refer to the structure of metal oxide semiconductor in brief. However, the MOS in accordance with a general reference thereof in recent years, includes one, in which a metal portion essential to the semiconductor device is replaced by an electric conductive material other than metals, such as poly-silicon, and/or other, in which the oxide thereof is replaced with other insulated material(s). Also, a terminology “CMOS” comes to be understood to have a technical meaning, being wide corresponding to the change in the interpretation or understanding of the terminology of the “MOS” mentioned above. Also, either “MOSFET” or “MOS transistor” should not be understood in narrow meaning, in the same manner as was mentioned above, but it comes to be widely understood to include or mean an insulated gate field transistor, essentially. In the present invention, the meaning of the terminology, “MOS”, “MOSFET”, “MOS transistor”, or the like follows the manner of the general reverences or meanings, as was mentioned in the above.

In the same figure, a main circuit is shown as a CMOS inverter including a P-channel type MOSFETQ1 and a N-channel type MOSFETQ2, as a representative one thereof. As an electric power or energy consumed in the semiconductor integrated circuit device, in which the main circuit is constructed with using such the CMOS circuit, there exist a dynamic power consumption due to discharges in the switching operation thereof and a static power consumption due to sub-threshold leak current. The dynamic power consumption is proportional to a square of an electric potential vdd of a power supply, therefore it is possible to reduce the power consumption, effectively, by decreasing down the value of the power supply potential vdd. In recent years, in the main circuit mentioned above, such as in a microprocessor, etc., there is a tendency to achieve a low electric power consumption by decreasing down the power supply potential vdd.

The operating speed of the CMOS circuit mentioned above comes to be slow, accompanying with the decrease of the power supply potential vdd. For the purpose of protecting from deterioration in the operating speed, there is a necessity of decreasing down a threshold voltage of the MOSFET accompanying with the decrease of the power supply potential vdd. However, when the threshold voltage is decreased down, the sub-threshold leak current increases up, extremely, as shown in the characteristic curves between the threshold value voltages and current. Due to this, with proceeding the decrease in the power supply potential vdd, though it was not so large in the conventional art, however the static power consumption due to the sub-threshold leak current comes to rise up, remarkably. Therefore, it is an important problem to be solved to realize the CMOS digital circuit, such as the microprocessor, etc., in which both two aspects can be satisfied with, i.e., the high operating speed and the low electric power consumption.

As the method for dissolving such the problem mentioned above, as was proposed by the above-mentioned prior art 1 (for example, Japanese Patent Laying-Open No. 11-122047 (1999)), there is listed up a method of adjusting the threshold voltage of the MOS transistor by fixing a substrate bias at a plurality of different potentials depending upon the operation modes. However, according to the prior art 1, because of a necessity of a plurality voltage generators provided corresponding to the back gate voltages as was mentioned in the above, in other words, corresponding to a low operating speed mood, a middle operating speed mode and a high operating speed mode, respectively, it has a problem that the circuit scale (i.e., the number of transistors in the circuit) comes to be large, and that wasteful current consumption occurs in the voltage generators, as well.

In this embodiment is used the voltage control technology shown in the prior art 2, which was developed by the above-mentioned inventors of the present application and other(s). Namely, for the purpose of measuring the operating speed of the main circuit, a speed monitor circuit is constructed with the same CMOS circuits. The speed monitor circuit and the main circuit are able to change the threshold voltages of the MOSFETs, by means of a PMOS substrate bias and a NMOS substrate bias which are produced by a substrate bias controller, and as a result of this, being enable to control the operating speed thereof.

Upon receipt of a control signal for exchanging the speed, the speed monitor circuit outputs a speed signal depending upon the operating speed. The substrate bias controller detects the operating speed of the speed monitor circuit on the basis of the speed signal which the speed monitor circuit outputs, and compares it to the above-mentioned control signal, thereby generating the PMOS substrate bias and the NMOS substrate bias so that the operating speed comes to be a desired value, to be supplied to semiconductor regions (i.e., well regions, normally), in which the P-channel type MOSFET Q1 and the N-channel type MOSFET Q2 of the speed monitor circuit and the main circuit are formed, respectively.

For example, in a case where the speed signal is slow with respect to the operating speed which is set by the above-mentioned control signal to the speed monitor circuit, the substrate bias is set to be shallow so that the threshold voltage of the MOSFET is controlled to decrease down, thereby bringing the operating speed of the speed monitor circuit and the main circuit to be fast. On the contrary thereto, in a case where the speed signal is faster than the preset value mentioned above, the substrate bias is set to be deep so that the threshold voltage of the MOSFET rises up, thereby bringing the operating speed of the speed monitor circuit and the main circuit to be slow. When the operating speed of the speed monitor circuit is equal to the preset value mentioned above, the substrate bias continues to be maintained as it is. As a result of this, it is possible for the speed monitor circuit and the main circuit to keep the operating speed corresponding to the operation modes set by the above-mentioned control signal.

In this embodiment, though should not restricted to especially, the PMOS substrate bias and the NMOS substrate bias are set so that they can be applied to, both as a forward bias and as a reverse bias, for example, the former from vhh1 to vhh2 while the latter from v111 to v112. As shown by the characteristic curves between the substrate bias and the threshold voltage shown in the FIGS. 36(*a*) and (*b*), in particular, the characteristic curve of the N-channel type MOSFET depicted by FIG. 36(*a*) and the characteristic curve of the P-channel type MOSFET depicted by FIG. 36(*b*), when the back bias is applied to the MOS transistor, the substrate bias comes to be in the direction to be deep, while the threshold voltage high. When the back bias is applied to the MOS transistor, the substrate bias comes to be in the direction to be shallow, while the threshold voltage low.

For example, the N-channel type MOSFET decreases down the threshold voltage by bringing the substrate bias to be large, while the P-channel type MOSFET decreases down it by bringing the substrate bias to be small. With the N-channel type MOSFET, in a case where the substrate bias is in a negative potential comparing to a source potential of the N-channel type MOSFET, since the bias is applied across the PN junction in a reverse direction thereof, it is called by the back bias. Also, in a case where the substrate bias is in a positive potential comparing to the source potential, since the bias is applied across the PN junction in a forward direction thereof, it is called by the forward bias. It is contrary to the above, in a case of the P-channel type MOSFET, thus it is called by the back bias when the substrate bias is in a positive potential comparing to the source potential of the P-channel type MOSFET, while being called by the forward bias when it is in the negative potential.

Hereinafter, in the present specification, that the substrate bias is brought to be large in the back bias direction of the MOSFET is expressed by "deepen the substrate bias", while that it is brought to be large in the forward bias direction by "make shallow the substrate bias". From this, it is apparent that the CMOS circuit slows down the operating speed when applying the back bias thereto, while it makes the operating speed fast when applying the forward bias thereto.

In this embodiment, a plural number of the PMOS bias and the NMOS bias can be formed from the speed monitor circuit and the substrate bias controller, which are used in common corresponding to a respective one of the operation modes. As a result of this, it is possible to obtain simplification of the circuit, as well as, to perform the operation of voltage generation with high efficiency, but without occurring wasteful current consumption therein, due to the fact that there exists no voltage generator corresponding to the back gate voltage of no use in that operation mode. For example, when four (4) operation modes are provided, i.e., a standby mode, under which the semiconductor integrated circuit device does not perform any operation, a low speed mode, under which it is set at a low signal processing operation, a middle speed mode, under which it is set at a middle signal processing operation, and a high speed mode, under which it is set at the maximum signal processing operation, the speed monitor circuit and the substrate bias controller mentioned above can be used in common with, corresponding to the respective operation modes.

This means, not only bringing about the simplification of circuits and the low electric power consumption therewith, but it is also possible to set, such as a middle-low speed mode, in the middle between the low speed mode and the middle speed mode mentioned above, and/or a middle-high speed mode, in the middle between the middle speed mode and the high speed mode mentioned above, via setting the above-mentioned control signal. Namely, with such the circuit construction mentioned above, it is possible to set the operating speed of the CMOS circuit, arbitrarily, at a speed depending upon the time for signal processing, from time to time, via the changing of the above-mentioned control signal, i.e., so-called a software, thereby obtaining other effect that a great and remarkable improvement can be achieved in a usability thereof.

With the present embodiment, from the other view point, it is possible to achieve a great and remarkable improvement in the yield (or yield rate) of manufacturing the semiconductor integrated circuit devices. Under such the condition that the miniaturization of the MOSFETs is advanced in recent years, the fluctuations in the sizes and the performance of the MOSFETs come to be large. By the way, in the semiconductor integrated circuit device which is constructed with the CMOS circuits, such as the microprocessor, etc., the operating speed and the power consumption thereof are determined depending upon a result of combining a large number of the MOSFETs. Due to this, even in a case where the MOSFETs have fluctuations in the performances thereof within a microprocessor chip, the fluctuations in performances of the respective MOSFETs are averaged when seeing the performance of the chip as a whole. Accordingly, it comes to be a problem that they have the fluctuations among the chips, in the averaged performance within that chip.

Figure 37:
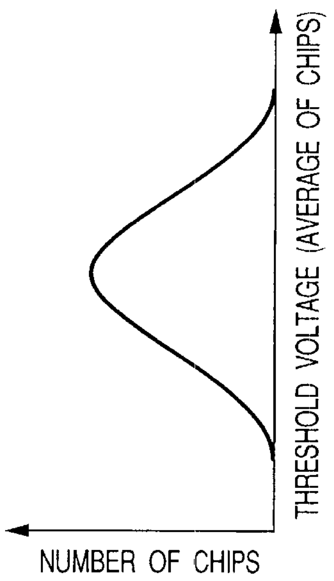
FIG. 37 is a graph for showing distribution of averaged values of the threshold voltages within a chip, for the purpose of explaining the present invention.

As shown in the FIG. 37, the averaged threshold voltage within the chip comes to show a normal distribution curve when the number of the chips is large. And, an expanse or stretch of the distribution curve comes to be large in accordance with the advance of the miniaturization in recent years. In the semiconductor integrated circuit devices, such as the microprocessor, etc., having such the fluctuation therein, the distribution of the fluctuations is changed while having such the expanse therewith as shown in the FIG. 38, when applying the fix substrate bias to all the microprocessor chips, as the back bias (for example, −1.5 V) or the forward bias (for example, +0.5 V) corresponding to the low speed mode or the high speed mode, as was shown in the prior art 1 mentioned above.

Figure 38:
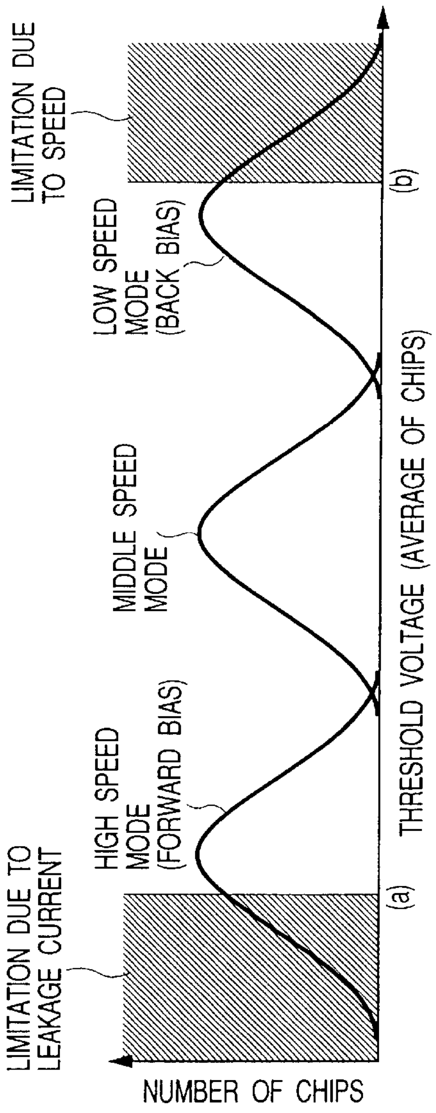
FIG. 38 is also a graph for showing the distribution of averaged values of the threshold voltages within a chip, for the purpose of explaining the present invention.
Figure 39:
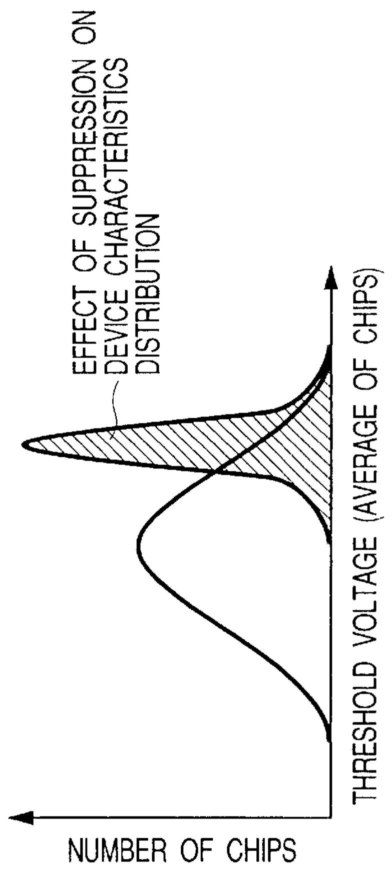
FIG. 39 is also a graph for showing the distribution of averaged values of the threshold voltages within a chip, for the purpose of explaining the present invention.

If assuming that the static power consumption due to the sub-threshold leak current increases too much when the threshold voltage comes to be lower than the point (a) in the FIG. 38, about one-third (⅓) of the microprocessors manufactured cannot be used to operate at the high speed mode. In the same manner, if assuming that the operating speed comes to be slow too much when the threshold voltage comes to be higher than the point (b) in the FIG. 38, also the about one-third (⅓) of the microprocessors manufactured cannot be used to operate at the low electric power consumption mode. After all, the yield rate of the chips comes up to only one-third (⅓), and it deteriorates or lowers the efficiency of manufacturing the semiconductor integrated circuit devices.

In the present embodiment, the PMOS substrate bias and the NMOS substrate bias are formed by combining the speed monitor circuit and the substrate bias controller as was mentioned in the above, therefore the distribution of the threshold voltages in the respective chips is concentrated within a narrow region, due to an effect of suppressing the fluctuations. Namely, in each of the chips, by changing the substrate bias between the back bias and the forward bias (for example, from −1.5 V to +0.5 V), it is possible to suppress the fluctuation in the performances of the microprocessors at a desired position.

By changing the position at which the fluctuation is suppressed by a mode change signal as was mentioned in the above, it is possible to concentrate the fluctuations at the respective positions, i.e., the high speed mode, the middle speed mode, and the low speed or low electric power consumption mode. Accordingly, upon application of the present invention thereto, the microprocessors, each of which is constructed with the CMOS digital circuits, are able to achieve the high speed and the low electric power consumption at the same time, and further improve the yield rate of the chips thereof, greatly and remarkably.

Figure 41:
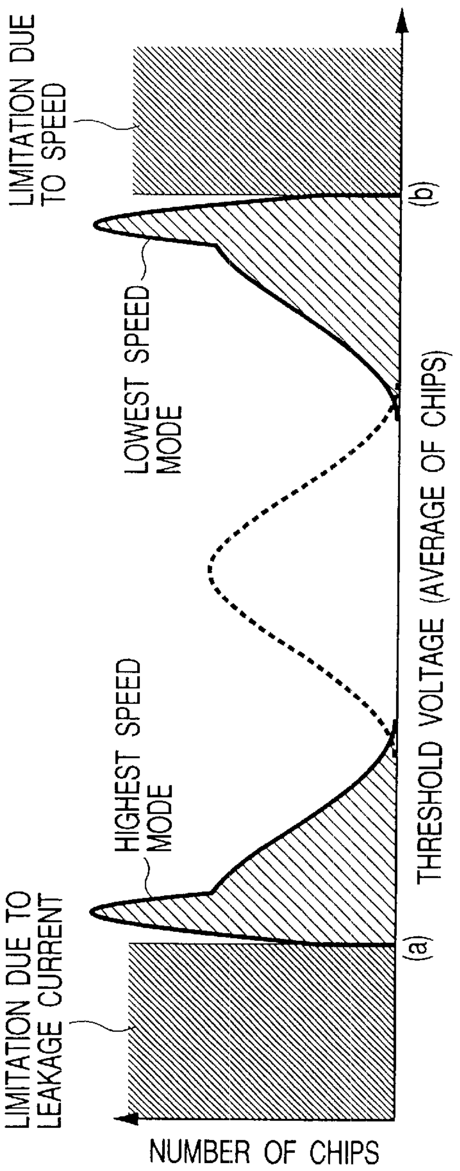
FIG. 41 is also a graph for showing the distribution of averaged values in the threshold voltages within a chip, for the purpose of explaining the present invention.
Figure 42:
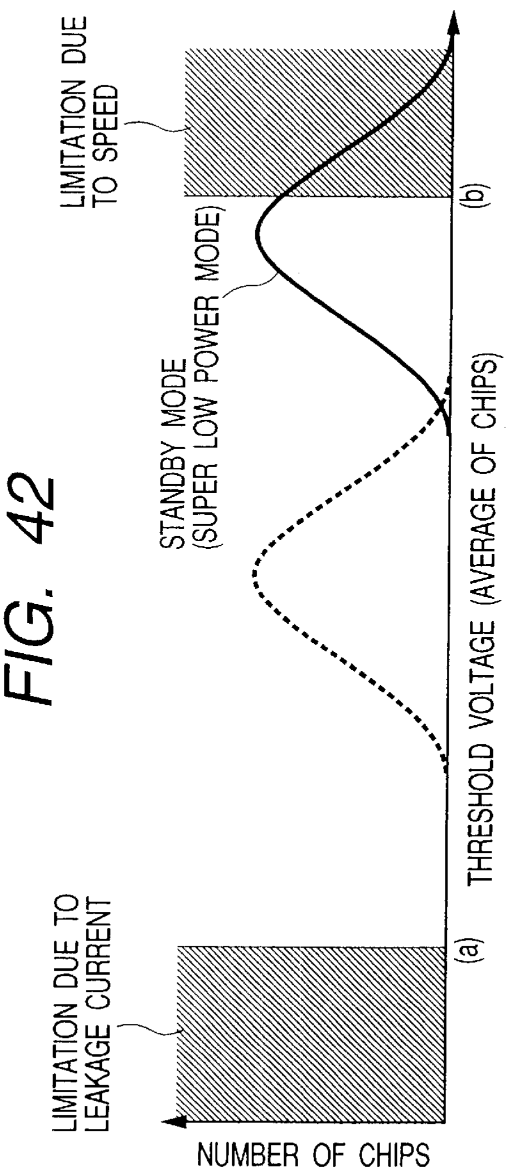
FIG. 42 is also a graph for showing the distribution of averaged values in the threshold voltages within a chip, for the purpose of explaining the present invention.

Also, by locating the position at which the fluctuation is suppressed at the point (a), where it is the limit when the sub-threshold leak current increases up too much, as shown in the FIG. 41, it is possible to line up or align them of about one-third (⅓) of the microprocessors at the point (a), thereby enabling to set the highest speed mode therein. In the same manner, by locating the position at which the fluctuation is suppressed at the point (b), where it is the limit when the operating speed slows down, it is possible to line up them of the about one-third (⅓) of the microprocessors at the point (b), thereby enabling to set the lowest power consumption mode therein. Further, under the standby mode where the CMOS circuits do not operate, by applying the substrate bias at the deepest, it is possible to set a standby mode, as shown in the FIG. 42, i.e., a super low electric power consumption mode.

Figure 36B:
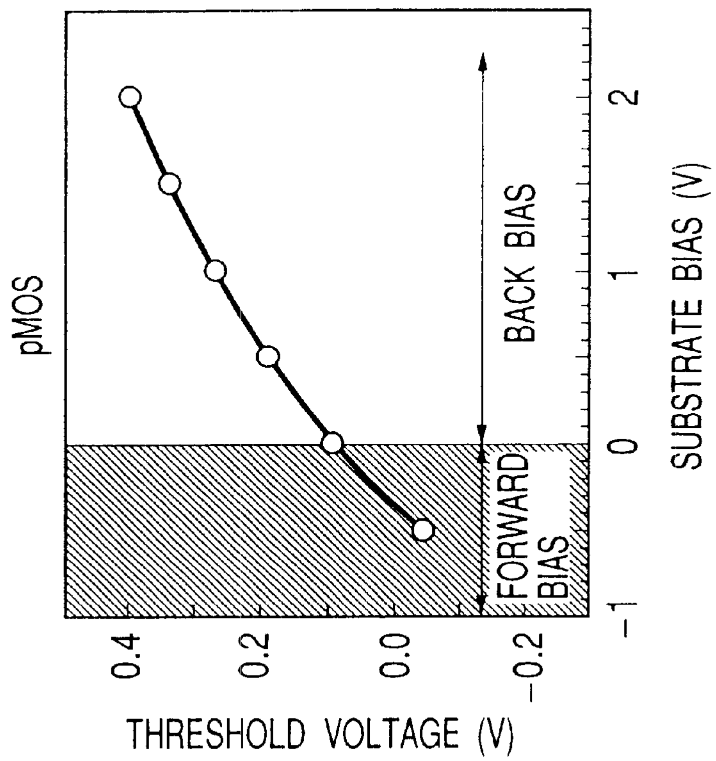
FIG. 36(*a*) is a graph for showing characteristic curves of the N-channel type MOSFET between a substrate bias and the threshold voltage, for the purpose of explaining the present invention.
Figure 36A:
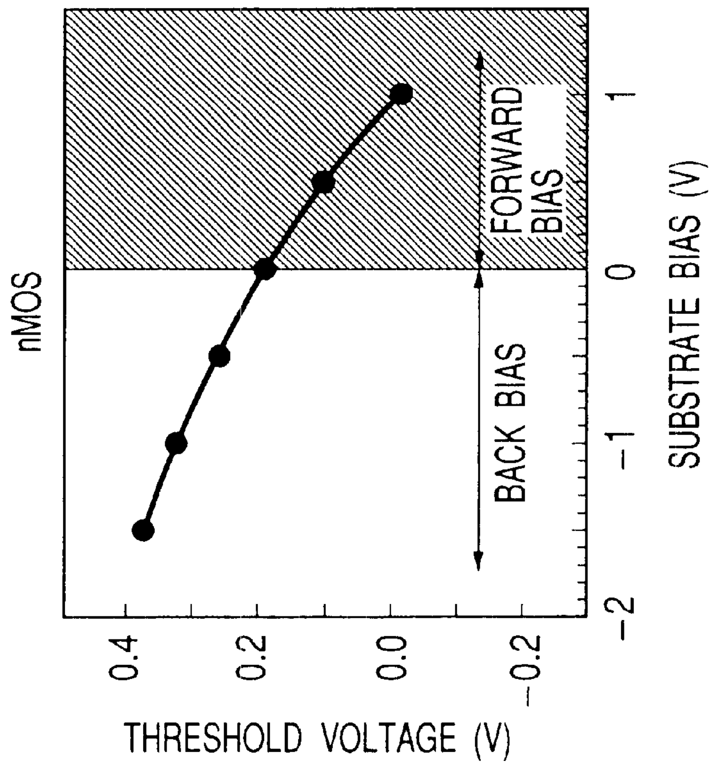

In the substrate bias controller which is used in common with in the present embodiment, it is very advantageous for increasing up a control efficiency to change the substrate bias voltage within the region from the forward bias to the back bias, as shown in the FIGS. 36(*a*) and (*b*) mentioned above. Namely, comparing to the case of changing the threshold voltage by applying only the back bias voltage to the MOSFETs, width of changing voltage (i.e., amplitude) can be reduced down to almost a half (½) thereof, as shown in the characteristic curves in the FIG. 43, in a case where it is changed within the region from the forward bias to the back bias, in the manner of the present embodiment.

Figure 43:
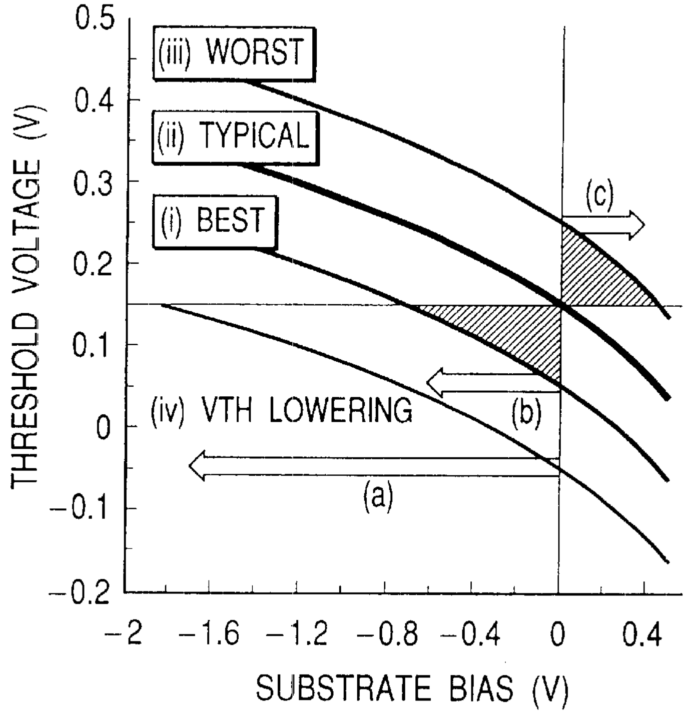
FIG. 43 is a graph for showing characteristic curves between the threshold voltage and the substrate bias, for the purpose of explaining the present invention.

In the FIG. 43 are shown the characteristic curves of showing the relationships between the substrate bias and the threshold voltage. In case of controlling the threshold voltage at 0.15 V with using the forward bias and the back bias, it is enough to generate the substrate bias of a voltage (c) at the largest, for turning the threshold voltage of the MOSFETs causing the fluctuation within a region of BEST side back to 0.15 V of the target mentioned above, or it is enough to generate the substrate bias of the voltage (b) at the largest, for turning the threshold voltage of the MOSFETs causing the fluctuation within a region of WORST side back to 0.15 V of the target mentioned above. Namely, it is enough that the range of the control voltage is about 1 V, as is (b)+(c), being necessary for controlling the threshold voltage of the MOSFETs having the fluctuations in the above mentioned regions of the BEST and the WORST sides at a target value (TYPCAL).

On the contrary to this, with using only the back bias voltage therein, the threshold voltages of the MOSFETs are shifted down to a lower side, so as to be small as a whole. Namely, the above-mentioned WORST characteristic curve is decreased down, just like shown in the figure, and the TYPICAL characteristic curve is replaced by the BEST characteristic curve according thereto, thereby substituting the TYPICAL characteristic for the WORST characteristic. In this case, however, it is necessary to enlarge the range of the control voltage up to about 1.9 V, that is necessary for controlling the MOSFETs having the fluctuations in the same range or region as mentioned above at the target value.

Figure 44:
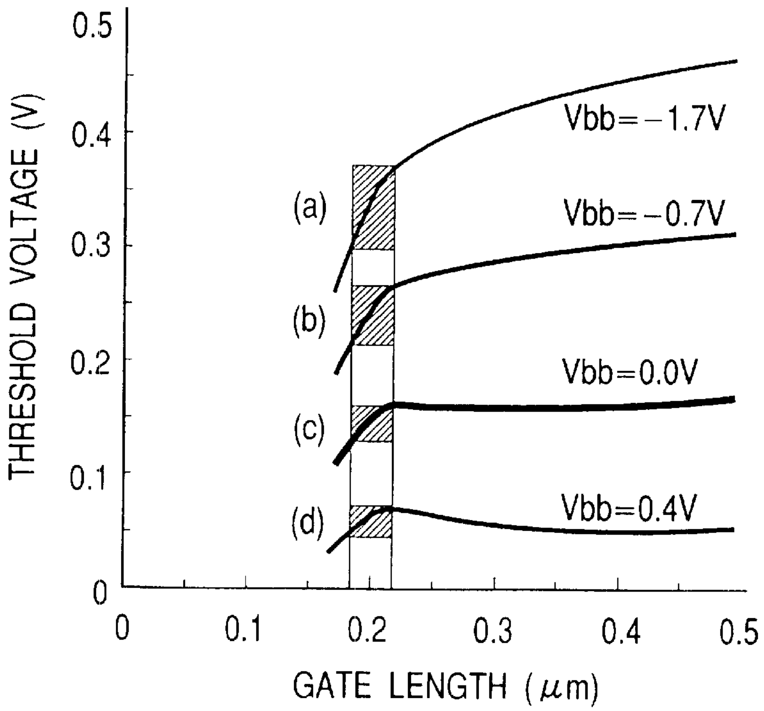
FIG. 44 is a graph for showing characteristic curves between the threshold voltage and gate length, for the purpose of explaining the present invention.

Further from other point of view, it is very advantageous for the purpose of obtaining high integration to change the substrate bias within the range from the forward bias to the back bias, as in this embodiment. Namely, in the characteristic curves between the threshold voltage and the gate length shown in FIG. 44, the change in the threshold voltage to the change in the gate length comes to be large when the voltage value of the substrate bias Vbb is large in the direction of the back bias. In particular, when designing an element so that the gate length is short for the purpose of miniaturization thereof, i.e., when designing it in the vicinity of occurring the Short Channel effect, the change in the threshold voltage with respect to the process fluctuation of the gate length comes to be extremely large.

In designing a layout of the MOSFET, it is very often to set the gate length of the MOSFET in the vicinity of occurring the above-mentioned Short Channel effect for the purpose of the high integration thereof. In this case, changing the substrate bias within the range from the forward bias to the back bias, so that the MOSFET does not operate under the condition of being applied with a large back bias, as in this embodiment, it is possible to make the width or amplitude in change of the threshold voltage mentioned above small, thereby enabling the setting and controlling of the threshold voltage mentioned above, with stability, while obtaining the miniaturization of the elements.

By the way, when controlling the fluctuation in performance of the microprocessor by applying the substrate bias in the direction of the forward bias, there occur the following problems. First, the sub-threshold leak current increases up by lowering the threshold voltage with the forward bias. Next, due to the forward bias, a bipolar current in bipolar structure increases up, within an inside of the substrate of the MOS transistor. Further, a latch-up occurs due to the forward bias, and after all it reaches to breakage or destroy of the MOSFET.

Namely, in case of applying the forward bias onto the CMOS circuit, the sub-threshold leak current increases up accompanying with the decrease of the threshold voltage, and due to the forward bias, the bipolar current increases inside the substrate forming the CMOS circuit, and also the latch-up phenomenon occurs when the forward bias is too large, then there is a possibility that the MOS transistors are broken down or destroyed thereby. Increases of those currents come to be fatal defects for bringing the semiconductor integrated circuit device to be low in the power consumption thereof. Also, no such latch-up should occur therein.

Then, in the present embodiment, for protecting from the occurrences of the increase of current and the latch-up, the power limiting circuit measures the current or temperature of the main circuit, and when the main circuit shows a certain value of current or temperature, the substrate bias controller generates a limiting signal, so as to restrict the PMOS substrate bias and the NMOS substrate bias not to be shallower than those. Due to this, it is possible to prevent from occurring of the increase of current and the latch-up. According to this, it is possible to provide the microprocessor having a high reliability therewith. With such addition of such the power limiting circuit, the reliability of the semiconductor integrated circuit device can be realized while enjoining various advantages due to the operation controls mentioned above.

Figure 2:
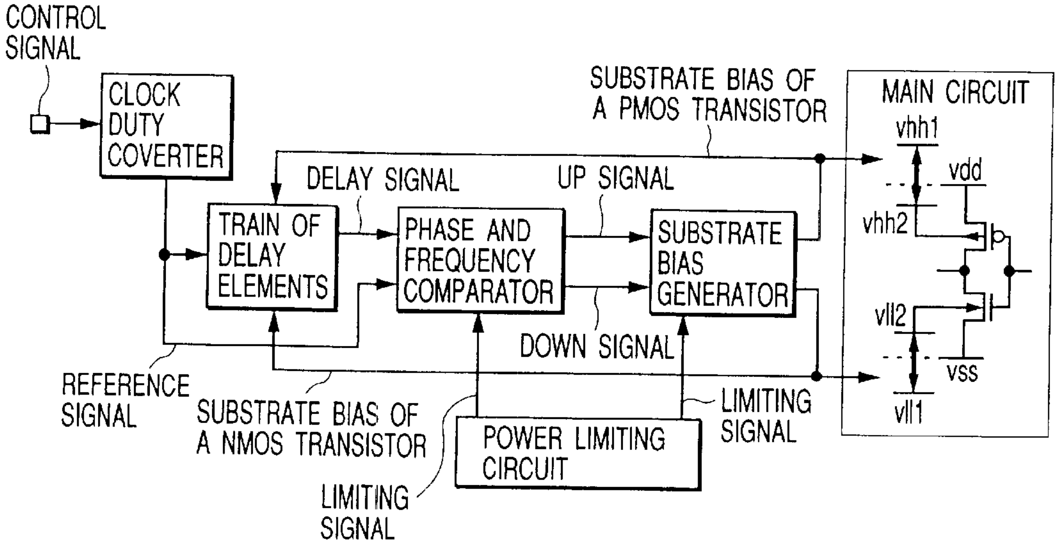
FIG. 2 is a block diagram for showing the embodiment of the semiconductor integrated circuit, according to the present invention.

In FIG. 2 is shown a block diagram of an embodiment of the semiconductor integrated circuit device according to the present invention. The same figure shows the speed monitor circuit and the substrate bias controller shown in the FIG. 1, in more detail thereof, and the speed monitor circuit is constructed with a clock duty converter and a train of delay elements, while the substrate bias controller is constructed with a phase and frequency comparator circuit and a substrate bias generator. Hereinafter, the CMOS inverter circuit, being shown as the representative one of the main circuit, is similar to the CMOS inverter circuit shown in the FIG. 1 mentioned above, therefore the marks of that circuit are omitted here.

Figure 6:
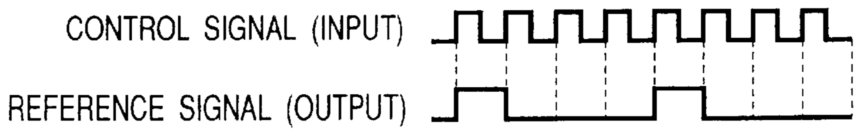
FIG. 6 is a timing chart of wave-forms for explaining an operation of a clock duty converter shown in the FIG. 2.

The clock duty converter receives the control signal comprising a clock signal formed in a mode of frequency from speed information, and changes a duty ratio of such the control signal into a desired value, so as to output it as a reference voltage. For example, as is shown by the wave-forms in FIG. 6, the frequency is multiplied or divided into one-fourth (¼) with respect to the control signal, and a signal having the duty ratio of 1:3 is outputted as the reference signal. This reference signal is delayed by the train of delay elements. The train of delay elements receives the above-mentioned reference signal, and outputs a delay signal after elapsing a delay time corresponding to the values of the PMOS substrate bias and the NMOS substrate bias.

Figure 4:
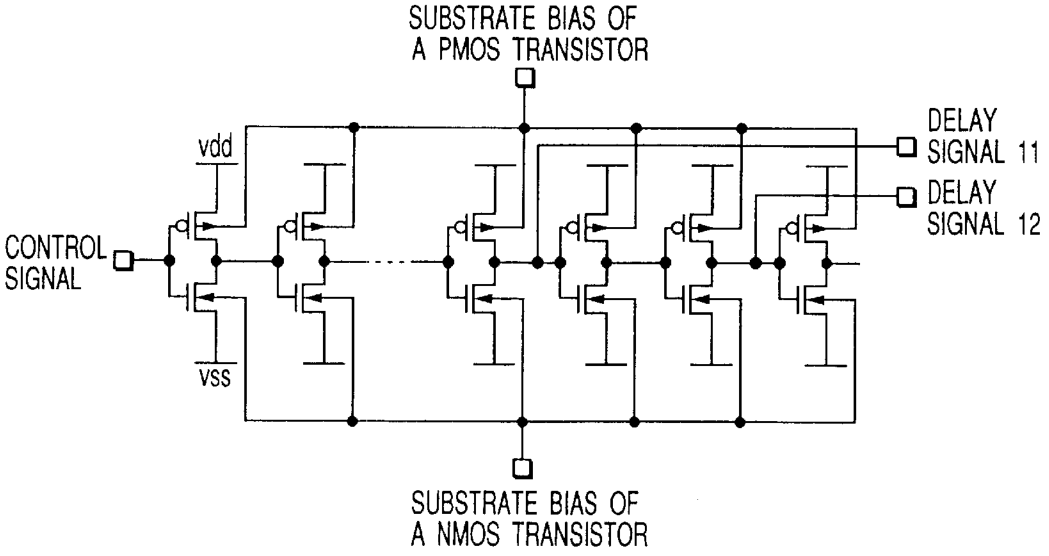
FIG. 4 is a circuit diagram for showing an embodiment of a train of delay elements shown in the FIG. 1.

For example, as shown in FIG. 4, within the train of delay elements mentioned above are connected the CMOS inverters in series, and to the inverter at the initial stage thereof is supplied the reference signal. To the MOS transistor of each of the inverters are applied the PMOS substrate bias and the NMOS substrate bias, then the delay time is changed corresponding to such the substrate biases. In this embodiment, the inverters are connected at stages of such the number, that the output from the inverter at the third ($3^{rd}$) from the final stage is delayed by one (1) cycle of the control signal (i.e., clock signal) shown in the FIG. 6. For example, an output is taken out from the inverter, which is located at the fourth ($4^{th}$) stage from the final one, as a delay signal 11, and the inverter output of the second ($2^{nd}$) inverter is taken out therefrom as a delay signal 12.

Figure 7:
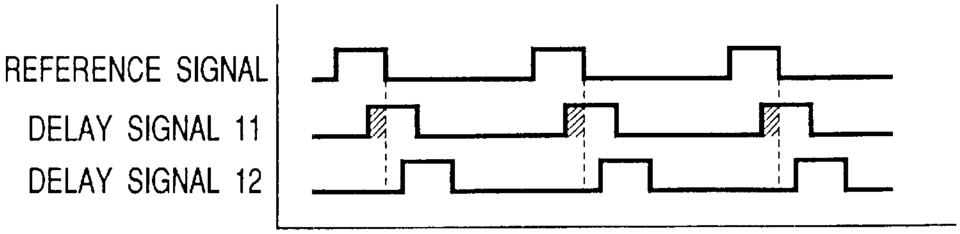
FIG. 7 is a timing chart of wave-forms for explaining an operation of the train of delay elements shown in the FIG. 2.

In this instance, the inputs and outputs into and from the train of delay elements are as shown in FIG. 7. Namely, it is so designed that, comparing to the fall-down edge of the reference signal, the rise-up edge of the delay signal 11 occurs fast while that of the delay signal 12 occurs late. Respective phase differences can be measured, by conducting AND upon the reference signal and the delay signal 11, or upon the reference signal and the delay signal 12.

The condition shown in the FIG. 7, i.e., a relationship in phase, i.e., that the rise-up of the delay signal 11 is fast with respect to fall-down of the reference signal, in other words, by one (1)cycle of the control signal, while the rise-up of the delay signal 12 is late, is the delay time that a standard train of delay elements shows, and when the delay time is changed due to the process fluctuation, the change of the power voltage and the change of temperature, etc., the phase and frequency comparator circuit shown in the FIG. 2 decides on whether it is fast or late. For example, when the delay time of the train of delay elements comes to be fast, the rise-up edges of the delay signals 11 and 12 occur faster than the fall-down edge of the reference signal, on the contrary when the delay time thereof comes to be late, the rise-up edges of the delay signals 11 and 12 occur later than that.

In a case where the delay time is fast, the phase and frequency comparator circuit outputs a DOWN signal, while it outputs an UP signal in a case where the delay time is late. The substrate bias generator brings the substrate bias to be deep, upon receipt of the DOWN signal. Namely, enlarging the PMOS substrate bias while reducing the NMOS substrate bias, the substrate bias is deepened in the direction of the back bias. As a result of this, the operating speeds of the train of delay elements and the main circuit come to be slow. Also, upon receipt of the UP signal, the substrate bias generator brings the substrate bias to be shallow. Namely, reducing the PMOS substrate bias while enlarging the NMOS substrate bias, the substrate bias is brought to be shallow in the direction of the forward bias. As a result of this, the operating speeds of the train of delay elements and the main circuit come to be fast.

Due to the feedback control operation mentioned above, when the operating speed of the train of delay elements comes to a predetermined value thereof, the UP signal and the DOWN signal are stopped, while the operating speeds of the train of delay elements and the main circuit are kept at constant, due to that also the substrate bias generator supplies the constant substrate biases therefrom. The train of delay elements may be constructed with using CMOS logic circuits, such as AND gates, NOR gates, etc., other than the inverter, and/or with using the CMOS circuit having the same combination to a critical path of the microprocessor forming the main circuit.

The power limiting circuit, while measuring the current or temperature in the main circuit, generates a limiting signal when the value of the current or the temperature comes to be larger than the preset value thereof. When the limiting signal is inputted into the phase and frequency comparator circuit 31, it stops the generation of the UP signal. Also, when the limiting signal is inputted into the substrate bias generator, it stops the supply of the substrate bias being shallower than the substrate bias at the present. In this manner, the current of the main circuit is inhibited from increasing up and/or the temperature thereof is inhibited from rising up too much, and the increase of the sub-threshold leak current accompanying with the decrease of the threshold voltage and the increase of the bipolar current accompanying with the forward bias are suppressed, thereby protecting the main circuit from the occurrence of the latch-up therein.

Figure 3:
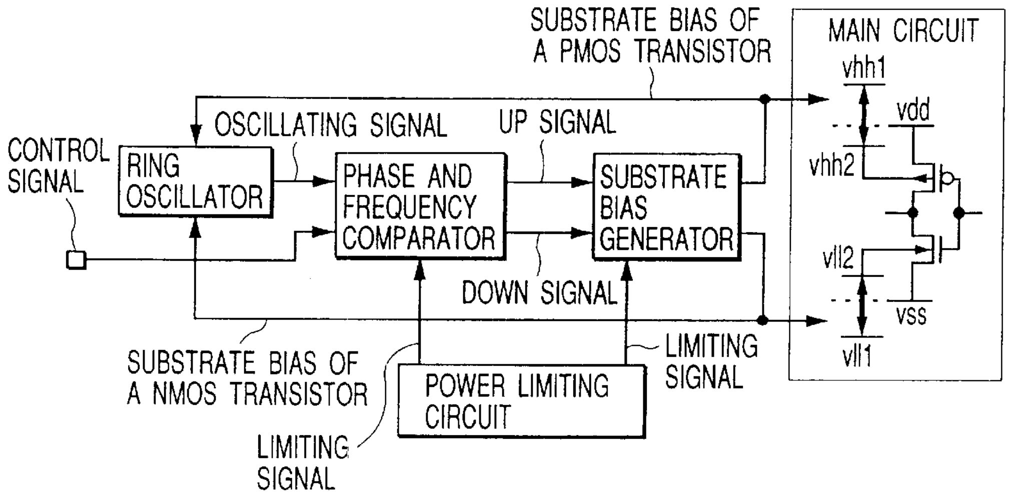
FIG. 3 is a block diagram for showing another embodiment of the semiconductor integrated circuit, according to the present invention.

In FIG. 3 is shown a block diagram of another embodiment according to the present invention. The same figure shows the speed monitor circuit and the substrate bias controller shown in the FIG. 1, in more detail thereof, wherein the speed monitor circuit is constructed with a ring oscillator, and the substrate bias controller is constructed with a phase and frequency comparator and a substrate bias generator. The ring oscillator changes the oscillation frequency depending upon the values of the PMOS substrate bias and the NMOS substrate bias, thereby outputting an oscillation signal as the speed signal.

Figure 5:
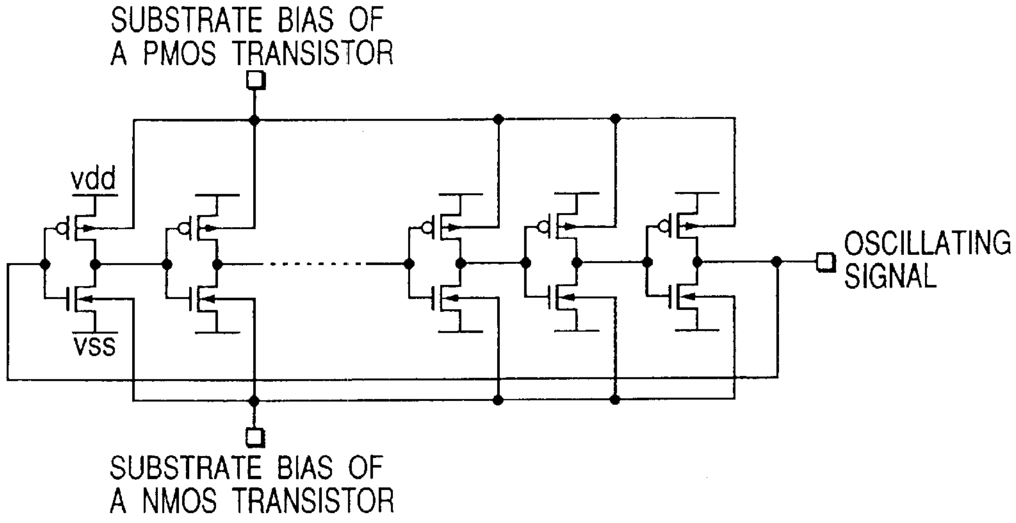
FIG. 5 is a circuit diagram for showing an embodiment of a ring oscillator shown in the FIG. 3.

In FIG. 5 is shown a circuit diagram of an embodiment of the ring oscillator. As shown in the figure, the ring oscillator comprises an odd number of CMOS inverters, being connected in the form of a ring, and the oscillation signal is outputted from one portion thereof. To the MOSFET of the each inverter are applied the PMOS substrate bias and the NMOS substrate bias, so as to change the delay time thereof, thereby enabling to adjust the oscillation frequency. In the phase and frequency comparator, the control signal formed with a clock signal in which the speed information is converted into the form of frequency, and the frequency of the oscillation signal from the ring oscillator are compared with each other.

Figure 8:
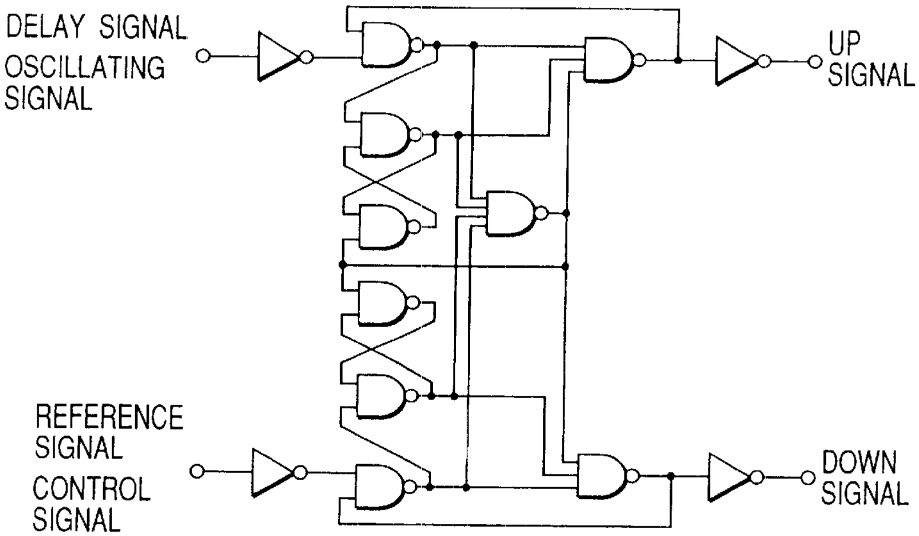
FIG. 8 is a circuit diagram for showing an embodiment of a phase and frequency comparator shown in the FIGS. 2 and 3.

In FIG. 8 is shown a circuit diagram of an embodiment of the phase and frequency comparator. When the control signal and the oscillation signal of the ring oscillator are equal to in the frequency thereof, the phase and frequency comparator does not provide an output. Namely, when the both signals are equal to each other in the frequency (phase), for example, both the UP signal and the DOWN signal are at a low level, as they are. When the delay time of the train of delay elements in the ring oscillator is changed due to the process fluctuation, the changes of the power voltage and the temperature, etc., thereby changing the oscillation frequency, and the phase and frequency comparator outputs the UP signal or the DOWN signal.

For example, when the oscillation frequency comes to be higher than the control signal, the phase and frequency comparator turns the DOWN signal into a high level, for example, and when the oscillation frequency is lower than that, the phase and frequency comparator turns the UP signal into the high level, for example. The substrate bias generator operates so as to make the substrate bias deep by the high level of the DOWN signal. Namely, enlarging the PMOS substrate bias while reducing the NMOS substrate bias, the substrate bias is deepened in the direction of the back bias. As a result of this, the delay time of the train of delay elements in the above-mentioned ring oscillator comes to be long, thereby reducing the oscillation frequency of the ring oscillator. The substrate bias generator brings the substrate bias to be shallow when the UP signal is turned to be the high level as was mentioned in the above. Namely, by making the PMOS substrate bias small while making the NMOS substrate bias large, the substrate bias is made to be shallow in the direction of the forward bias. As a result of this, the oscillation frequency of the ring oscillator comes to be high.

When the oscillation frequency of the ring oscillator comes to be equal to that of the control signal due to the feedback control operation mentioned above, the UP signal and the DOWN signal are stopped, while the operating speeds of the train of delay elements and the main circuit are kept at constant, due to that also the substrate bias generator supplies the constant substrate bias therefrom. The train of delay elements constructing the above-mentioned ring oscillator may be constructed with using CMOS logic circuits, such as AND gate, NOR gate, etc., other than the inverter, and/or with using the CMOS circuit having the same combination to the critical path of the microprocessor forming the main circuit.

In this embodiment, the power limiting circuit, while measuring the current or temperature in the main circuit, generates a limiting signal when the value of the current or the temperature comes to be larger than the preset value thereof. When the limiting signal is inputted into the phase and frequency comparator circuit 31, it stops the generation of the UP signal. Also, when the limiting signal is inputted into the substrate bias generator, it stops the supply of the substrate biases being shallower than the substrate bias at the present. In this manner, the current of the main circuit is protected from increasing up and/or the temperature thereof is protected from rising up too much, and then the increase of the sub-threshold leak current accompanying with the decrease of the threshold voltage and the increase of the bipolar current accompanying with the forward bias are suppressed, thereby protecting the main circuit from the occurrence of the latch-up therein.

Figure 9:
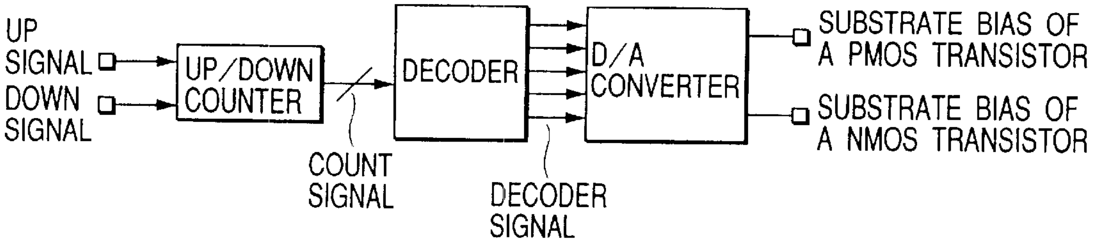
FIG. 9 is a block diagram for showing an embodiment of a substrate bias generator shown in the FIGS. 2 and 3.

In FIG. 9 is shown a circuit diagram of an embodiment of the substrate bias generator shown in the FIGS. 2 and 3. The substrate bias generator of this embodiment is constructed with an UP/DOWN counter and a decoder and a D/A converter. Receiving the UP signal and the DOWN signal which are formed in the above-mentioned phase and frequency comparator, the UP/DOWN counter conducts an increment of the counter signal upon the UP signal, while conducting the decrement of the counter signal upon the DOWN signal.

The decoder decodes the counter signal of the above-mentioned UP/DOWN counter, thereby outputting a decoder signal. The D/A converter outputs potentials corresponding to the decoder signals, as the PMOS substrate bias and the NMOS substrate bias. For example, in a case where the NMOS substrate bias is changed from the back bias −1.5 V to the forward bias +0.5 V, when the DOWN signal is asserted (for example, at high level), the NMOS substrate bias is changed in the direction to be deep, i.e., being changed in the direction from +0.5 V to −1.5 V by an every predetermined voltage depending upon the DOWN signal. Also, when the UP signal is asserted (for example, at high level), the NMOS substrate bias is changed in the direction to be shallow, i.e., being changed in the direction from −1.5 V to +0.5 V, by the every predetermined voltage depending upon the UP signal.

Also, for example, in case of changing the PMOS substrate bias from the back bias +1.5 V (3.3 V when the power potential is 1.8 V) to the forward bias −0.5 V (1.3 V when the power potential is 1.8 V), the PMOS substrate bias is changed in the direction to be deep when the down signal is asserted, i.e., in the direction from −0.5 V to +1.5 V by an every predetermined voltage depending upon the DOWN signal. The PMOS substrate bias is changed in the direction to be shallow when the up signal is asserted, i.e., in the direction from +1.5 V to −0.5 V by an every predetermined voltage depending upon the UP signal.

Figure 10:
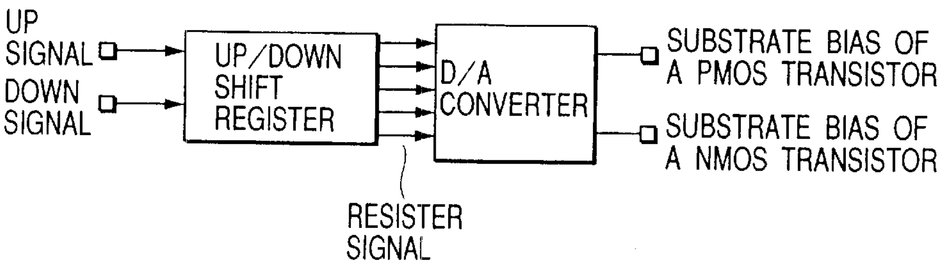
FIG. 10 is a block diagram for showing another embodiment of the substrate bias generator mentioned above.

In FIG. 10 is shown a circuit diagram of other embodiment of the substrate bias generator shown in the FIGS. 2 and 3. The substrate bias generator of this embodiment is constructed with an UP/DOWN shift register and a D/A converter. Receiving the UP signal and the DOWN signal which are formed in the above-mentioned phase and frequency comparator, the UP/DOWN shift register moves or shifts the position, to be selected for outputting the register signal, in the upper direction upon the Up signal, while moving or shifting the position, to be selected for outputting the register signal, in the lower direction upon the DOWN signal.

The D/A converter outputs potentials corresponding to the register signals, as the PMOS substrate bias and the NMOS substrate bias. For example, in a case where the NMOS substrate bias is changed from the back bias −1.5 V to the forward bias +0.5 V, when the DOWN signal is asserted (for example, at high level), the NMOS substrate bias is changed in the direction to be deep, i.e., being changed in the direction from +0.5 V to −1.5 V by an every predetermined voltage depending upon the DOWN signal. Also, when the UP signal is asserted (for example, at high level), the NMOS substrate bias is changed in the direction to be shallow, i.e., being changed in the direction from −1.5 V to +0.5 V, by the every predetermined voltage depending upon the UP signal.

For example, in case of changing the PMOS substrate bias from the back bias +0.5 V (3.3 V when the power potential is 1.8 V) to the forward bias −0.5 V (1.3 V when the power potential is 1.8 V), the PMOS substrate bias is changed in the direction to be deep when the down signal is asserted, i.e., in the direction from −0.5 V to +1.5 V by an every predetermined voltage depending upon the DOWN signal. The PMOS substrate bias is changed in the direction to be shallow when the up signal is asserted, i.e., in the direction from +1.5 V to −0.5 V by an every predetermined voltage depending upon the UP signal.

Figure 11:
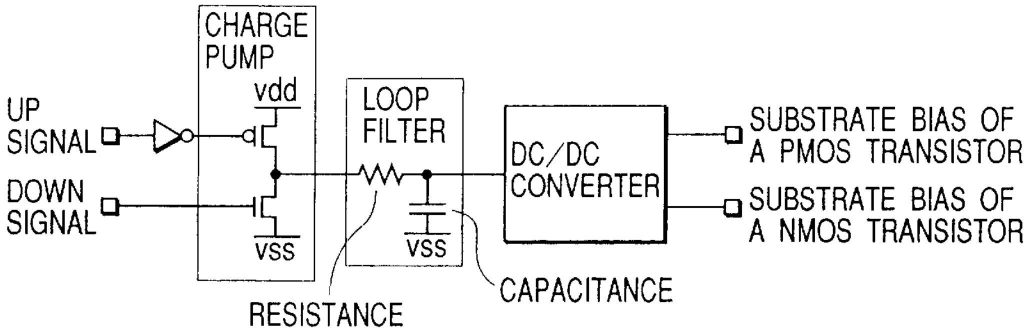
FIG. 11 is a block diagram for showing other embodiment of the substrate bias generator mentioned above.

In FIG. 11 is shown a circuit diagram of an embodiment of the substrate bias generator shown in the FIGS. 2 and 3. The substrate bias generator of this embodiment is constructed with an inverter, a charge pump circuit, a loop filter and a DC/DC converter. Inputting signals obtained by inverting the UP signal and the DOWN signal which are formed in the above-mentioned phase and frequency comparator, the charge pump circuit supplies current from the power supply potential vdd to an output during the time when inputting the UP signal, while it discharge the current from the output into the direction of a power supply potential vss when inputting the DOWN signal, thereby changing the potential at the outputs.

This output potential comes to be a direct current potential, passing through the loop filter which is formed with a resistor and a capacitor, and the direct current potential is converted through the DC/DC converter into the PMOS substrate bias and the NMOS substrate bias. For example, in the case of changing the NMOS substrate bias from the back bias −1.5 V to the forward bias +0.5 V, the NMOS substrate bias is changed into the direction to be deep when the DOWN signal is asserted, i.e., from +0.5 V to 1.5 V, in an analogue manner, depending upon the DOWN signal. Also, when the UP signal is asserted, the NMOS substrate bias is changed into the direction to be shallow, i.e., from −1.5 V to +0.5 V, in the analogue manner, depending upon the UP signal.

For example, in case of changing the PMOS substrate bias from the back bias +1.5 V (3.3 V when the power potential is 1.8 V) to the forward bias −0.5 V (1.3 V when the power potential is 1.8 V), the PMOS substrate bias is changed in the direction to be deep when the DOWN signal is asserted, i.e., in the direction from −0.5 V to +1.5 V, in the analogue manner, depending upon the DOWN signal. Also, when the UP signal is asserted, the PMOS substrate bias is changed into the direction to be shallow, i.e., from +1.5 V to −0.5 V, in the analogue manner, depending upon the UP signal.

Figure 12:
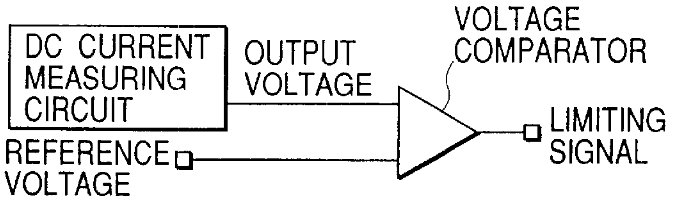
FIG. 12 is a block diagram for showing an embodiment of a power limiting circuit shown in the FIGS. 2 and 3.

In FIG. 12 is shown a block diagram of an embodiment of the power limiting circuit. The power limiting circuit of this embodiment is constructed with a current measuring circuit and a voltage comparator. The current measuring circuit converts the current being measured into a voltage value, so as to produce an output voltage. The voltage comparator compares a reference potential with the potential of the output voltage, so as to assert a limiting signal when the output voltage comes to be larger than the reference potential.

Figure 14:
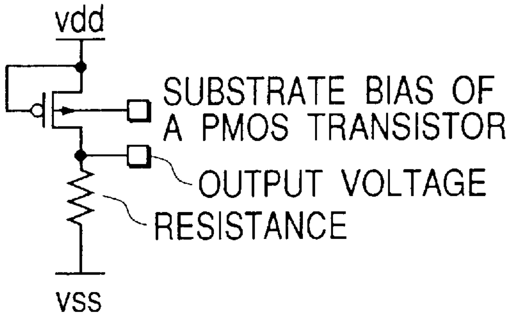
FIG. 14 is a circuit diagram for showing an embodiment of a current measuring circuit which is applied into the power limiting circuit mentioned above.

In FIG. 14 is shown a circuit diagram of an embodiment of the current measuring circuit mentioned above. In this circuit, the leak current of the PMOS transistors is measured due to the PMOS substrate bias, so as to be converted into voltage. Namely, supplying the power supply voltage vdd across the gate and the source of the P-channel type MOSFET, the PMOS substrate bias is applied to the substrate thereof (i.e., back gate). When applying the gate of the P-channel type MOSFET with the power supply voltage vdd being same to the source in the potential, as is mentioned in the above, the P-channel type MOSFET is turned into OFF state, so that a leak current flow through the resistor.

The MOSFET has a positive temperature characteristic, therefore when the current within the main circuit rises up and/or when the temperature rises up too much, the sub-threshold leak current increases up, being associated with the threshold voltage drop, so that it makes large a voltage drop occurring within the resistor. When this voltage drop comes to be higher than the reference voltage, the above-mentioned limiting signal is produced by the voltage comparator. Due to this, the voltage comparator is structured, so as to perform an operation of voltage comparison with high sensitivity, in particular, with respect to the input signal in the vicinity of the above-mentioned reference voltage, in other words, to perform an operation of voltage amplification at a high gain.

In the structure mentioned above, by applying the forward bias as the substrate bias for the P-channel type MOSFET, thereby turning it into a depression mode, the current flows even when bringing the gate and the source at the same potential as was mentioned in the above. However, no such the substrate bias for bringing the P-channel type MOSFET into the depression mode is applied to, by means of the substrate bias controller with the feedback control operation as was mentioned in the above, therefore the leak current mentioned above flows into the resistor.

Figure 15:
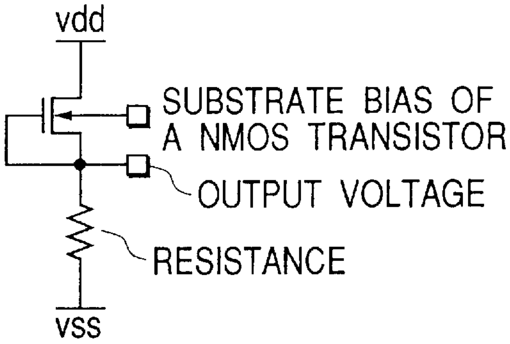
FIG. 15 is a circuit diagram for showing another embodiment of the current measuring circuit mentioned above.

In FIG. 15 is shown a circuit diagram of another embodiment of the current measuring circuit mentioned above. This circuit measures the leak current of the NMOS transistor by means of the NMOS substrate bias, so as to convert it into a voltage. Namely, supplying the power supply voltage vdd to the drain of the N-channel type MOSFET, the gate and the source are connected in common and a resistor is connected between the ground potential vss of the circuit. In a case where the gate and the source of the N-channel type MOSFET are connected with, it is turned into OFF state, therefore the leak current flows through the resistor. When the current in the main circuit increases up and/or when the temperature rises up too much, in the same manner as was mentioned in the above, the leak current increases up accompanying with the decrease of the threshold voltage, thereby bringing the voltage drop generating across the resistor to be large. If this voltage drop comes to be higher than the reference voltage, the above-mentioned limiting signal is produced by the voltage comparator.

Figure 16:
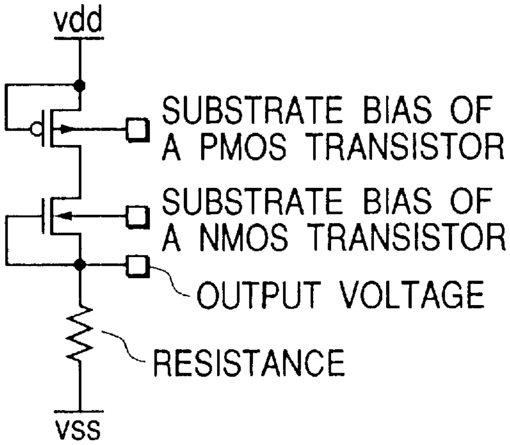
FIG. 16 is a circuit diagram for showing other embodiment of the current measuring circuit mentioned above.

In FIG. 16 is shown a further other embodiment of the current measuring circuit mentioned above. In this circuit, the P-channel type MOSFET, in which the gate and the source are connected with in common as was mentioned in the above, and the N-channel type MOSFET are connected with in common, and the above-mentioned resistor is connected between the source of the N-channel type MOSFET and the ground potential vss of the circuit. Namely, between the power supply voltage vdd and the ground potential vss of the circuit are connected the P-channel type MOSFET and the N-channel type MOSFET, which are connected in a condition of the diode connection wherein the voltage is applied thereacross in the reverse direction, and the resistor is connected therewith, in a series mode. In the circuit of this embodiment, the sub-threshold leak current of the CMOS circuit is detected by means of the PMOS substrate bias and the NMOS substrate bias, thereby converting it into the voltage signal by running it into the resistor.

Figure 17:
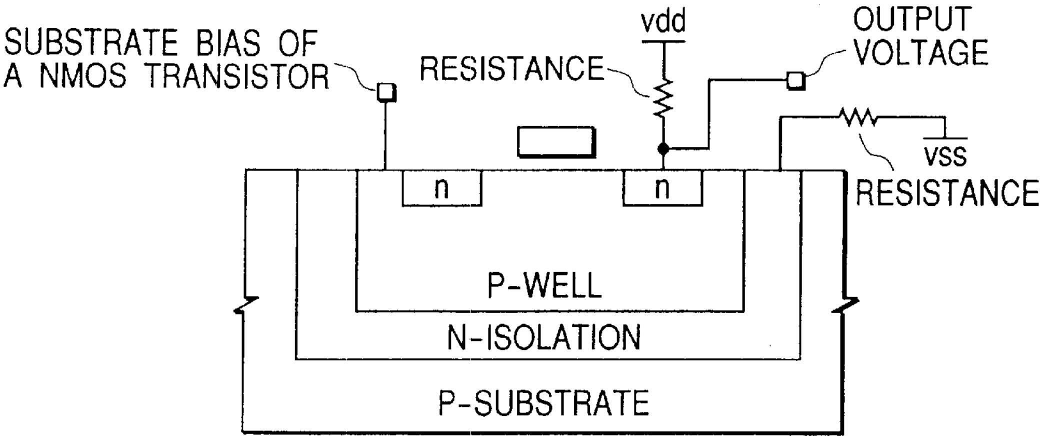
FIG. 17 is a cross-section view of an outline of element structure for showing a further other embodiment of the current measuring circuit mentioned above.

In FIG. 17 is shown a cross-section view of showing an outline of the element structure, as a further other embodiment of the current measuring circuit mentioned in the above. In the same figure, for easy understanding of the roles of parasitic elements, the MOSFETs used therein are shown by the cross-section structure of device, not by the circuit symbols as were mentioned in the above. With the N-channel type MOSFET used in this embodiment, though not being restricted in particular, a p-well is formed in a well region (N-isolation), being formed on the P-type substrate to be deep in the depth, and the source and the drain are formed from a n-region thereon. In such the element structure, there exists a NPN type bipolar transistor within the substrate of N-channel type MOSFET, i.e., a parasitic transistor having the n-region as the collector, the P-well as the base, and the well region (N-isolation) deep in the depth as the emitter thereof.

To the n-region functioning as the above-mentioned collector is applied the power supply voltage vdd through a resistor, while to the well region (N-isolation) functioning as the emitter the ground potential vss of the circuit through another resistor. To the P-well mentioned above is applied the NMOS substrate bias, in the same manner as in the N-channel type MOSFET of the main circuit and the speed monitor circuit, etc., mentioned above. There is a necessity of applying a bias, so that no current flows through the collector-emitter passage of the above-mentioned parasitic bipolar transistor, and if current is produced by the NMOS substrate bias due to the process fluctuation or the like, the output voltage is decreased down, then it can be detected by means of such the voltage comparator as mentioned in the above.

Figure 18:
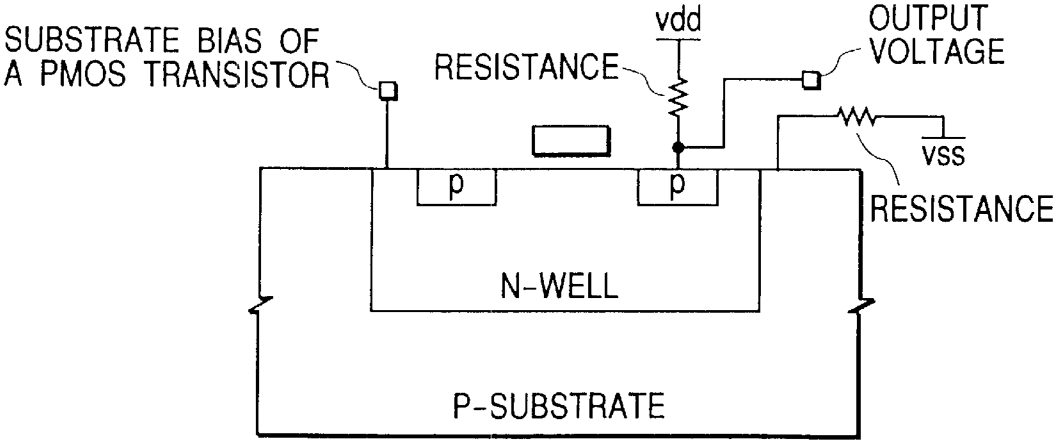
FIG. 18 is a cross-section view of the outline of element structure for showing a further other embodiment of the current measuring circuit mentioned above.

In FIG. 18 is shown a cross-section view of showing an outline of the element structure, as a further other embodiment of the current measuring circuit mentioned in the above. Also in this figure, for easy understanding of the roles of parasitic elements, the MOSFETs used therein are shown by the cross-section structure of device, not by the circuit symbols as was in the above. The P-channel type MOSFET used in this embodiment, though not being restricted in particular, is formed within a N-type well region formed on the P-type substrate. In place of this structure, N-type well region may be formed in the well region (N-isolation) being deep in the depth, as was mentioned in the above.

In such the element structure, there exists a PNP type bipolar transistor within the substrate of P-channel type MOSFET, i.e., a PNP type parasitic transistor having the P-substrate as the collector, the N-well as the base, and the p-region constructing the source and the drain as the emitter thereof. To the P-substrate functioning as the above-mentioned collector is applied the ground potential vss of the circuit through a resistor, while to the p-region functioning as the emitter the power supply voltage vdd is supplied through a resistor. To the N-well mentioned above is applied the PMOS substrate bias, in the same manner as in the P-channel type MOSFETs of the main circuit and the speed monitor circuit, etc., mentioned above. There is also a necessity of applying a bias, so that no current flows through the collector-emitter passage of the above-mentioned parasitic bipolar type transistor, and if current is produced by the PMOS substrate bias due to the process fluctuation or the like, the output voltage is decreased down, then it can be detected by means of such the voltage comparator as mentioned in the above.

According to each circuit of those embodiments, when the sub-threshold leak current of the main circuit and/or the leak current due to the bipolar structure come to be larger than the respective preset values, the power limiting circuit asserts the limiting signal. In the actual circuit, a plural number of the power limiting circuits may be formed with using a plural number of the above-mentioned power measuring circuits, thereby to supply the limiting signal to the substrate bias controller upon making an OR (logical sum) of all the limiting signal outputs.

Figure 13:
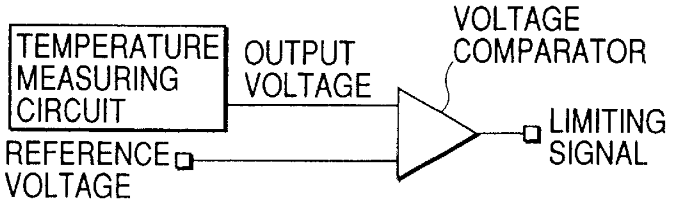
FIG. 13 is a block diagram for showing another embodiment of the power limiting circuit mentioned above.

In FIG. 13 is shown a block diagram of a further other embodiment of the power limiting circuit mentioned above. The power limiting circuit in this embodiment is constructed from a temperature measuring circuit and a voltage comparator. The temperature measuring circuit converts the measured temperature into a voltage value, thereby producing an output voltage therefrom. The voltage comparator compares the reference potential with the potential of the output, and it asserts the limiting signal when the output voltage comes to be larger than the reference potential.

Figure 19:
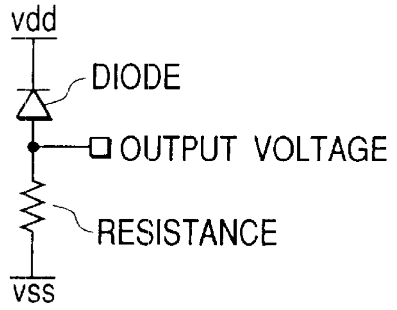
FIG. 19 is a circuit diagram for showing an embodiment of a temperature detecting circuit which is applied into the power limiting circuit mentioned above.

In FIG. 19 is shown a circuit diagram of an embodiment of the above-mentioned temperature measuring circuit. This circuit utilizes the fact that the reverse junction resistance of a diode is changed depending upon the temperature. Namely, when the temperature comes to be high, the reverse junction resistance comes to be small, then a resistance ratio to a fixed resistor is changed, so that the output voltage is changed into the direction of the power supply voltage vdd. The voltage comparator compares the output voltage with the reference potential as mentioned in the above, and asserts the limiting signal when the output voltage comes to be larger than the reference potential. Accordingly, with this temperature measuring circuit, it is possible to measure the temperature, so as to convert it into the voltage.

Upon receipt of the detection signal of this temperature measuring circuit, the power limiting circuit asserts the limiting signal when the temperature of the main circuit comes to be higher than the preset value thereof. In the actual circuit, a plural number of the power limiting circuits may be formed by using necessary kinds of power measuring circuits, combining the power limiting circuits for use in measuring temperature and those for use in measuring current together, thereby to supply the limiting signal to the substrate bias circuit upon making an OR (logical sum) of all the limiting signal outputs.

Figure 20:
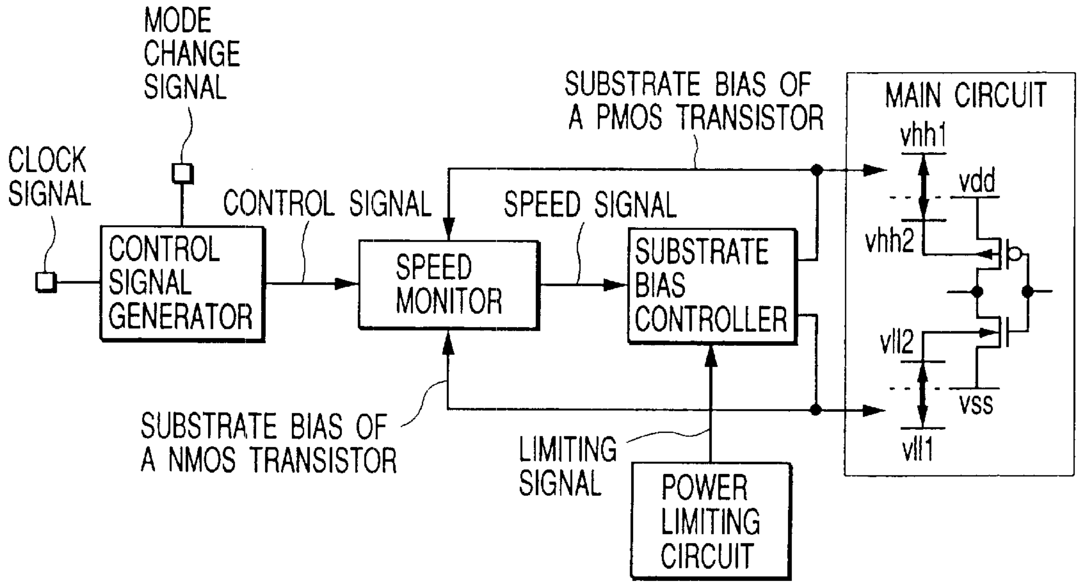
FIG. 20 is a block diagram for showing other embodiment of the semiconductor integrated circuit, according to the present invention.

In FIG. 20 is shown a block diagram of a further other embodiment according to the present invention. Basically, that shown in the same figure is a variation of that shown in the FIG. 1, wherein a control signal generator is provided for the speed monitor circuit. The control signal generator, upon receipt of a clock signal and a mode change signal, changes the frequency of the clock signal responding to a mode change signal. Namely, any one is selected among a low speed mode, a middle speed mode and a high speed mode, and it is supplied to the speed monitor circuit as the control signal therefor.

With this construction, it is possible to form the control signal, which is converted into one of a plural kinds of frequencies upon the basis of the frequency, corresponding to the mode change signal. Namely, within an inside of the semiconductor integrated circuit device, it is possible to form the control signal (i.e., a speed information) in the form of frequency. The structure of the others are similar to those of the embodiment that was shown in the FIG. 1.

Figure 24:
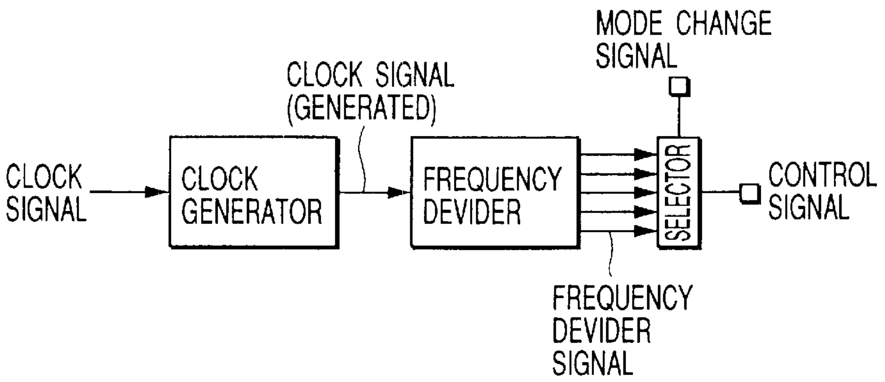
FIG. 24 is a block diagram for showing an embodiment of a control signal generator shown in the FIG. 20.

In FIG. 24 is shown a block diagram of an embodiment of the control signal generator in the embodiment shown in the FIG. 20. The control signal generator, in this embodiment, is constructed with a clock generator, a frequency divider and a selector. The clock signal is multiplied in the frequency thereof by the clock generator, which is constructed with a phase synchronizing loop circuit, for example. Such the frequency multiplied clock signal produced is divided by using a frequency divider circuit. The frequency divider circuit has a plural number of stages for frequency dividing therein, and a frequency divided signal is formed at each of the stages, corresponding to the number of the stages for frequency dividing, thereby producing the plural number of frequency divided signals having frequencies being different to one another.

The selector selects only one frequency divided signal from among the above-mentioned plural number of the frequency divided signals corresponding to the mode change signal, and it supplies the one frequency divided signal to the speed monitor circuit, as the control signal in the form of the frequency, as was mentioned in the above. By using such the control signal generator, it is possible to supply the control signal corresponding to the mode change signal to the speed monitor, as was shown in the embodiment in the FIG. 20 mentioned above.

Figure 40:
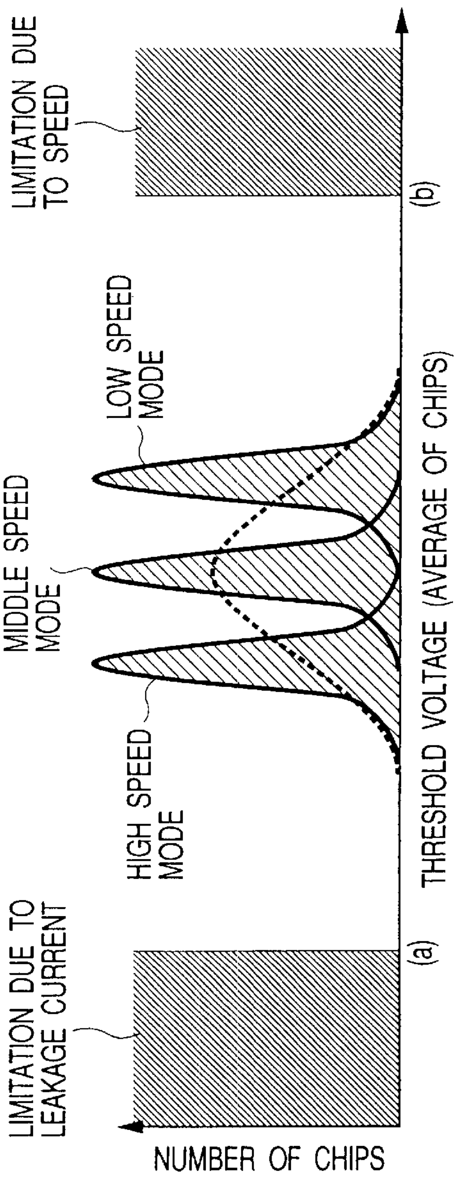
FIG. 40 is also a graph for showing the distribution of averaged values of the threshold voltages within a chip, for the purpose of explaining the present invention.

As shown in the FIG. 40 mentioned above, for the purpose of unifying or centralizing the fluctuating performances of the microprocessors into the high speed mode, among the high speed mode, the middle speed mode and the low speed mode thereof, it is enough to supply the control signal having the high frequency with using the mode change signal, as was mentioned in the embodiment shown in the FIG. 20. Also, in the same manner, for unifying or centralizing the fluctuating performances of the microprocessors into the middle speed mode or the low speed mode, it is enough to select a frequency dividing signal being low in the frequency with using the mode change signal in the embodiment shown in the FIG. 20, so as to form the control signal, thereby to supply it to the speed monitor circuit.

Figure 21:
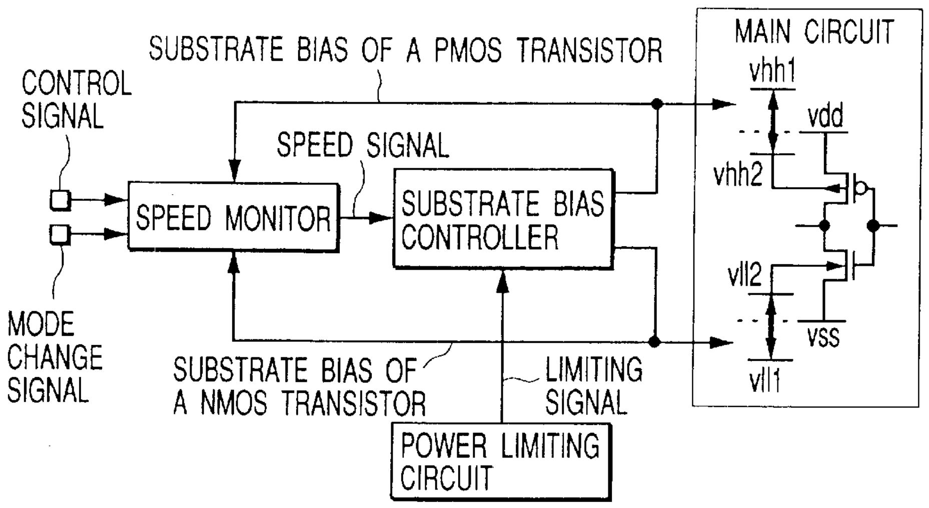
FIG. 21 is a block diagram for showing a further other embodiment of the semiconductor integrated circuit, according to he present invention.

In FIG. 21 is shown a block diagram of a further other embodiment according to the present invention. Basically, that shown in the same figure is a variation of that shown in the FIG. 1, wherein the mode change signal is supplied to the speed monitor circuit directly. Changing the delay time of the speed monitor circuit or the oscillation frequency of the ring oscillator by using the mode switch signal, it is possible to suppress the main circuits at the fluctuations, for each of the modes at desire, such as, the high speed mode, the middle speed mode and the low speed mode. The structures of the other than the above are similar to those of the embodiment shown in the FIG. 1 mentioned above.

Figure 22:
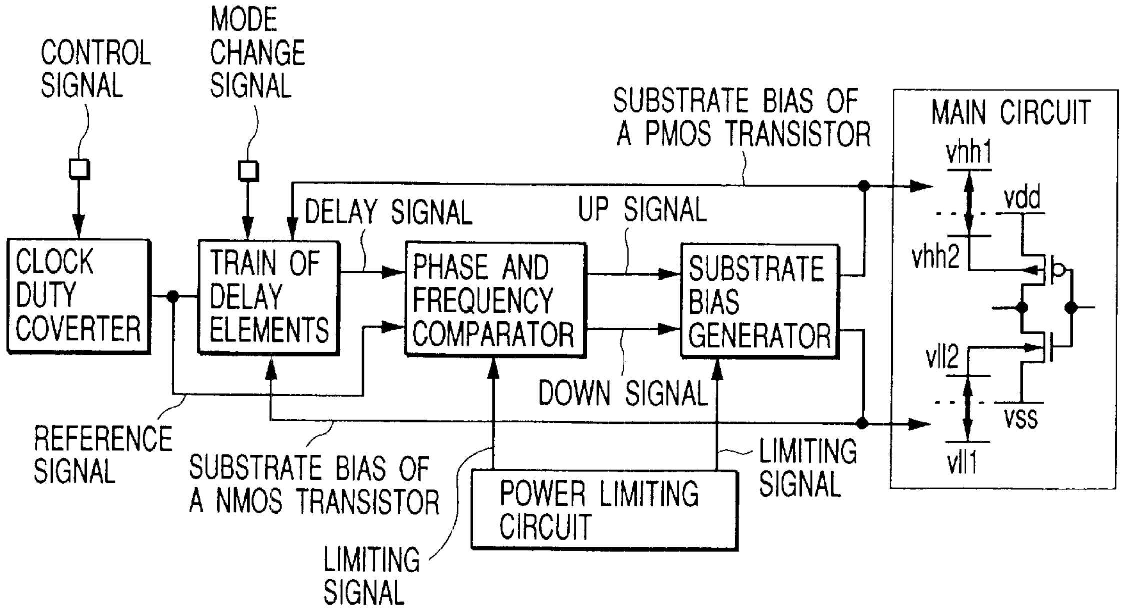
FIG. 22 is also a block diagram for showing a further other embodiment of the semiconductor integrated circuit, according to the present invention.

In FIG. 22 is shown a block diagram of a further other embodiment according to the present invention. The same figure shows a variation in which the mode change signal is added to the embodiment shown in the FIG. 2, wherein the mode change signal is supplied to the train of delay elements of the embodiment shown in the FIG. 2, directly. Namely, the number of the delay stages is changed by the mode change signal, for the train of delay elements.

For example, if the number of the delay stages is lessened, the delay time comes to be short under the same substrate bias. As a result of this, the substrate bias is enlarged in the back bias direction, so as to meet the above-mentioned delay time with one (1) cycle of the clock signal as the reference. Thus, the control is made on the substrate bias, so that the delay time for each one of the delay stages is enlarged as far as the number of the delay stages is lessened. With such the substrate bias, the main circuit operates under the low speed mode, corresponding to the delay time elongated by the speed monitor circuit as mentioned above.

On the contrary, when the number of the delay stages is increased, the delay time is elongated if the substrate bias is the same. As a result of this, the substrate bias is lessened in the forward bias direction so that the elongated delay time meets with one (1) cycle of the clock signal as the reference, i.e., the control is made on the substrate bias, so that the delay time for each one of the delay stages is lessened as far as the number of the delay stages is enlarged. Due to this, the main circuit and the speed monitor circuit are set at the high speed mode, on the contrary to the above. With the middle speed mode, the number of the delay stage is selected between them.

Figure 25:
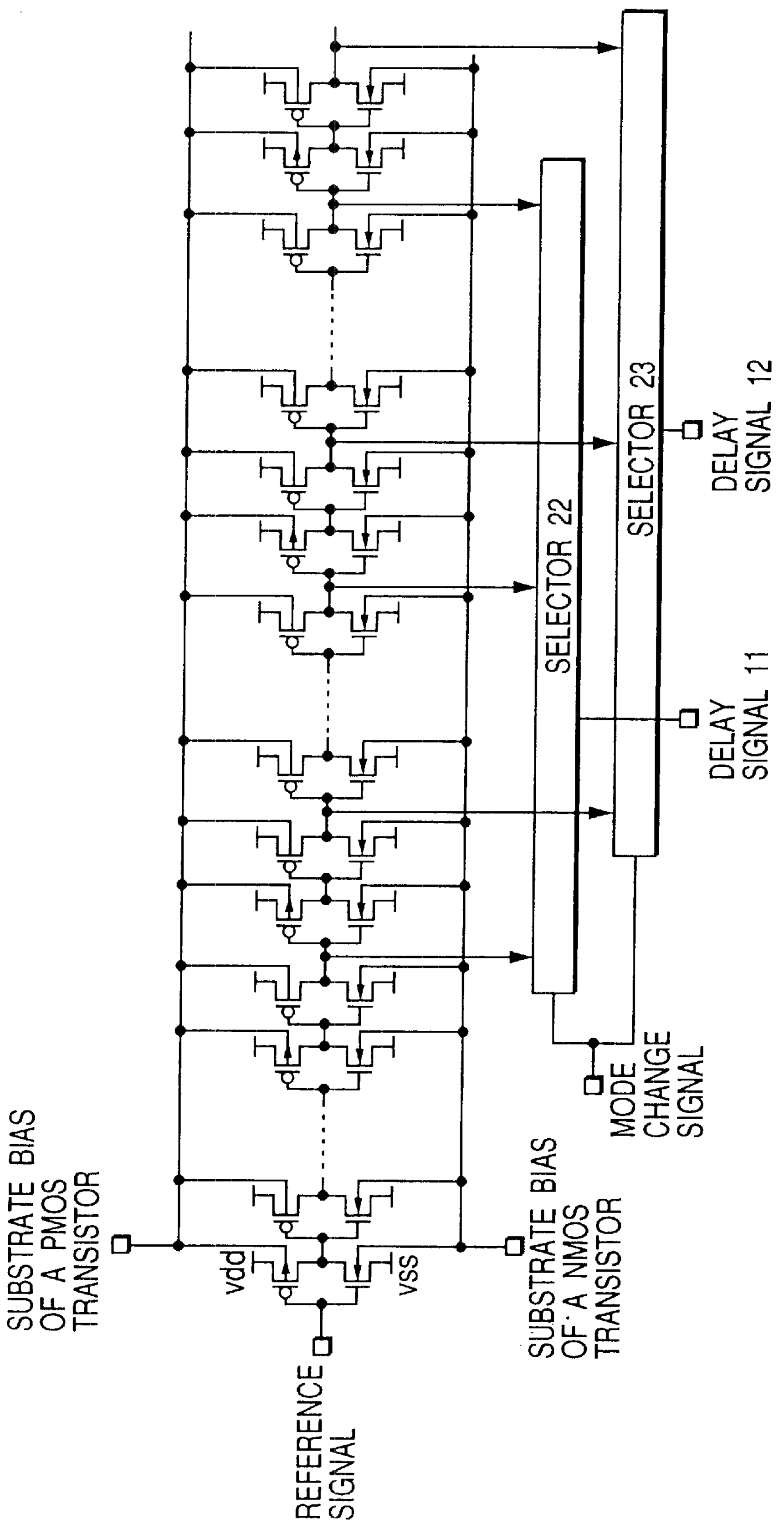
FIG. 25 is a circuit diagram for showing an embodiment of a train of delay elements shown in the FIG. 22.

In FIG. 25 is shown a circuit diagram of an embodiment of the train of delay elements shown in the FIG. 22 mentioned above. The train of delay elements is constructed with a plural number of the delay elements, each of which are constructed with the CMOS logic circuit, such as the inverter, etc., and two (2) selectors 22 and 23. The delay elements are connected in series, wherein a reference signal is inputted into the delay element at the initial stage thereof. An output may be taken out from any position in the train of delay elements, and then the selectors 22 and 23 select the outputs of the delay elements at the locations corresponding to the mode change signals, thereby providing the outputs, as the delay signals 11 and 12.

The above-mentioned delay signals 11 and 12 set the substrate bias at a target value, corresponding to the operation mode, when they are in the relationship in the phases thereof that was shown in the FIG. 7 mentioned above. Speaking on the contrary to this, the control is made on the substrate bias, so that the delay signal 11 is short while the delay signal 12 is long, with respect to the pulse width of the reference signal (one (1) cycle of a clock signal). Since the pulse width of this reference signal is constant, the number of the delay stages for the train of the delay elements is changed or altered by the selectors 22 and 23 depending upon the mode change signal, therefore the substrate bias is controlled so that the delay times at the respective delay stages are in inverse proportion to the selected number of stages, then it is possible to conduct changing of the operation speeds within the main circuit. The delay elements of the train of delay elements mentioned above may be constructed with the CMOS logic circuits, such as the NAND or NOR other than the inverter, or may use a critical pulse of the microprocessor.

Figure 26:
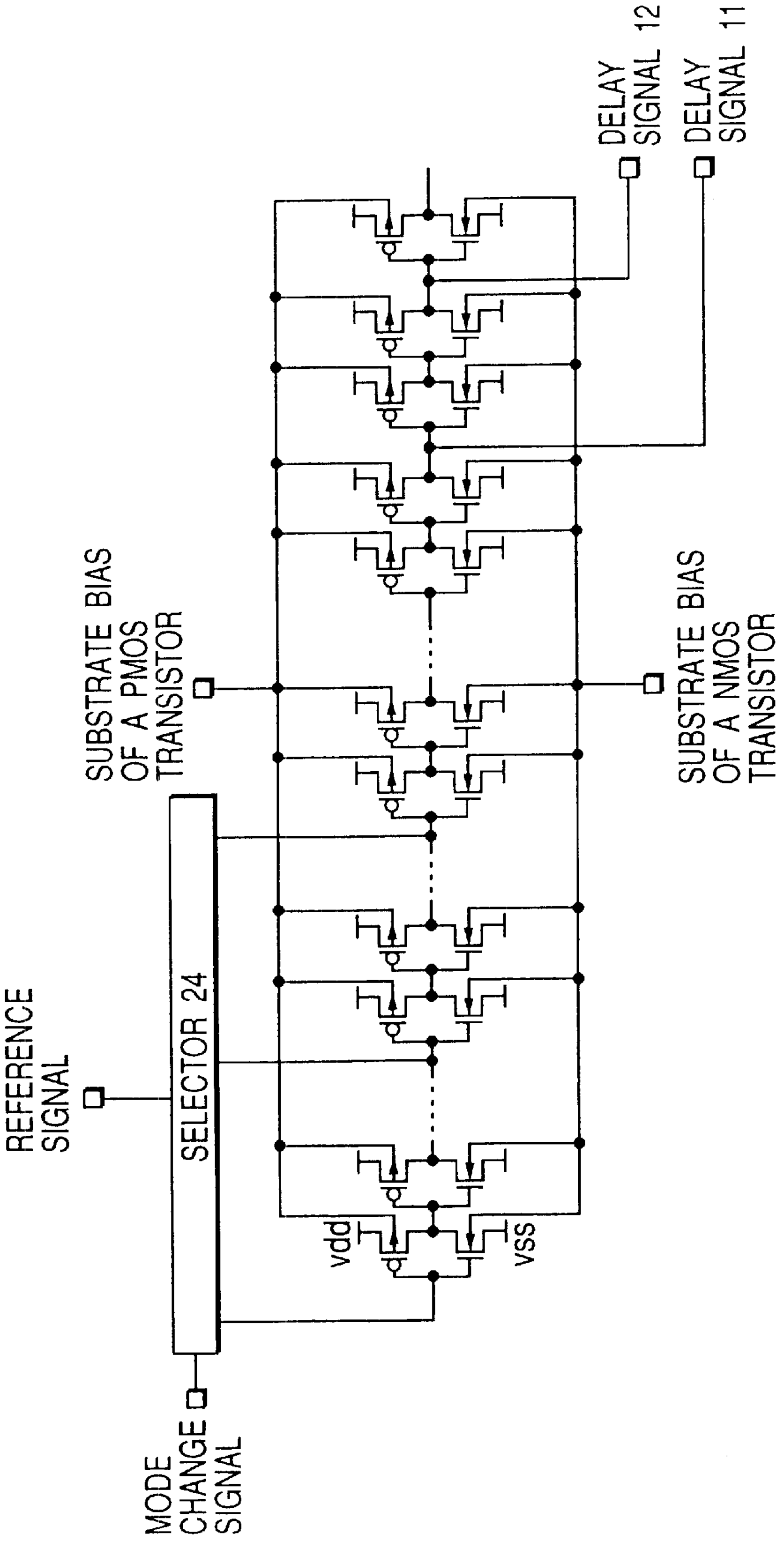
FIG. 26 is a circuit diagram for showing another embodiment of the train of delay elements mentioned above.

In FIG. 26 is shown a circuit diagram for other embodiment of the train of the delay elements mentioned above. In this embodiment, on the contrary to that shown in the FIG. 25, by means of a selector 24 depending upon the mode selection signal, it is decided on into which the delay element (delay stage) at the position thereof should be inputted the reference signal. The position of the output is fixed. With those constructions, it is also possible to perform the operation same to that shown in the FIG. 25 mentioned previously. Also, in this embodiment, at the high speed mode, the delay time of the train of delay elements is elongated by increasing the number of the delay elements within the train of delay elements, in the same manner as mentioned above. On the contrary, at the low speed mode, the delay time of the train of delay elements is shortened by decreasing the number of the delay elements therein. With this embodiment, since it can be constructed with the one (1) selector 24 when conducting the speed determination by the combination of two (2) delay signals 11 and 12, it is possible to obtain simplification of the circuit.

Figure 23:
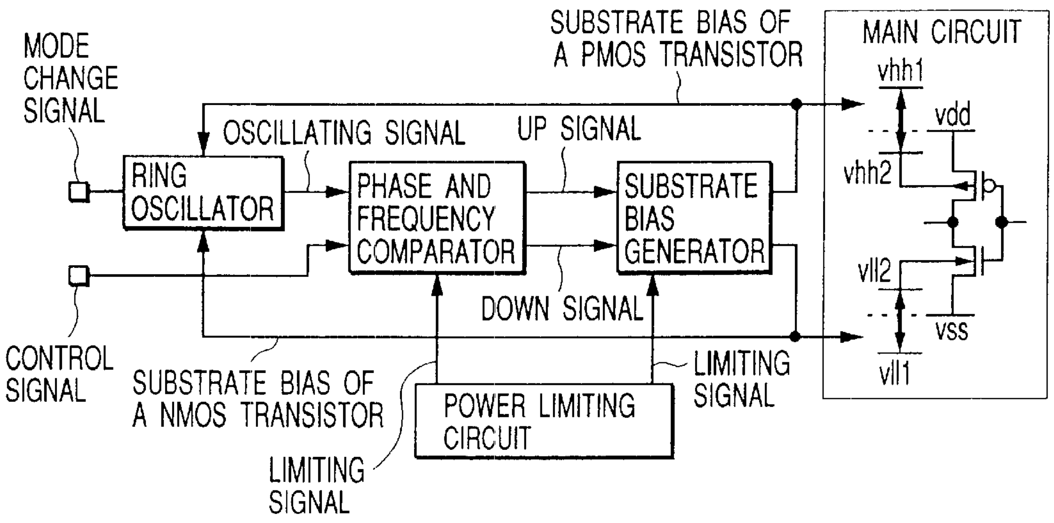
FIG. 23 is also a block diagram for showing a further other embodiment of the semiconductor integrated circuit, according to the present invention.

In FIG. 23 is shown a block diagram of a further other embodiment of the present invention. The same figure shows a variation, in which the mode change signal is added to the embodiment shown in the FIG. 3, and the mode change signal is supplied to the ring oscillator shown in the FIG. 3, directly. Namely, for the ring oscillator, the number of inverter stages of the ring oscillator is changed over by the mode change signal.

For example, when the number of the delay stages is lessened, the delay time in the feedback loop is shortened with the same substrate bias. As a result of this, the oscillation frequency of the ring oscillator is increased. Accordingly, the substrate bias is changed in the direction of the back bias, so as to lower the oscillation frequency of the ring oscillator, thereby to bring the frequency (the phase) of the clock signal as the reference and the oscillation frequency of the ring oscillator to meet with each other. Namely, such a control is made on the substrate bias, that the delay time is enlarged by each one of the delay stages, so far as the number of stages of the ring is lessened, and with such the substrate bias, the main circuit operates at the low speed mode.

On the contrary, when the number of the delay stages is increased, the delay time is elongated with the same substrate bias. As a result of this, the oscillation frequency of the ring oscillator comes to be high. Accordingly, the control is made so that the substrate bias is lessened in the direction of the forward bias, thereby bringing the oscillation frequency of the above-mentioned ring oscillator to meet with the frequency of the clock signal as the reference (i.e., so as to shorten the delay time), and the substrate bias is made small, so as to make the delay time per one delay stage short, so far as the number of the delay stages is increased up, as was mentioned in the above. Due to this, on the contrary to the above, the main circuit and the speed monitor circuit are set at the high speed mode. At the middle speed mode, the number of the delay stages is set at between them.

Figure 27:
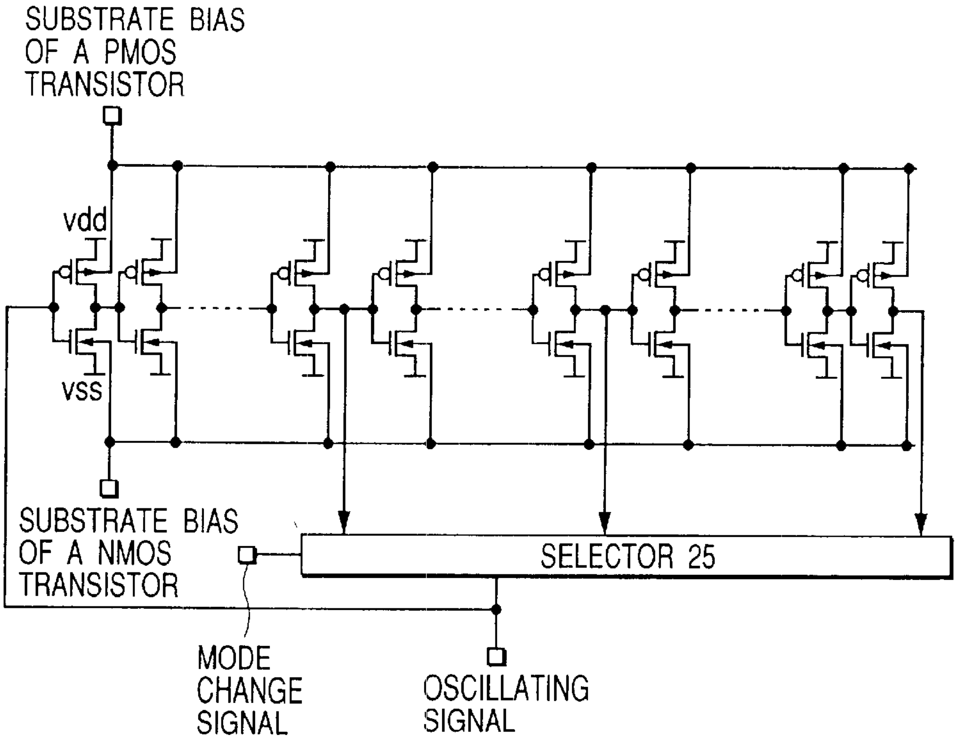
FIG. 27 is a circuit diagram for showing an embodiment of a ring oscillator shown in the FIG. 23.

In FIG. 27 is shown a circuit diagram of an embodiment of the ring oscillator. The ring oscillator comprises a plural number of the delay elements, being constructed with the CMOS logic circuits, such as the inverter, etc., and a selector 25. The delay elements are connected in a ring-like form, so that an oscillation signal can be outputted from any one of the delay elements. Depending upon the mode change signal, the selector 25 determines the number of the stages of the inverter lines, with which the ring should be formed. The delay elements may be constructed with the CMOS logic circuits, such as the NAND or NOR other than the inverter, or may use the critical pulse of the microprocessor. With those constructions, in the embodiment shown in the FIG. 23, the number of the elements is increased up within the ring oscillation circuit, for example at the high speed mode, thereby lowering the oscillation frequency thereof. On the contrary, the number of the elements is decreased down within the ring oscillation circuit at the low speed mode, thereby rising up the delay time within the ring oscillation circuit.

Figure 28:
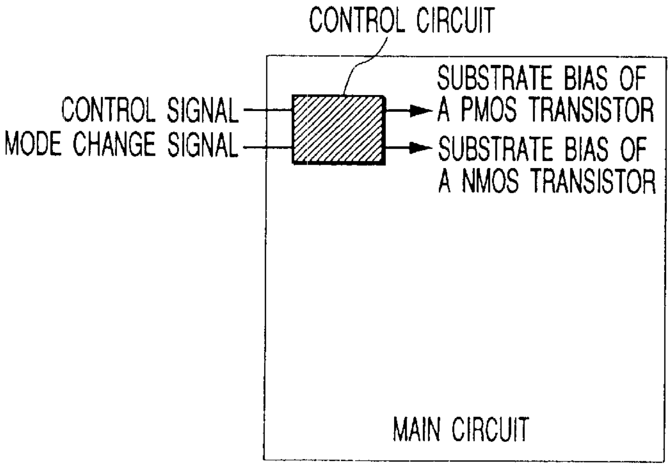
FIG. 28 is a block diagram for showing a further other embodiment of the semiconductor integrated circuit, according to the present invention.

In FIG. 28 is shown an outline block diagram of an embodiment of the semiconductor integrated circuit device, according to the present invention. In this embodiment of the semiconductor integrated circuit device, one (1) control circuit is provided for the main circuit. In this embodiment is installed the control circuit for controlling the substrate bias which was explained by referring to the above-mentioned FIG. 1, etc. In the same chip, it is possible to install such the control circuit, thereby to produce the PMOS substrate bias and the NMOS substrate bias for the main circuit of the semiconductor integrated circuit device. The control signal and the mode change signal given to the control circuit may be supplied from an outside of the chip. Or alternatively, instructions or commands may be decoded within the chip, to be given thereto.

Figure 29:
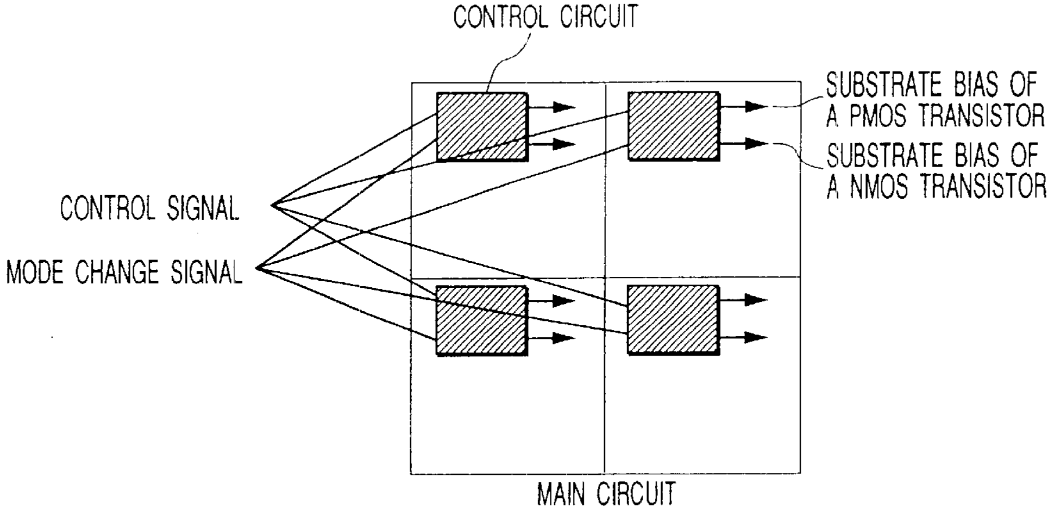
FIG. 29 is also a block diagram for showing a further other embodiment of the semiconductor integrated circuit, according to the present invention.

In FIG. 29 is shown an outline block diagram of other embodiment of the semiconductor integrated circuit device, according to the present invention. With this embodiment, in a case where the scale of the main circuit is large, the main circuit is divided into a plural number of the blocks. The control circuit being explained by referring to the FIG. 1 mentioned above is provided in each of the plural number of the blocks which are divided in this manner. Due to this, with preventing from the substrate noises occurring in the substrate due to this, or making different control on each of the blocks, it is possible to achieve the high speed and the low electric power consumption, finely. Even in this case, the control signal and the mode change signal may be supplied from an outside of the chip, or instructions or commands maybe supplied from an inside of the chip. Also, changing the control signal and the mode change signal for each of the blocks, it is possible to make the control, being different for each of the blocks, as was mentioned previously.

Figure 30:
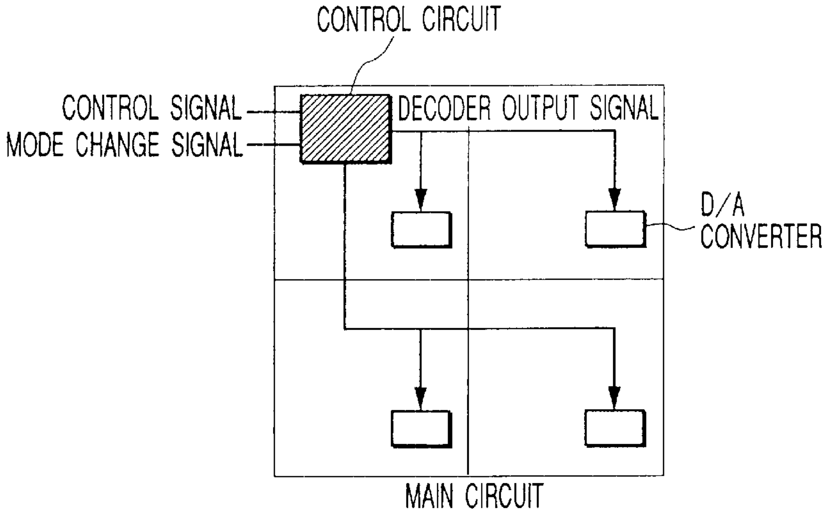
FIG. 30 is also a block diagram for showing a further other embodiment of the semiconductor integrated circuit, according to the present invention.

In FIG. 30 is shown an outline block diagram of a further other embodiment of the semiconductor integrated circuit device, according to the present invention. In this embodiment, the main circuit is also divided into a plural number of the blocks. In a case where the plural number of the blocks divided are provided in such the manner, it is possible to suppress the increase of area by disposing only the D/A converters in the control circuit, which forms the substrate bias directly, being dispersed into each of the blocks in the plural number thereof.

Figure 31:
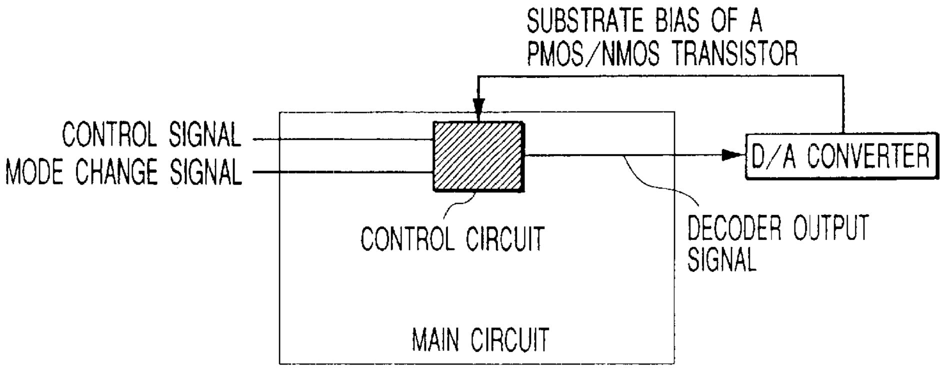
FIG. 31 is also a block diagram for showing a further other embodiment of the semiconductor integrated circuit, according to the present invention.

In FIG. 31 is shown an outline block diagram of a further other embodiment of the semiconductor integrated circuit device, according to the present invention. In this embodiment, the control circuit is installed into the main circuit, wherein only the D/A converter within the control circuit is prepared in a form of a chip, being separated from that of the main circuit, and the decoder signal is transmitted from the control circuit to the D/A converter, therefore the D/A converter supplies the PMOS substrate bias and the NMOS substrate bias to the main circuit depending thereupon. In the case of preparing the D/A converter in the form of the separated chip, in this manner, it is possible to form or provide the substrate bias voltage at a low electric power supply impedance with using the bipolar type transistor or the like.

In FIG. 32 is shown a view of the structure of an embodiment of the semiconductor integrated circuit device, according to the present invention. This embodiment is so constructed that it comprises two (2) kinds of operating modes, including a normal operation mode and a standby mode. In case where the power supply voltages of the main circuit and the speed monitor circuit are vdd=1.8 V and vss=0.0 V, the normal operation is performed by bringing the PMOS substrate bias to 1.8 V and NMOS substrate bias to 0.0 V, if no control is made thereon. For conducting the control on the fluctuation in the threshold voltage, the PMOS substrate bias is changed from the back bias 3.3 V to the forward bias 1.3 V, while the NMOS substrate bias is changed from the back bias −1.5 V to the forward bias 0.5 V.

And, when being under the standby mode in which the main circuit does not operate, the substrate bias is turned to be deepest, namely, by bringing the PMOS substrate bias at 3.3 V while the NMOS substrate bias at −1.5 V, it is possible to reduce the sub-threshold leak current during the standby operation. And, due to combining those operations, it is possible to realize the semiconductor integrated circuit device having the high speed and the low electric power consumption therewith. An instruction on such the operating mode may be made by fixing the control signal mentioned above at a low level or a high level, in other words, it is enough to make the frequency of the clock signal, into which the speed information is inputted in the form of the frequency thereof, to zero (0). Or alternatively, it may be enough that the operations of the monitor circuit and the substrate bias controller are stopped substantially by the mode change signal mentioned above, thereby supplying the voltages, 3.3 V and −1.5 V, thereto, fixedly. In FIG. 33 is shown a view of the structure of a further other embodiment of the semiconductor integrated circuit device, according to the present invention. In this embodiment, it is intended to conduct the speed control being same to the control of the substrate bias by controlling the power supply voltage. Namely, though the substrate bias is changed, for controlling the operating speeds of the main circuit and the speed monitor, in the embodiments shown in the FIG. 1 through FIG. 32, however in the place of such the control on the substrate bias, it is also possible to achieve the high speed, the low electric power consumption and the suppression of fluctuation, at the same time, in the same manner by controlling the power voltage.

In this instance, it is at the low electric power or the standby mode when the power supply voltages are at 1.3 V and 0.5 V, while being at the high speed mode when the power voltages are at 3.3 V and −01.5 V. And, according to the control on fluctuation of the threshold voltages of the MOSFETs in the low speed mode and the high speed mode, they come to be from 3.3 V to 1.3 V at the high voltage side while from −1.5 V to 0.5 V at the low voltage side. The voltage at the low voltage side may be one that is fixed at the ground potential vss. When conducting the control on such the power supply voltage, it is necessary to exchange the input between the UP signal and the DOWN signal, in the embodiments shown in the FIG. 2, etc.

Figure 34:
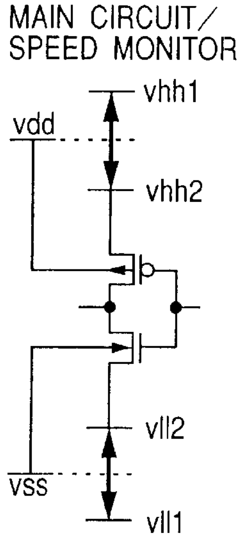
FIG. 34 is a structural diagram for showing a further other embodiment of the semiconductor integrated circuit, according to the present invention.
Figure 35:
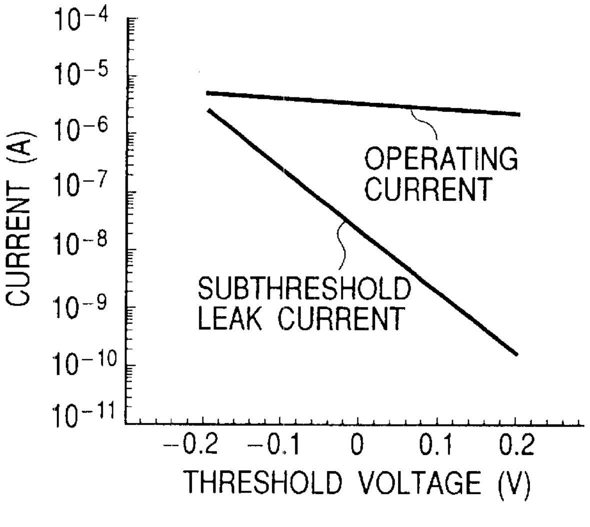
FIG. 35 is a graph for showing characteristic curves between a threshold voltage and current, for the purpose of explaining the present invention.

In FIG. 34 is shown a view of the structure of a further other embodiment of the semiconductor integrated circuit device, according to the present invention. In this embodiment, it is also intended to conduct the speed control being similar to the substrate bias control mentioned above, via the control on the power supply voltage, basically in the same manner shown in the FIG. 33. An aspect differing from that shown in the FIG. 33 mentioned above lies in that the substrate biases of the MOSFETs are fixed at vdd and vss, thereby to control the power supply voltage. In this instance, since it is impossible to apply such a variation, in which the voltage at the low voltage side is fixed to the ground potential as shown in the FIG. 33, therefore, it is in the low electric power mode or the standby mode, for example when the power supply voltages are at 1.3 V and 0.5 V, while being in the high speed mode when the power voltages are at 3.3 V and −1.5 V, and according to the control on fluctuation of the threshold voltage of the MOSFETs in such the low speed mode or the high speed mode, the voltage lies from 3.3 V to 1.3 V at the high voltage side while from −1.5 V to 0.5 V at the low voltage side. Accordingly, when the substrate bias is fixed, due to a relative relationship to the power voltage given to the source, the control comes to be similar to that of the substrate bias control mentioned above, thereby enabling to improve the controllability thereof, comparing to the embodiment shown in the FIG. 33.

According to the embodiments mentioned in the above, in the semiconductor integrated circuit being operable at the high peed and the low electric power consumption, it is possible to provide a CMOS circuit, a CMOS-LSI chip, and a semiconductor integrated circuit device constructed therewith, satisfying or dissolving the problems which will be mentioned below, at the same time:

(1) suppressing the fluctuation in performances of the CMOS circuits, so as to improve the yield rate thereof;

(2) enabling the chips having a low speed due to the fluctuation to be high in the operating speed thereof; and (3) enabling the chips having a high power consumption due to the fluctuation to be low in the power consumption thereof.

An idea of the present invention, that an improvement is made on the yield rate in manufacturing the semiconductor integrated circuit device with the control of the substrate bias voltage thereof, can be led to the forms of the following developments. Namely, for low voltage supply operation of the MOSFET in recent years, there is a necessity to lower the threshold voltage. However, for the purpose of lowering the threshold voltage in this manner, it is also necessary to form the film thickness of the gate insulation film to be thin, but this results in a large fluctuation in the manufacturing processes thereof, as well as causing a problem in the reliability thereof through the deterioration of voltage duration.

Then, according to another embodiment of the present invention being developed, a genius threshold voltage is set to be a relatively large, from a point of view of the processes, by taking priority over the low duration voltage and/or the fluctuation of the processes. In other words, by using the processes that were established before one generation, it is possible to ensure the fluctuation in the performances of elements and the breakdown voltage of gate insulator, being a relatively stable. However, if applying such the elements as they are, the circuit does not operate when the operating voltage is lowered for obtaining the low electric power consumption, nor sufficient operating current cannot be obtained though it operates, therefore it is impossible to obtain a desired operating speed therefrom. Then, for achieving a desired circuit operation, in other words, for lowering the effective threshold voltage of the MOSFET, the substrate voltage in the forward bias direction is given to a semiconductor region where the MOSFET is formed. Thus, there is provided the substrate bias circuit only for the purpose of “bringing the substrate bias to be shallow”, as was mentioned above.

From the beginning, the fact itself was already known, in general, that the threshold voltage is lowered when the substrate bias of the MOSFET is made to be shallow, thereby making the operating speed fast. However, bringing the substrate bias to be shallow in this manner can be achieved by combining with the operation of bringing the substrate bias to be deep, however, there is no such the idea that only the forward bias voltage is supplied to the semiconductor region where the MOSFET is formed, exclusively, thereby obtaining the improvement of the yield rate of the products, while maintaining the reliability and/or the desired operating speed thereof.

Namely, in the conventional art, when the operating speed is turned to be high by lowering the threshold voltage of the MOSFET and applying the forward bias into the semiconductor region where the MOSFET is formed, on the other hand, since fatal defects occur, such as the latch-up, that reaches to the breakdown of the elements, therefore, the circuit is constructed by taking the most of priority over the protection from the breakage of the elements, for example, providing a margin by taking a relative large process fluctuation of the elements into the consideration. On the contrary to this, according to the another embodiment of the present invention, it is possible to obtain the improvement in the yield rate of manufacturing products, with addition of a current limiter which will be explained later, while maintaining the desired operating speed under the high reliability thereof. And, it is possible to obtain the semiconductor integrated circuit device, being suitable for minuteness in the controllability, as well as of the elements therein.

Figure 45:
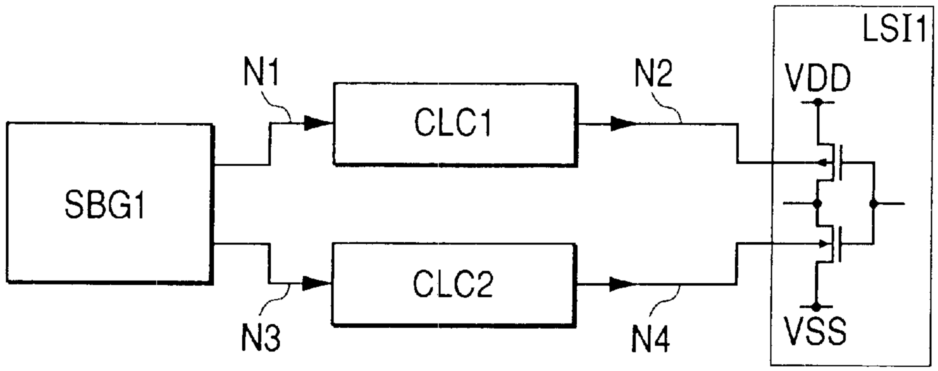
FIG. 45 is a basic block diagram for showing a further other embodiment of the semiconductor integrated circuit, according to the present invention.

In FIG. 45 is shown a basic block diagram of other embodiment of the semiconductor integrated circuit device, according to the present invention. In the same figure are shown the circuit blocks having a relationship to the present invention, being taken out therefrom, in the same manner as in the above. A substrate bias generator SBG1 generates the voltages to be given to the substrates of the MOSFETs constructing a main circuit LSI1, i.e., outputs a substrate bias N1 for the PMOS transistors and a substrate bias N3 for the NMOS transistors. The substrate biases N1 and N3 are voltages to be applied to the PN junction between the sources of the above-mentioned MOSFETs and the semiconductor region where they are formed, in the direction of the forward bias.

In a case where such the forward biases N1 and N3 are applied thereto, for the purpose of preventing from the breakage of elements due to the latch-up and so on, mentioned above, with certainty, there are provided current limiting circuits CLC1 and CLC2. Upon receipt of the substrate biases N1 and N3, those current limiting circuits CLC1 and CLC2 supply the substrate biases, being at the same potentials thereof, as N2 and N4, to the substrates of the MOSFETs of the main circuit LSI1, and at the same time, they function to limit the currents flowing therethrough, respectively.

The above-mentioned current limiting circuits CLC1 and CLC2 restrict or limit such the amount of current that reaches to the breakage of the elements, flowing within the main circuit LSI1 due to the substrate biases which the substrate bias generator SBG1 generates. Thus, in a case where the substrate bias of the PMOS transistor is lower than the power supply voltage VDD, or the substrate bias of the NMOS transistor is higher than the ground potential, this substrate bias comes to be the forward bias, thereby running a large current through the PN junction within the transistors and the parasitic bipolar transistor. This large current increase the useless or wasteful electric power up, and causes erroneous operations in the main circuit LSI1, and/or bringing about the phenomenon, i.e., so-called the latch-up, that breaks down the transistor(s) due to overflow of such the large current.

Then, limiting the amount of current flowing in the MOS transistor substrate within the main LSI1, with using the current limiting circuits CLC1 and CLC2, it is possible to improve the reliability in the operation of the main circuit LSI1. The power limiting circuit of the embodiment, shown in either one of those FIGS. 14 or 19, detects the current flowing in the monitor circuit, so as to conduct the current control in the main circuit. On the contrary to this, in the embodiment shown in the FIG. 45, it restricts or limits the current in response to the current flowing in the main circuit itself, therefore it has remarkable superiority thereto, in particular in the reliability thereof. Thus, in the embodiment mentioned above, since it receives an influence due to the fluctuation of performance of the elements formed in one (1) of the semiconductor integrated circuit, there is the necessity of provision of the margin taking the worst cases on variety of elements into the consideration. On the contrary to this, according to the present embodiment, since the limiting operation on the current is performed responding to the current flowing through the main circuit itself, then there is no necessity of providing the margin taking the variation of elements into the consideration.

Figure 46:
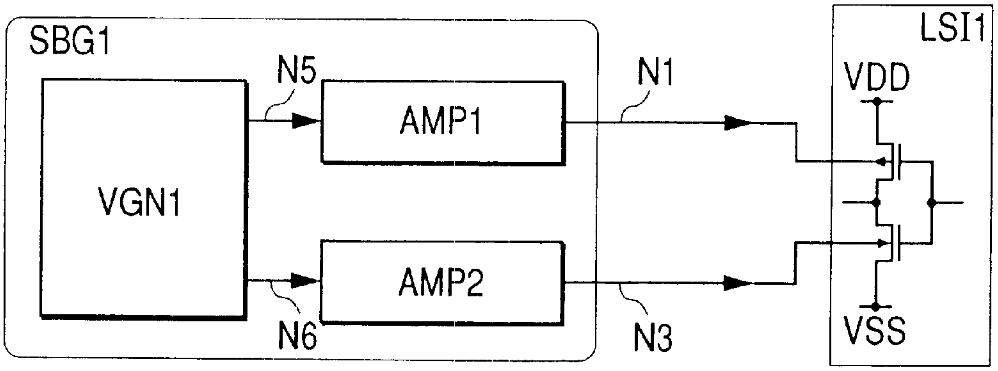
FIG. 46 is also a basic block diagram for showing a further other embodiment of the semiconductor integrated circuit, according to the present invention.

In FIG. 46 is shown a basic block diagram of a further other embodiment of the semiconductor integrated circuit device, according to the present invention. In this embodiment, paying attention to the fact that the substrate bias generator SBG1 is constructed with a voltage source VGN1 for use in the substrate bias and current amplifiers AMP1 and AMP2, as shown in the FIG. 46, a current limiting function is added into each the capability of supplying current of the above-mentioned current amplifiers AMP1 and AMP2. From other point of view, the current amplifier is an output circuit having an output limited impedance thereof. Utilizing the output impedance thereof positively, limiting of the leak current is conducted for the purpose of reducing the bias voltage in the forward direction by means of the voltage drop thereof, when the current flowing through the main circuit itself exceeds a predetermined amount of the current.

Namely, a voltage supply VGN1 for use of the substrate bias outputs the voltages from N5 and N6, which are corresponding to the substrate biases to be given to the main circuit LSI1. The current amplifier AMP1 or AMP2 amplifies the amount of current, so that it is able to supply the current while keeping the potential of N5 or N6. In this manner, the substrate bias generator SBG1, which is able to supply sufficient current amplified, outputs the substrate bias from N1 and N3. Those biases are given to the main circuit LSI1. Due to this, it is possible to reduce the useless or wasteful current flowing through the P/N junction(s) and the parasitic bipolar transistor(s), lying inside the MOS transistors, by means of the forward bias given to the main circuit LSI1, thereby to suppress the erroneous operations occurring therein. In this embodiment, since the output impedance of the output circuit is utilized, it is possible to reduce the number of the circuit elements.

Regarding the limit on current by means of the current amplifiers AMP1 and AMP2, when changing the circuit scale (i.e., the number of transistors in the circuit) of the main circuit LSI1 to which is supplied the substrate bias, the current amplifiers AMP1 and AMP2 are necessary to be re-designed depending upon that scale. In this regard, as in the embodiment shown in the FIG. 45 mentioned above, it is superior to provide the substrate bias generator SBG1 only for the purpose of outputting the substrate bias, while providing the current limiting circuits CLC1 and CLC2 to be in charge of limiting the amount of current, from a point of view of simplification in designing or for enabling the general use thereof. Thus, providing the current limiting circuits CLC1 and CLC2 between the substrate bias generator SBG1 and the main circuit LSI1, while standardizing the substrate bias generator SBG1 (in the form of a cell), it is possible to realize the control on current, being most suitable corresponding to the main circuit LSI1, by designing only the current limiting circuits CLC1 and CLC2 corresponding to each of the circuits.

Figure 47:
FIG. 47 is a circuit diagram for showing an embodiment of a current limiting circuit shown in the FIG. 45.

In FIG. 47 is shown a circuit diagram of an embodiment of the current limiting circuit mentioned above. In this embodiment, the current limiting circuit mentioned above is constructed with a resistor RES1. In the FIG. 45, an element is shown between the connector terminals N1 and N2 corresponding thereto, however a similar resistor is provided between the connector terminals N3 and N4. For example, in a case where the main circuit LSI1 is a standard microprocessor in scale of million MOS transistors, if assuming that it is enough to supply the current of about 1 mA for use in the substrate bias, a resistor of 0.5 kΩ is necessary for applying the forward bias of 0.5 V.

If trying to produce the resistor RES1 having the resistance value of 0.5 kΩ mentioned above by wiring of aluminum or copper which is used in an ordinal semiconductor process, it becomes too large in the area, then useless. For example, for realizing the resistor of 0.5 kΩ with aluminum wiring having a width of 0.5 μm, it must come up to 4 m in the length thereof. Then, the resistor RES1 in this embodiment is formed by using a material having relative high resistance, such as wiring of polysilicon or resistor of diffusion layer. In case of using such the elements, it comes to an end to be about 10 μm in the length of wire and also to be small in the area thereof, and there is no need of taking the length on designing into the consideration, about the wiring for use in connection between the terminals of such as aluminum or copper, etc., therefore the designing comes to be easy. The current limiting circuit with this resistor RES1 can be seen to be a substrate voltage limiting circuit. Thus, the voltage drop appears on the resistor RES1 depending upon the leak current, so as to lessen the forward bias to be applied to the substrate, as a result of this, the leak current is limited.

When working out a design for limiting the amount of current by means of the current amplifiers AMP1 and AMP2 shown in the FIG. 46, they must be designed, individually, corresponding to the scale of transistors (the number of transistors) of the main circuit LSI1 mentioned above, etc., however it is enough only to change or alter the resistance value corresponding to the scale of the MOS transistors of the main circuit LSI1 mentioned above, when achieving it by means of the resistor RES1 with using the current limiting circuits CLC1 and CLC2 as shown in the FIG. 45 mentioned above.

Figure 48:
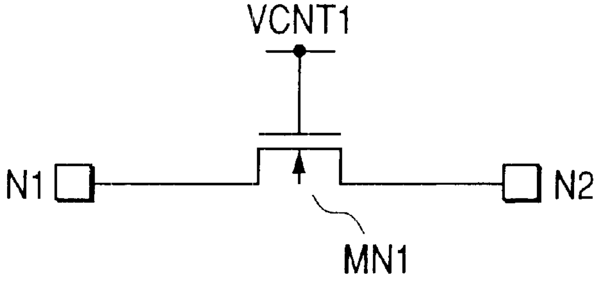
FIG. 48 is a circuit diagram for showing another embodiment of the current limiting circuit shown in the FIG. 45.

In FIG. 48 is shown a circuit diagram of other embodiment of the current limiting circuit mentioned above. The current limiting circuit of this embodiment is constructed with a NMOS transistor MN1. Ordinarily, the control voltage VCNT1 is brought to be equal to the power supply voltage, so as to adjust the sizes of the NMOS transistor MN1, thereby controlling the limiting amount on the current. When making the control voltage VCNT1 variable, it is possible to perform the most suitable current control by changing the control voltage VCNT1, while keeping the sizes of the NMOS transistor MN1 constant, i.e., without changing the design depending upon the circuit scale of the main circuit LSI1.

Figure 49:
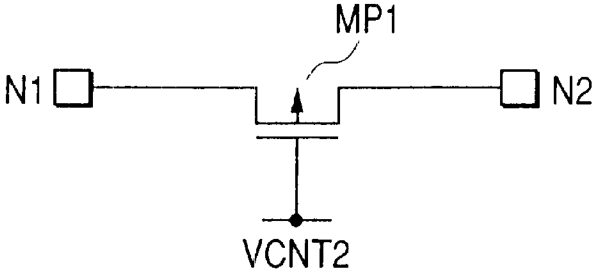
FIG. 49 is a circuit diagram for showing other embodiment of the current limiting circuit shown in the FIG. 45.

In FIG. 49 is shown the circuit diagram of a further other embodiment of the current limiting circuit mentioned above. The current limiting circuit of this embodiment is constructed with a PMOS transistor MP1. Ordinarily, the control voltage VCNT2 is brought to be equal to the ground voltage, so as to adjust the sizes of the PMOS-transistor MP1, thereby controlling the limiting amount on the current. When making the control voltage VCNT2 variable, it is possible to perform the most suitable current control by changing the control voltage VCNT2, while keeping the sizes of the NMOS transistor MP1 constant, i.e., without changing the design depending upon the circuit scale of the main circuit LSI1.

Figure 50:
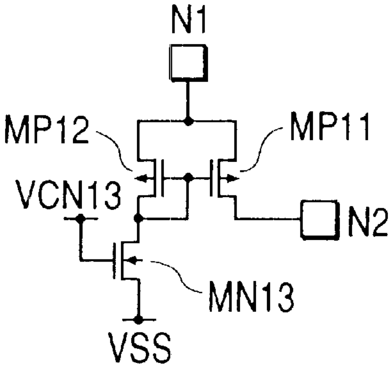
FIG. 50 is a circuit diagram for showing a further other embodiment of the current limiting circuit shown in the FIG. 45.

In FIG. 50 is shown a circuit diagram of a further other embodiment of the current limiting circuit mentioned above. In this embodiment, the limiting on the current is achieved by, so-called a circuit of current-mirror type. The current can be controlled by the sizes of MOS transistors MP11, MP12 and MN 13 constructing this circuit, or by the voltage of the control voltage VCNT3. Namely, the current is formed by means of the NMOS transistor MN13, to the gate of which is applied the control voltage VCNT3, so as to be supplied to the current-mirror circuit of the PMOS transistors M12 and M13, thereby to be conducted the current limitation thereon. In this instance, it is possible to control the maximum current flowing through between the connector terminals N1 and N2 by means of the sizes of the MOS transistors MP11, MP12 and MN 13, or the voltage of the control voltage VCNT3, however in a case where the substrate current is less than that, it is needless to say that only the current flows through according to the substrate current.

Figure 51:
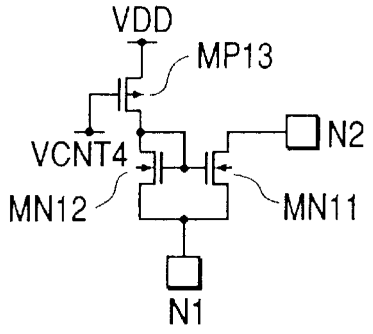
FIG. 51 is also a circuit diagram for showing a further other embodiment of the current limiting circuit shown in the FIG. 45.

In FIG. 51 is shown a circuit diagram of a further other embodiment of the current limiting circuit. In this embodiment, the current limiting is also achieved by the current-mirror type circuit, in the same manner as in the embodiment shown in the FIG. 50. In this embodiment, the conduction type of the MOS transistor is reversed to that of the embodiment shown in the FIG. 50 mentioned above, and it is possible to control the current by means of the sizes of the MOS transistors MN11, MN12 and MP13 constructing the circuit, or the voltage of the control voltage VCNT4.

Figure 52:
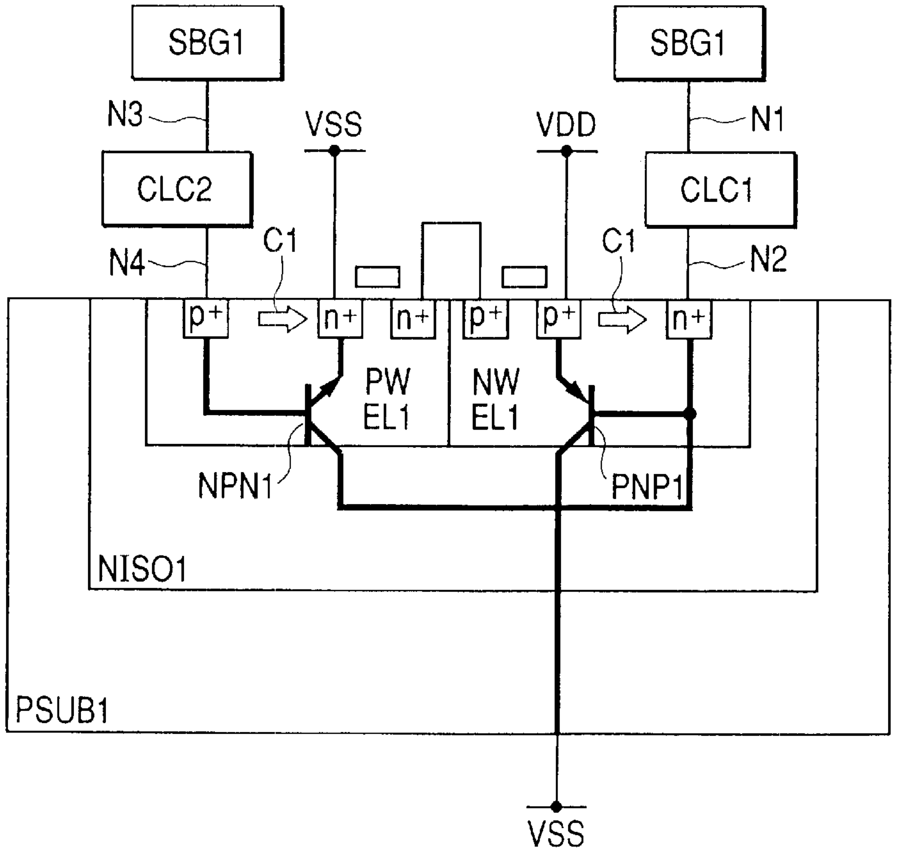
FIG. 52 is a cross-section view of an outline element structure of the semiconductor integrated circuit device, for the purpose of explaining the present invention.

In FIG. 52 is shown a cross-section view of the outline element structure of the semiconductor integrated circuit device, for the purpose of explaining the present invention. This embodiment is directed to the triple well structure for use of the substrate control. For achieving the control of the substrate bias, it is necessary to divide or separate P-type substrate PSUB1 of the silicon wafer, P-type well PWEL1 and N-type well NWEL1 constructing wells of each MOS transistor, respectively, by N-type substrate isolation layer NISO1, therefore it comes to be such the structure as shown in the figure.

In this instance, when applying the forward bias to the MOS transistor, a forward current C1 flows through the P/N junction within the well. This current can be suppressed directly, by limiting the supply current through the current limiting circuits CLC1 and CLC2. Also, within the substrate of the MOS transistors, there exists parasitic bipolar transistors NPN1 and PNP1 as shown in the figure. In the parasitic bipolar transistor NPN1, the base current is limited through the current limiting circuit CLC2, therefore it is prevented from the over current flowing therein, by controlling the current flowing between the collector and the emitter through the current limiting circuit CLC1. In the parasitic bipolar transistor PNP1, the current flowing between the collector and the emitter comes to be small, because the current limiting circuit CLC1 limits the base current and the length of the base is elongated due to the thickness of the N-type substrate isolation layer NISO1. In this manner, the current limiting circuits CLC1 and CLC2 suppress the currents flowing through the P/N junction and the parasitic bipolar transistors, being increased by means of the substrate bias in the forward direction.

Figure 53:
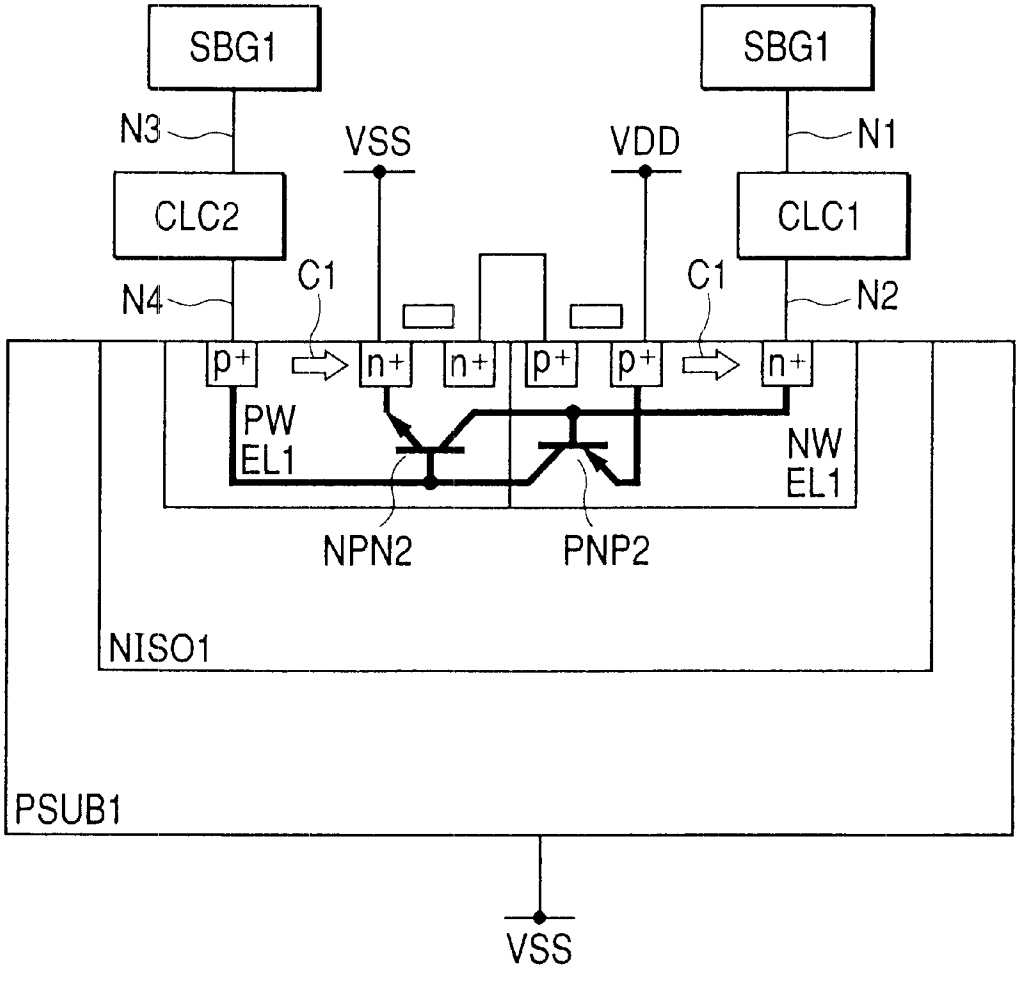
FIG. 53 is also a cross-section view of the outline element structure of the semiconductor integrated circuit device, for the purpose of explaining the present invention.

In FIG. 53 is shown a cross-section view of the outline element structure of the semiconductor integrated circuit device, for the purpose of explaining the present invention. This embodiment is also directed to the triple well structure for use of the substrate control. In the triple well structure mentioned above, there also exist parasitic transistors NPN2 and PNP2 even between P-type well PWEL1 and the N-type well NWEL1 neighboring to each other. Those transistors show the structure of a thyristor therewith, therefore once starting the bipolar operation, a large current flows through them, thereby causing the phenomenon of the latch-up. As a result of this, the over current flows inside the substrate, thereby causing the breakdown of the MOS transistor or erroneous operations of the circuit. In this embodiment, due to the fact that the current limiting circuits CLC1 and CLC2 limit the amounts of current, this latch-up is suppressed not to occur therein.

Figure 54:
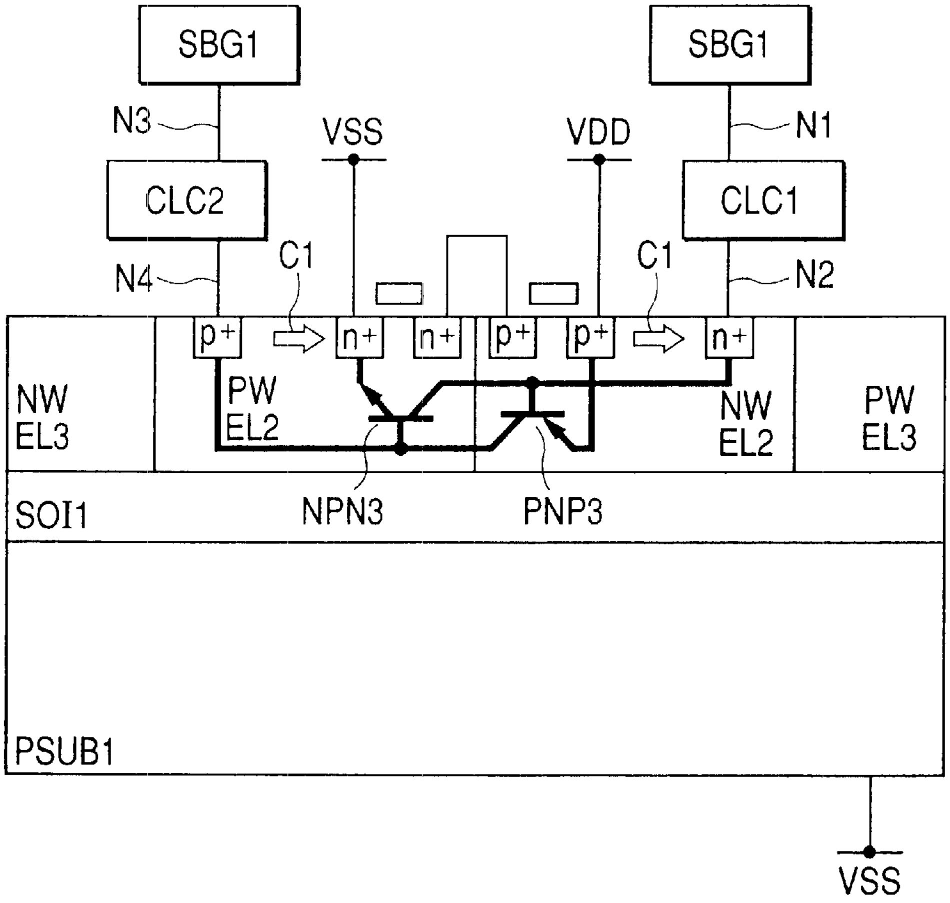
FIG. 54 is further a cross-section view of the outline element structure of the semiconductor integrated circuit device, for the purpose of explaining the present invention.

In FIG. 54 is shown a cross-section view of the outline element structure of the semiconductor integrated circuit device, for explanation of the present invention. This embodiment is directed to a silicon-on-insulator structure for use of substrate control. As another means for achieving the control of substrate bias, there is a method of dividing or separating between the P-type substrate PSUB1 and the well of the MOS transistor by means of an oxide film separation layer SOI1. Also in this instance, the forward current Cl at the P/N junction and/or the latch-up phenomenon due to the parasitic bipolar transistors NPN3 and PNP3 may occur easily, when the substrate is biased in the forward bias direction, however it is possible to remove such dangerousness by means of the current limiting circuits CLC1 and CLC2.

Figure 55:
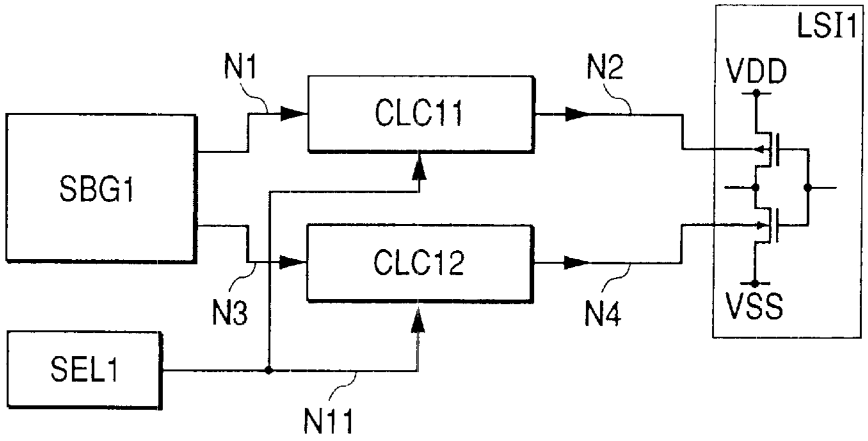
FIG. 55 is a basic block diagram for showing a further other embodiment of the semiconductor integrated circuit, according to the present invention.

In FIG. 55 is shown a basic block diagram of a further other embodiment of the semiconductor integrated circuit device, according to the present invention. The substrate bias which the substrate bias generator SBG1 produces is supplied through nodes N1 and N3 to the current limit circuits CLC11 and CLC12, and through nodes N2 and N4 to the substrate of the main circuit LSI1. The current limiting circuits CLC1 and CLC2 change the limit amounts on current depending upon a selection signal N11 of a selector SEL1. Due to this, when conducting the control on the substrate of the main circuit LSI1, it is possible to conduct the most suitable current limiting depending upon the fluctuation of manufacturing process and the circuit scale, without making design change. Also, even in a case where the temperature and/or the power supply voltage change during the operation, it is possible to conduct the current limiting, being the most suitable every time when it/they occurs.

Figure 56:
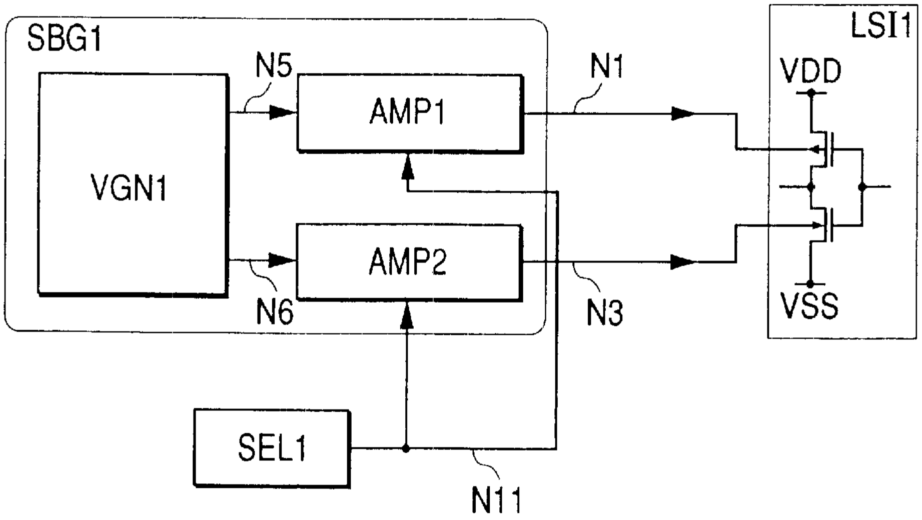
FIG. 56 is also a basic block diagram for showing a further other embodiment of the semiconductor integrated circuit, according to the present invention.

In FIG. 56 is shown a basic block diagram of a further other embodiment of the semiconductor integrated circuit device, according to the present invention. A substrate bias generator SBGl is constructed with a voltage supply VGN1 for substrate bias and current amplifiers AMP1 and AMP2. The current amplifiers AMP1 and AMP2 are controlled at the output impedance thereof, depending on the select signal N11 of a selector SEL1, thereby conducting the most suitable current control. With such the control of the output impedance, when performing the substrate control of the main circuit LSI1, it is possible to achieve the current limiting, being most suitable depending upon the fluctuation in the manufacturing process and the circuit scale, without change of the design thereof.

Figure 57:
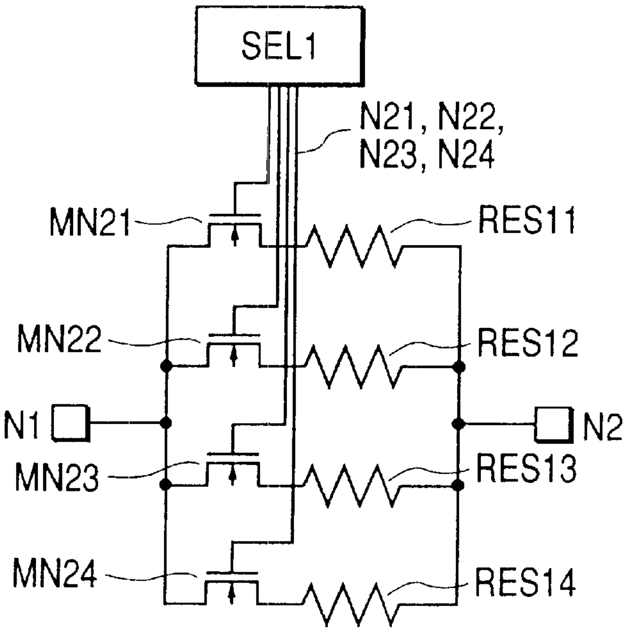
FIG. 57 is a circuit diagram for showing an embodiment of the current limiting circuit shown in the FIG. 55.

In FIG. 57 is shown a circuit diagram of an embodiment of the current limiting circuit corresponding to the embodiment shown in the FIG. 55 mentioned above. The current limiting circuit of this embodiment is constructed with a plural number of resistors RES11, RES12, RES13 and RES14, being connected in parallel. Those resistors are selected by N-channel type MOS transistors MN21, MN 22, MN23 and MN24 for use of switching thereof, which are connected to them in series, respectively. A selector SEL1 selects one (1) switch among the N-channel type MOS transistors for use of switching, and the resistor disposed therein operates as the current limiting circuit. The resistors RES11, RES12, RES13 and RES14 have resistance values being different to one another, therefore it enables to change the limiting amount of current responding to the signal of the selector SELL. In the place of this structure, it may also be possible that one or a plural number of the MOS transistors for use of switching is/are turned into ON state at the same time, so as to cause a change in the combined resistance value thereof, thereby changing the limiting amount of current.

Figure 58:
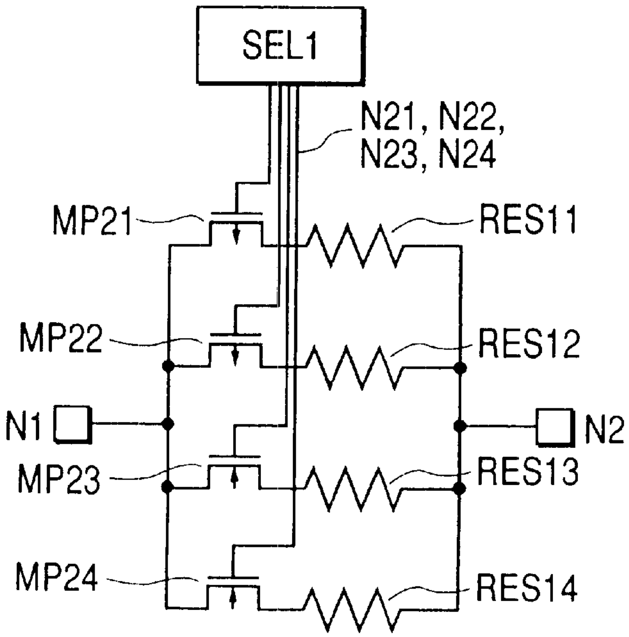
FIG. 58 is a circuit diagram for showing another embodiment of the current limiting circuit shown in the FIG. 55.

In FIG. 58 is shown a circuit diagram of other embodiment of the current limiting circuit corresponding to the embodiment shown in the FIG. 55 mentioned above. The current limiting circuit of this embodiment is constructed with a plural number of resistors RES11, RES12, RES13 and RES14, being connected in parallel. Those resistors are selected by P-channel type MOS transistors MP21, MP22, MP23 and MP24 for use of switching thereof, which are connected to them in series, respectively. A selector SEL1 selects one (1) switch among the P-channel type MOS transistors for use of switching, and the resistor disposed therein operates as the current limiting circuit. The resistors RES11, RES12, RES13 and RES14 have resistance values being different to one another, therefore it enables to change the limiting amount of current responding to the signal of the selector SEL1. In the place of this structure, it may also be possible that one or a plural number of the MOS transistors for use of switching is/are turned into ON state at the same time, so as to cause a change in the combined resistance value thereof, thereby changing the limiting amount of current.

Figure 59:
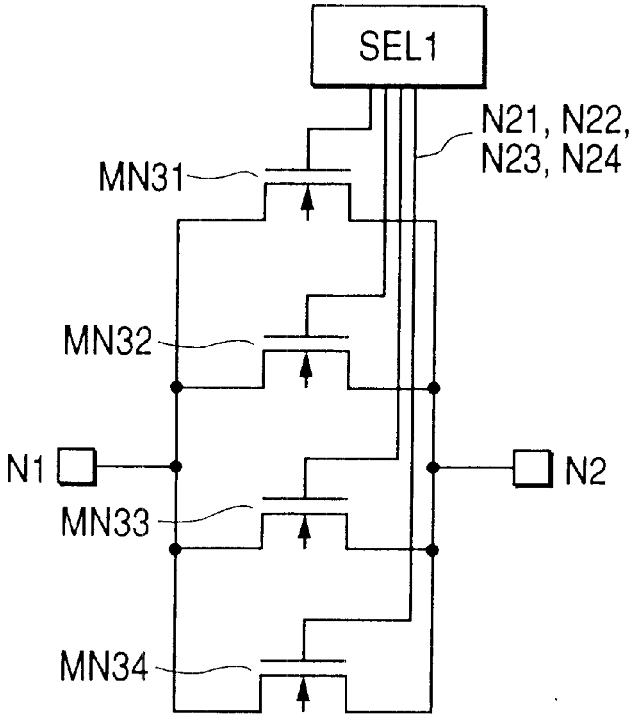
FIG. 59 is a circuit diagram for showing other embodiment of the current limiting circuit shown in the FIG. 55.

In FIG. 59 is shown a circuit diagram of a further other embodiment of the current limiting circuit corresponding to the embodiment shown in the FIG. 55 mentioned above. The current limiting circuit of this embodiment is constructed with a plural number of N-channel type MOS transistors MN31, MN 32, MN33 and MN 34, connected in parallel. Each of those N-channel type MOS transistors has sizes being different to one another, and the current limiting can be performed by the impedance owned by at least one of the transistors which is/are selected by a selector SELL. It may also be possible to control the limiting amount of current through changing the number of the transistors to be selected by the selector SEL1, even if those transistors are same to one another in the sizes thereof.

Figure 60:
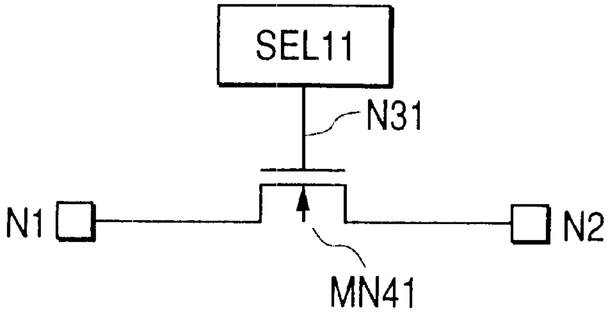
FIG. 60 is a circuit diagram for showing a further other embodiment of the current limiting circuit shown in the FIG. 55.

In FIG. 60 is shown a circuit diagram of a further other embodiment of the current limiting circuit corresponding to the embodiment shown in the FIG. 55 mentioned above. The current limiting circuit of this embodiment is constructed with one N-channel type MOS transistor MN41. Since the impedance of the N-channel type MOS transistor MN41 is changed depending upon the voltage value of an analog voltage N31 for use of control, which is outputted by the selector SEL1, it is possible to change the limit amount of current by means of the selector SEL1.

Figure 61:
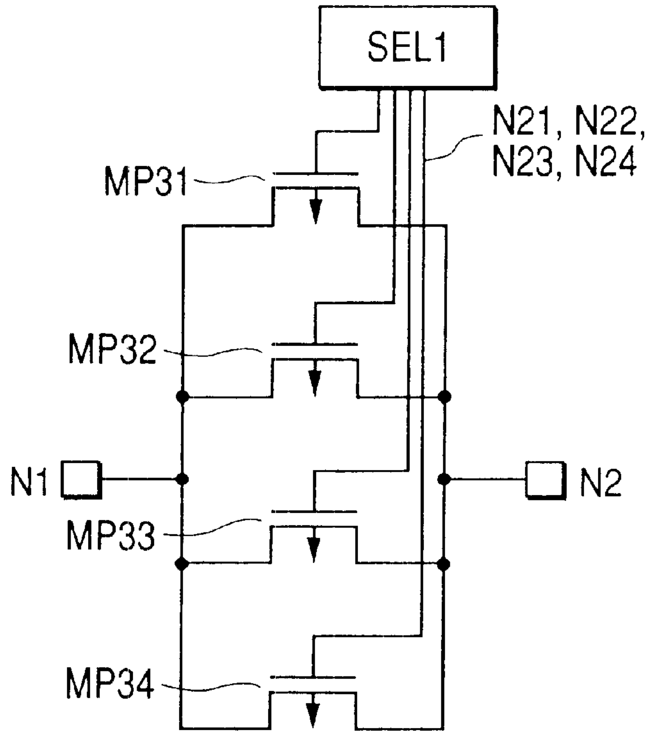
FIG. 61 is also a circuit diagram for showing a further other embodiment of the current limiting circuit shown in the FIG. 55.

In FIG. 61 is shown a circuit diagram of a further other embodiment of the current limiting circuit corresponding to the embodiment shown in the FIG. 55 mentioned above. The current limiting circuit of this embodiment is constructed with a plural number of P-channel typeMOS transistors MP31, MP32, MP33 and MP34, connected in parallel. Each of the P-channel type MOS transistors has sizes being different to one another, and the current limit can be performed by the impedance owned by at least one of the transistors which is/are selected by the selector SEL1. It may also be possible to control the limit amount of current, by changing the number of the transistors to be selected by the selector SEL1, even if those transistors are same to one another in the sizes thereof.

Figure 62:
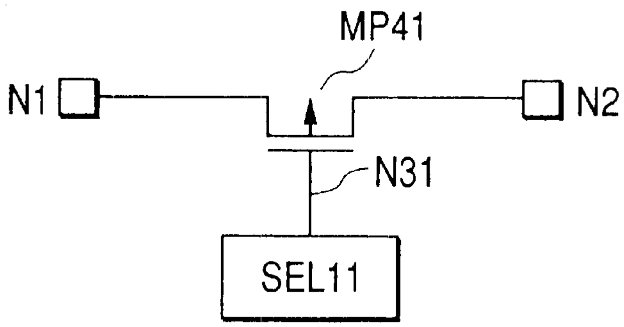
FIG. 62 is also a circuit diagram for showing a further other embodiment of the current limiting circuit shown in the FIG. 55.

In FIG. 62 is shown a circuit diagram of a further other embodiment of the current limiting circuit corresponding to the embodiment shown in the FIG. 55 mentioned above. The current limiting circuit of this embodiment is constructed with one P-channel type MOS transistor MP41. Since the impedance of the P-channel type MOS transistor MP41 is changed depending upon the voltage value of an analog voltage N31 for use of control, which is outputted by the selector SEL11, it is possible to change the limit amount of current by means of the selector SEL11.

Figure 63:
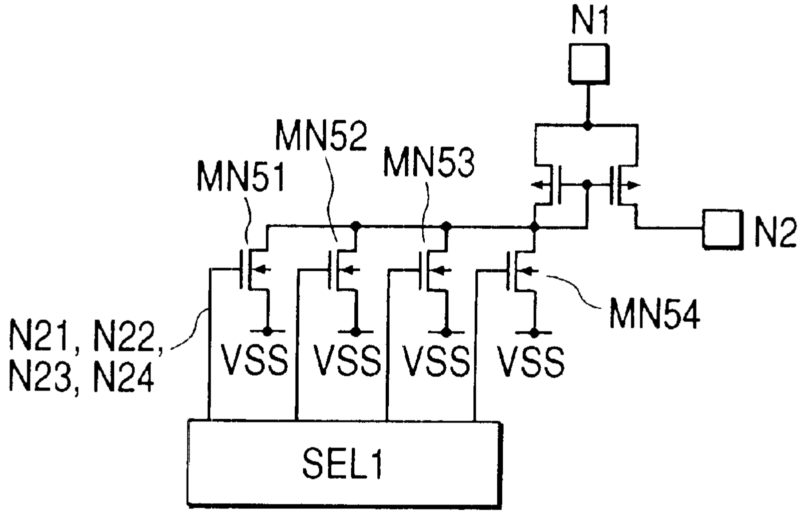
FIG. 63 is also a circuit diagram for showing a further other embodiment of the current limiting circuit shown in the FIG. 55.

In FIG. 63 is shown a circuit diagram of a further other embodiment of the current limiting circuit corresponding to the embodiment shown in the FIG. 55 mentioned above. The current limiting circuit of this embodiment uses the current-mirror circuit therein. N-channel type MOS transistors forming the current to be supplied to the current-mirror circuit are disposed in parallel, such as NMOS transistors MN51, MN52, MN53 and MN 54, so that each of the N-channel type MOS transistors is set to be different in the sizes thereof, thereby enabling to operate the current-mirror circuit mentioned above, so as to adjust the limiting amount on current depending upon the current flowing through the MOS transistor selected by means of the selector SELL. Although the each of the transistors mentioned above is different in the sizes or same to one another, it may be possible to adjust the limiting amount on current in the same manner, by changing the number of the transistors which the selector SEL1 selects.

Figure 64:
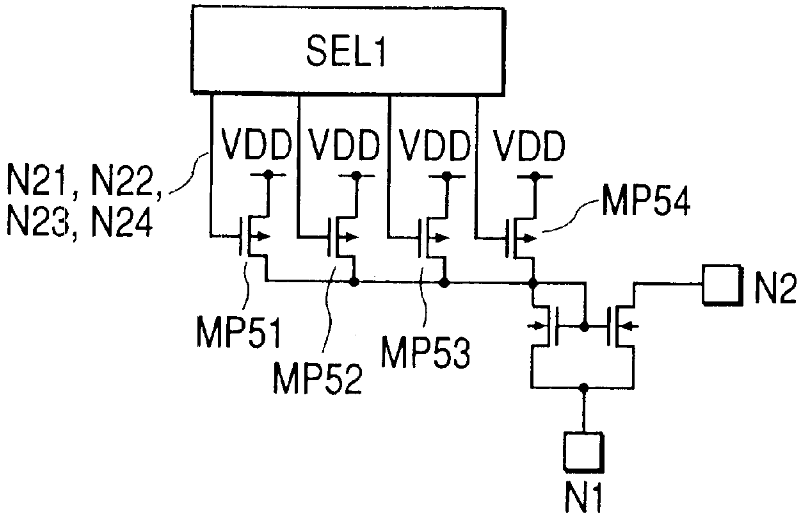
FIG. 64 is also a circuit diagram for showing a further other embodiment of the current limiting circuit shown in the FIG. 55.

In FIG. 64 is shown a circuit diagram of a further other embodiment of the current limiting circuit corresponding to the embodiment shown in the FIG. 55 mentioned above. The current limiting circuit of this embodiment also uses the current-mirror circuit therein. P-channel type MOS transistors forming the currents to be supplied to the current-mirror circuit are disposed in parallel, such as transistors MP51, MP52, MP53 and MO 54, so that they are constructed to be different in the sizes thereof, therefore it is possible to adjust the limiting amount of current depending upon the MOS transistor selected by means of the selector SEL1. Although the each of the transistors mentioned above is different in the sizes or same to one another, it may be possible to adjust the limiting amount o f current in the same manner, by changing the number of the transistor(s) which the selector SEL1 selects.

Figure 65:
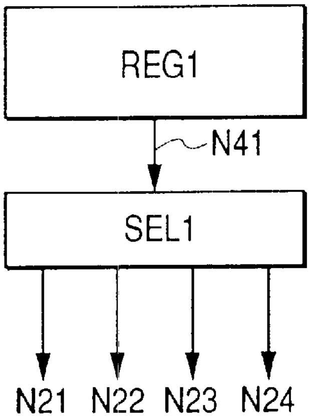
FIG. 65 is a block diagram for showing an embodiment of a selector shown in the FIG. 57, etc.

In FIG. 65 is shown a block diagram of an embodiment of the selector which is used in the embodiments shown in the FIG. 57, etc., mentioned above. Inside the main circuit LSI1 is provided a control current selecting register REG1. This register REG1 produces a register signal N41 upon an instruction, and the selector SEL1 decodes the signal, thereby to form the above-mentioned selection signals N21, N22, N23 and N24.

Figure 66:
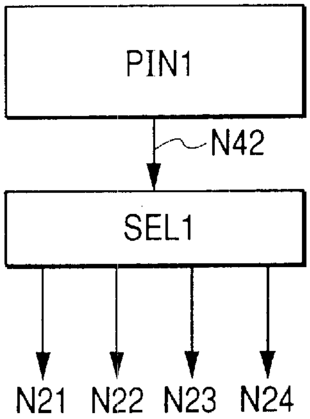
FIG. 66 is a block diagram for showing another embodiment of the selector shown in the FIG. 57, etc.

In FIG. 66 is shown a block diagram of other embodiment of the selector mentioned above. At a portion of an input/output terminal of the main circuit LSI1 is provided a control current selecting pin PIN1. With this control current selecting pin PIN1, a selection signal N42 is generated by supplying a high level signal corresponding to the power supply voltage and a low level signal corresponding to the ground potential of the circuit to the selection pin, and the selector SEL1 decodes the signal thereby to form the selection signals N21, N22, N23 and N24.

Figure 67:
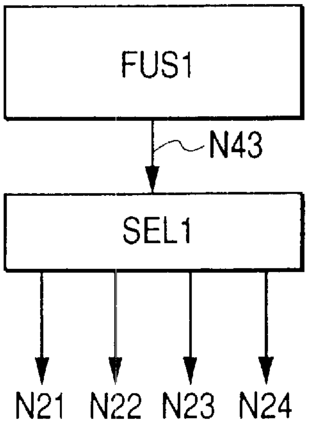
FIG. 67 is a block diagram for showing other embodiment of the selector shown in the FIG. 57, etc.

In FIG. 67 is shown a block diagram of a further other embodiment of the selector mentioned above. Within an inside of the main circuit LSI1 is provided a control current selecting fuse FUS1. This fuse FUS1 produces a selection signal N43 responding to selective cut-down thereof, by a laser beam, at a time point when the circuit is completed on the semiconductor wafer, and the selector SEL1 decodes the signal thereby to form the selection signal s N21, N22, N23 and N24.

Figure 68:
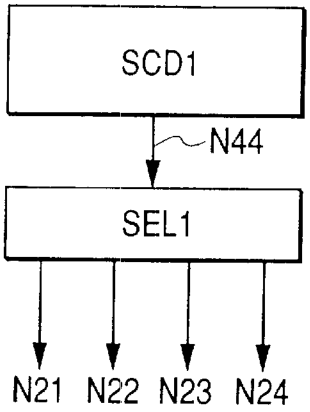
FIG. 68 is a block diagram for showing a further other embodiment of the selector shown in the FIG. 57, etc.

In FIG. 68 is shown a block diagram of a further other embodiment of the selector mentioned above. Within an inside of the main circuit LSI1 is provided a substrate current detector SCD1. This substrate current detector SCD1 measures the substrate current of the main circuit LSI1 to produce a selection signal signal, thereby to form the selection signals N21, N22, N23 and N24.

Figure 69:
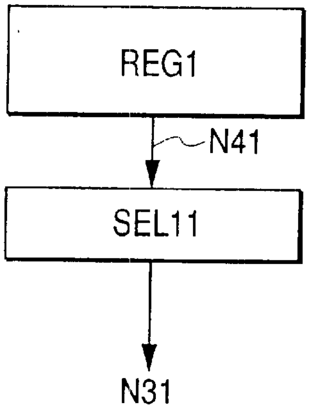
FIG. 69 is a block diagram for showing another embodiment of a selector shown in the FIG. 62, etc.

In FIG. 69 is shown a block diagram of an embodiment of the selector used in the embodiment shown in the FIG. 62, etc., mentioned above. Within an inside of the main circuit LSI1 is provided a control current select register REG1. This register REG1 produces a register signal N41 upon an instruction, and the selector SEL1 decodes the signal (or digital/analog conversion) thereby to form the selection signal N31 mentioned above.

Figure 70:
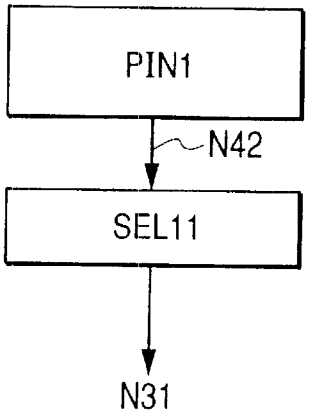
FIG. 70 is a block diagram for showing other embodiment of a selector shown in the FIG. 62, etc.

In FIG. 70 is shown a block diagram of other embodiment of the selector mentioned above. At a portion of an input/output terminal of the main circuit LSI1 is provided a control current selecting pin PIN1. With this control current selecting pin PIN1, a selection signal N42 is generated by supplying a high level signal corresponding to the power supply voltage and a low level signal corresponding to the ground potential of the circuit to the selection pin, and the selector SEL1 decodes the signal (or digital/analog conversion), thereby to form the selection signal N31 mentioned above.

Figure 71:
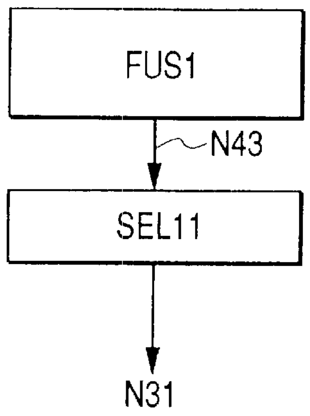
FIG. 71 is a block diagram for showing a further other embodiment of a selector shown in the FIG. 62, etc.

In FIG. 71 is shown a block diagram of a further other embodiment of the selector mentioned above. Within an inside of the main circuit LSI1 is provided a control current selecting fuse FUS1. This fuse FUS1 produces a selection signal N43 responding to selective cut-down thereof, by a laser beam, at a time point when the circuit is completed on the semiconductor wafer, and the selector SELL decodes the signal (or digital/analog conversion), thereby to form the selection signal N31 mentioned above.

Figure 72:
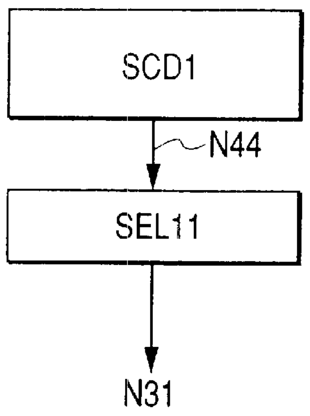
FIG. 72 is also a block diagram for showing a further other embodiment of a selector shown in the FIG. 62, etc.

In FIG. 72 is shown a block diagram of a further other embodiment of the selector mentioned above. Within an inside of the main circuit LSI1 is provided a substrate current detector SCD1. This substrate current detector SCD1 measures the substrate current of the main circuit LSI1, so as to produce a selection signal N44 depending upon the current, and the selector SEL1 decodes the signal (or digital/analog conversion), thereby to form the selection signal N31 mentioned above.

Figure 73:
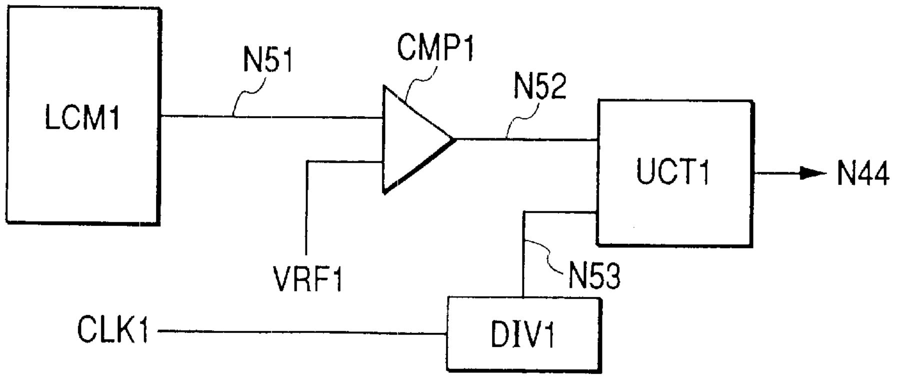
FIG. 73 is a block diagram for showing an embodiment of a substrate current detection circuit shown in the FIG. 68, etc.

In FIG. 73 is shown a block diagram of an embodiment of the substrate current detector mentioned above. This substrate current detector is constructed with a leak current measuring circuit LCM1, a comparator CMP1, an UP counter UCT1, and a frequency divider DIV1. The leak current measuring circuit LCM1 generates an output voltage corresponding to the measured leak current from N51, and the comparator CMP1 compares the voltage of N51 with a reference potential VRF1. During the time when the voltage N51 corresponding to the leak current is lower than the reference potential VRF1, an UP signal N52 is outputted from the comparator CMP1.

The frequency divider DIV1 divides the frequency of the clock signal CLK1, so as to reduce it down to an appropriate frequency, thereby applying a clock N53 for use of counting to the UP counter UCT1. Upon receipt of the UP signal N52, the UP counter UCT1 counts up the output signal N44 according to the clock N53 for use of counting. When the current measured by the leak current measuring circuit LCM1 comes to be more than a predetermined value, and when the output voltage N51 comes to be higher than the reference potential VRFl, the comparator CMP1 cease to output the UP signal, and the UP counter UCT1 stops the count-up of the output signal.

When the output signal N44 of the UP counter UCT1 is counted up, the output of the selector SEL1 shown in the FIG. 68 goes up, and then the current amount which can be supplied by the current limiting circuit is increased up, as shown in the FIG. 57, for example. In this manner, when the leak current measured by the leak current measuring circuit LCM1 rises up to be more than the predetermined value, the output of the UP counter UCT1 is fixed, therefore the current limiting circuit being the most suitable one is selected, automatically.

Figure 74:
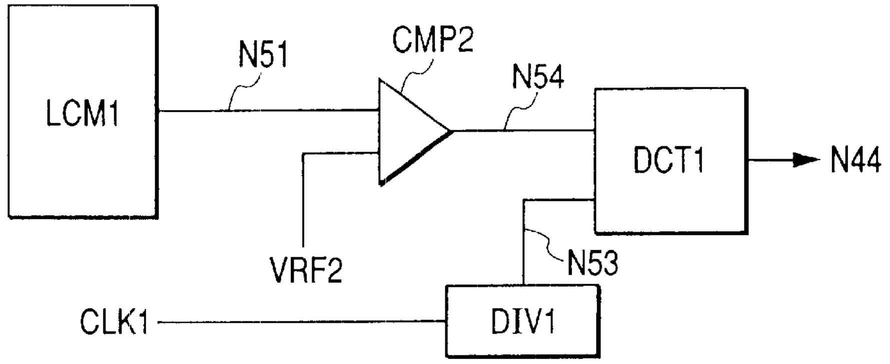
FIG. 74 is a block diagram for showing another embodiment of the substrate current detection circuit shown in the FIG. 68, etc.

In FIG. 74 is shown a block diagram of other embodiment of the substrate current detector mentioned above. The substrate current detector of this embodiment is constructed with a leak current measuring circuit LCM1, a comparator CMP2, a Down counter DCT1 and a frequency divider DIV1. The leak current measuring circuit LCM1 generates an output voltage depending upon the measured leak current from N51, and the comparator CMP2 compares the voltage of N51 with a reference potential VRF2. During the time when the voltage N51 corresponding to the leak current is higher than the reference potential VRF2, a DOWN signal N54 is outputted from the comparator CMP2.

The frequency divider. DIV1 divides the clock signal CLK1, so as to reduce it down to an appropriate frequency, thereby applying a clock N53 for use of counting to the DOWN counter DCT1. Upon receipt of a DOWN signal N54, the DOWN counter DCT1 counts down the output signal N44 according to the clock N53 for use of counting. When the current measured by the leak current measuring circuit LCM1 come to be more than a predetermined value, and when the output voltage N51 comes to be lower than the reference potential VRF2, the comparator CMP2 ceases to output the DOWN signal, and the DOWN counter DCT1 stops the count-down of the output signal.

When the output signal N44 of the DOWN counter DCT1 is counted down, the output of the selector SELL shown in the FIG. 68 goes down, and then the current amount which can be supplied by the current limiting circuit is reduced, as was shown in the FIG. 57, for example. In this manner, when the leak current measured by the leak current measuring circuit LCM1 decreases down to be less than the predetermined value, the output of the DOWN counter DCT1 is fixed, therefore the current limiting circuit being the most suitable one is selected, automatically.

Figure 75:
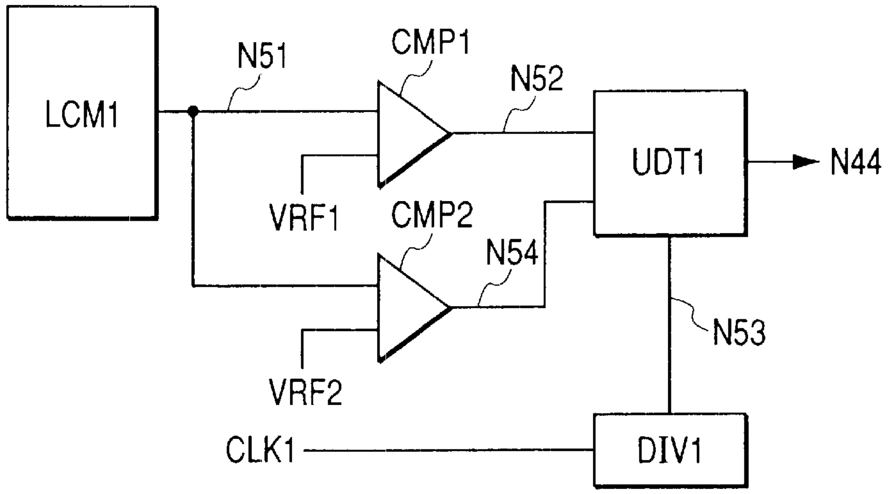
FIG. 75 is a block diagram for showing other embodiment of the substrate current detection circuit shown in the FIG. 68, etc.

In FIG. 75 is shown a block diagram of a further other embodiment of the substrate current detector mentioned above. The substrate current detector of this embodiment is constructed with a leak current measuring circuit LCM1, comparators CMP1 and CMP2, an UP/DOWN counter UDT1 and a frequency divider DIV1. The leak current measuring circuit LCM1 generates an output voltage depending upon the measured leak current from N51, and the comparators CMP1 and CMP2 compare the voltage of N51 with the reference potentials VRF1 and VRF2.

During when the voltage N51 depending upon the leak current is lower than the reference potential VRF1, an UP signal N52 is outputted from the comparator CMP1. During when the voltage N51 depending upon the leak current is higher than the reference potential VRF2, a DOWN signal N54 is outputted from the comparator CMP2. The frequency divider DIV1 divides the clock signal CLK1, so as to reduce it down to an appropriate frequency, thereby applying a clock N53 for use of counting to the UP/DOWN counter UDT1.

Upon receipt of the UP signal N52, the UP/DOWN counter UDT1 counts up the output signal N44 according to the clock N53 for use of counting, while upon receipt of the DOWN signal N54, it counts up the output signal N44 according to the clock N53 for use of counting. When the current measured by the leak current measuring circuit LCM1 come to be in-between of two (2) predetermined values, and when the output voltage N51 be higher than the reference potential VRF1 but be lower than the VRF2, the comparators CMP1 and CMP2 cease to output the UP and DOWN signals, and the UP/DOWN counter UDT1 stops changing of the output signal.

When the output signal N44 of the UP/DOWN counter UDT1 is counted up, the output of the selector SEL1 shown in the FIG. 68 goes up, and then the current amount which can be supplied by the current limiting circuit is increased up, as shown in the FIG. 57, for example. Also, when the output signal N44 is counted down, then the current amount which can be supplied by the current limiting circuit is reduced. In this manner, when the leak current measured by the leak current measuring circuit LCM1 comes to be the predetermined value, the output of the UP/DOWN counter UDT1 is fixed, thereby the current limiting circuit being the most suitable one is selected, automatically.

Figure 76:
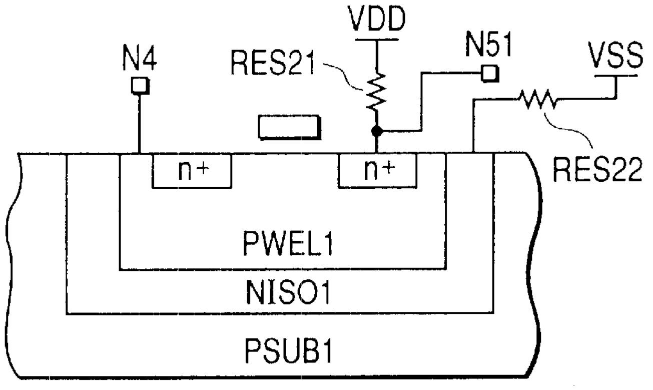
FIG. 76 is a sectional diagram for showing an embodiment of a leak current measuring circuit shown in the FIG. 73, etc.

In FIG. 76 is shown a sectional diagram of a further other embodiment of the leak current measuring circuit mentioned above. The leak current, occurring when applying the forward bias to the substrate of N-channel type MOS transistor, flows through a N-type diffusion layer n+, a P-type well PWEL1 and a N-type substrate isolation layer NISO1, as shown in the FIG. 76. Then, connecting the resistors RES21 and RES22 as in the figure, the voltage depending upon the leak current can be observed, when measuring the output voltage from the terminal N51. Depending upon the magnitude, i.e., to be large or small of this voltage, it can be determined whether the leak current is increased up or reduced down.

Figure 77:
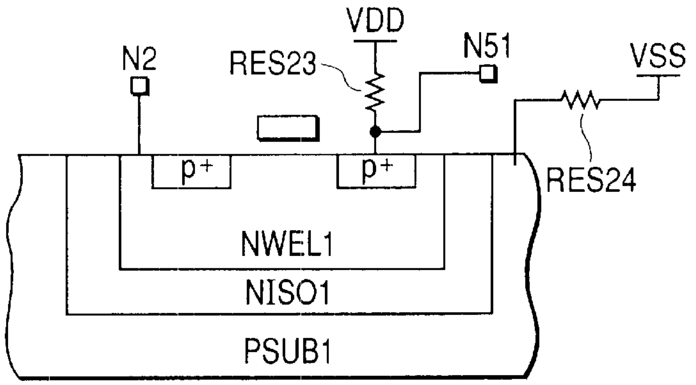
FIG. 77 is a sectional diagram for showing another embodiment of the leak current measuring circuit shown in the FIG. 73, etc.

In FIG. 77 is shown a sectional diagram of the other embodiment of the leak current measuring circuit mentioned above. The leak current, occurring when applying the forward bias to the substrate of P-channel type MOS transistor, flows through a P-type diffusion layer p+, a N-type well NWEL1, a N-type substrate isolation layer NISO1 and P-type substrate PSUB1, as shown in the FIG. 77. Then, connecting the resistors RES23 and RES24 as in the figure, the voltage depending upon the leak current can be observed, when measuring the output voltage from the terminal N51. Depending upon the magnitude, i.e., to be large or small of this voltage, it can be determined whether the leak current is increased up or reduced down.

Figure 78:
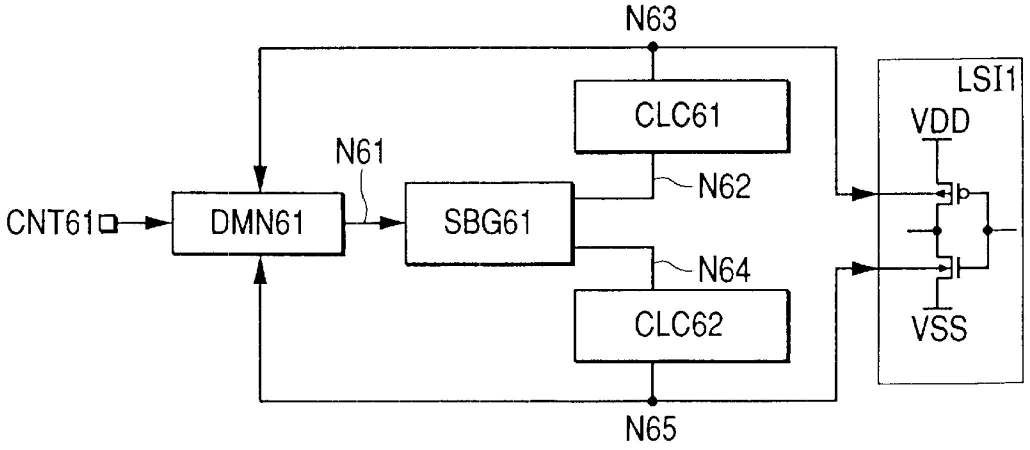
FIG. 78 is a basic block diagram for showing a further other embodiment of the semiconductor integrated circuit, according to the present invention.

In FIG. 78 is shown a basic block diagram of a further other embodiment of the semiconductor integrated circuit device, according to the present invention. As was mentioned previously, in a system (i.e., the semiconductor integrated circuit device) conducting the substrate bias control depending upon delay of the speed monitor DMN61, by disposing current limiting circuits CLC61 and CLC62 at an output of the substrate bias generator SBG61, it is possible to prevent the wasteful leak current from increasing up within the transistor substrate of the main circuit, thereby to improve a reliability in operations of the circuit. As those circuit, the limiting circuits CLC61 and CLC62 may be used for those ones shown in FIGS. 47 to 51 and FIGS. 57 to 72.

Namely, in a case of the power limiting circuit shown in the FIG. 1, etc., mentioned above, the output voltage is controlled so as to prevent the power of the circuit from increasing up too much, on the other hand according to the method of the present embodiment, the wasteful leak current flowing within the MOS transistor substrate is suppressed by limiting the output current itself which is given from the substrate bias circuit to the substrate, thereby preventing the circuit from occurring the erroneous operations therein, and the latch-up phenomenon is made reluctant to occur, so as to prevent the transistors from the break-down thereof, thereby enabling to improve the reliability in operations of the circuit.

From another point of view, the power limiting circuit mentioned above provided with the monitor circuit (i.e., a current measuring circuit) measures the leak current therein, so as to control the substrate bias circuit. The elements formed on one (1) semiconductor chip, though having a similar characteristics due to the fact that they are formed at the same time, do not come to be totally same to, but have the process fluctuation to one another. Accordingly, between the leak current flowing through the main circuit and the current flowing through the above-mentioned current measuring circuit, there is often a case where they do not coincide with, at high accuracy thereof. Due to this, in the current limiting circuit mentioned above, there is a necessity of providing a certain margin assuming the worst case in the process fluctuation. On the contrary to this, according to the present embodiment, since the power limiting operation is conducted in response to the leak current flowing through the main circuit, it is high in the reliability, and is further able to widen the substrate bias control range.

Figure 79:
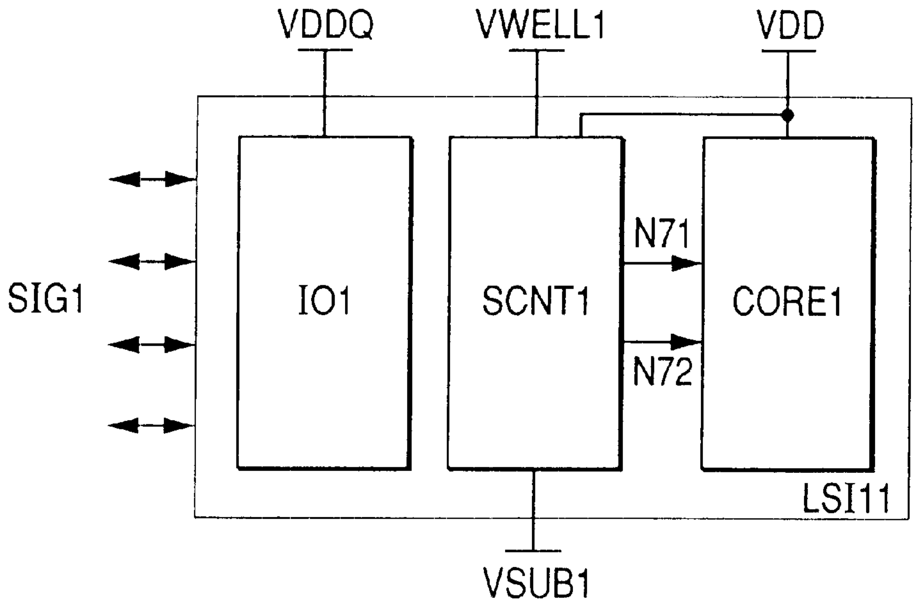
FIG. 79 is a block diagram for showing a further other embodiment of the semiconductor integrated circuit, according to the present invention.

In FIG. 79 is shown a clock diagram of an embodiment of the semiconductor integrated circuit device, according to the present invention. The integrated circuit (i.e., the main circuit) LSI11 is constructed with an input/output (I/O) module IO1, a processor core CORE1, and a substrate control circuit SCNT1. Transmission of signals between the main circuit and an outside is performed by the I/O module IO1 with using an input/output signal SIG1. For the I/O module IO1 is used a voltage supply VDDQ of 3.3 V, for example. For the processor core CORE1 is used the voltage supply VDD of 1.5 V, for example.

In the device, where for the semiconductor region in which the MOS transistors are formed or the substrate are set the bias voltage in the region from a negative voltage to a positive voltage, as was shown in the FIG. 1 mentioned above, the power from an outside is also supplied to the substrate control circuit SCNT1, thereby being applied with VWELL1 of 3.3 V and VSUB1 of −1.5 V, for example, as the power supply for use in the substrate control. Also, the voltage VDD for use in the processor core CORE1 is also supplied therefrom. With using those voltage sources, the substrate biases N71 and N72 for use in the control are generated to be supplied to the processor core CORE1, and they control the circuit speed of the core.

Figure 80:
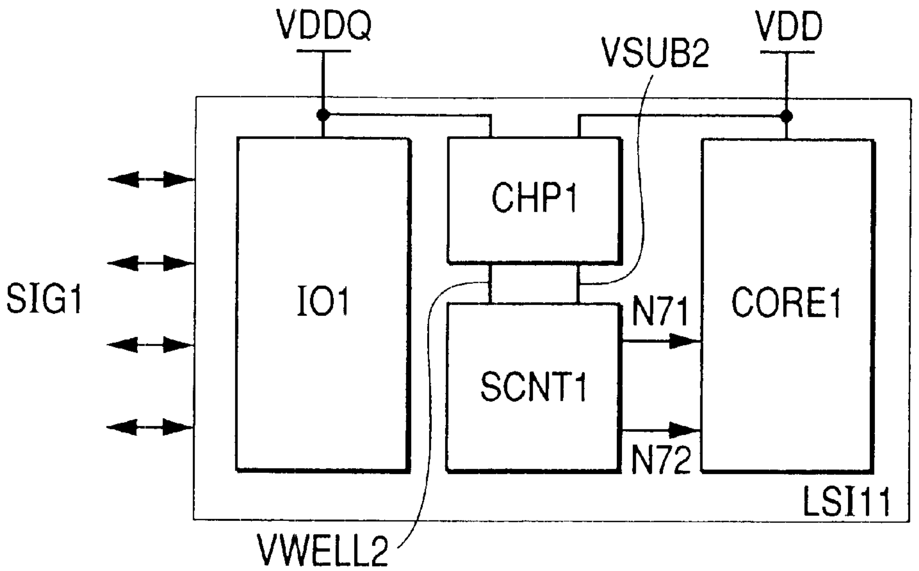
FIG. 80 is also a block diagram for showing a further other embodiment of the semiconductor integrated circuit, according to the present invention.

In FIG. 80 is shown a block diagram of a further other embodiment of the semiconductor integrated circuit device, according to the present invention. The integrated circuit (i.e., the main circuit) LSI11 of this embodiment is constructed with an input/output (I/O) module IO1, a processor core CORE1, a substrate control circuit SCNT1 and a charge pump circuit CHP1. Transmission of signals between the main circuit LSI11 and an outside is conducted by the I/O module IO1 with using an input/output signal SIG1. For the I/O module IO1 is used a voltage supply VDDQ of 3.3 V, for example. For the processor core CORE1 is used the voltage supply VDD of 1.5 V, for example.

In the device, where for the semiconductor region in which the MOS transistors are formed or the substrate are set the bias voltages in the region from a negative voltage to a positive voltage, as was shown in the FIG. 1 mentioned above, the power supplies VDDQ and VDD are given to the charge pump circuit CHP1, and the voltages VWELL2 and VSUB2 for use in the substrate control are formed inside the main circuit LSI11 with using those voltages. To the substrate control circuit SCNT1 are given the potentials, such as VWELL2 of 3.3 V and VSUB2 of −1.5 V, for example, which the charge pump circuit CHP1 forms therein. With using those voltage sources, the substrate biases N71 and N72 for use in the control are generated to be supplied to the processor core CORE1, and they control the circuit speed of the core.

Figure 81:
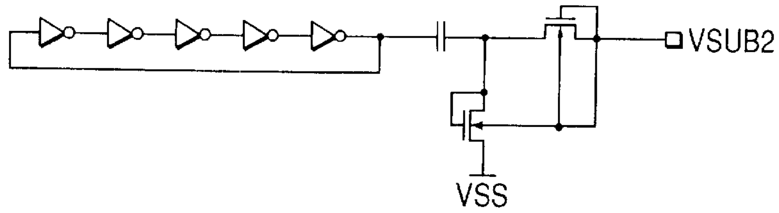
FIG. 81 is a circuit diagram for showing an embodiment of a charge pump circuit shown in the FIG. 80.

In FIG. 81 is shown a circuit diagram of an embodiment of the charge pump circuit mentioned above. With using a ring oscillator, a capacity and two (2) NMOS transistors, being connected in the form of a diode, for example, as shown in the figure, it is possible to produce VSUB2 of −1.5 V, as the bias power voltage for use of the NMOS transistor substrate.

Figure 82:
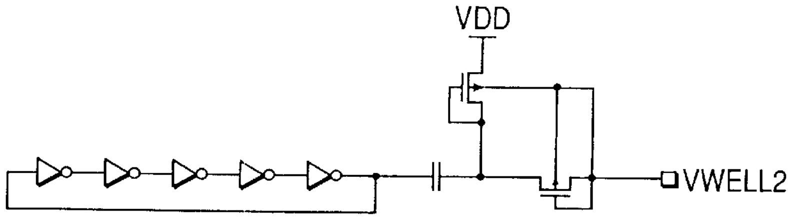
FIG. 82 is a circuit diagram for showing another embodiment of the charge pump circuit shown in the FIG. 80.

In FIG. 82 is shown a circuit diagram of an embodiment of the charge pump circuit mentioned above. With using a ring oscillator, a capacity and two (2) PMOS transistors, being connected in the form of a diode, for example, as shown in the figure, it is also possible to produce VWELL2 of 3.3 V, as the voltage supply for use as the bias voltage for the MOS transistor substrate, being boosted up higher than the power supply voltage VDD in voltage.

Figure 83:
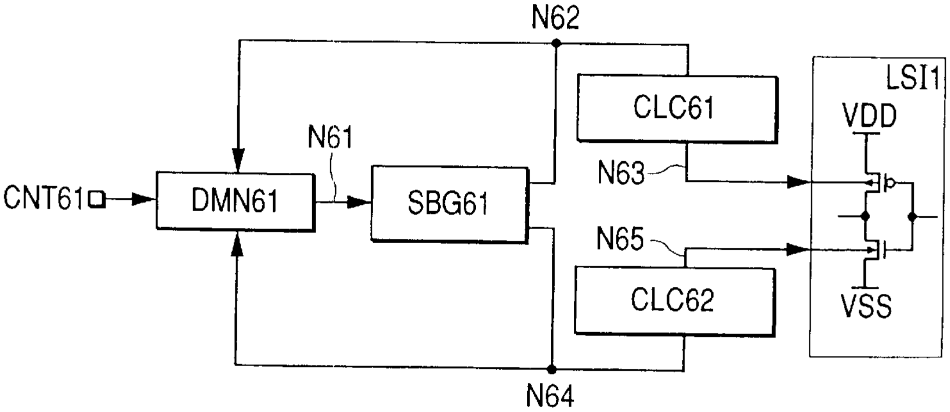
FIG. 83 is a basic block diagram for showing a further other embodiment of the semiconductor integrated circuit, according to the present invention.

In FIG. 83 is shown a basic block diagram of a further other embodiment, according to the present invention. This embodiment is a variation of that shown in the FIG. 78 mentioned above, wherein, in the semiconductor integrated circuit device for performing the substrate bias control depending upon the delay detected by a speed monitor DMN61 as shown in the embodiment of FIG. 1 mentioned above, the wasteful leak current is prevented from being increased up within the transistor substrate of the main circuit LSI1, by disposing the current limiting circuits CLC 61 and CLC62 on an output of the substrate bias generator SBG61, thereby improving a reliability in operations of the circuit.

To the substrate of the speed monitor DMN61 are connected outputs N62 and N64 of the substrate bias generator SBG61, directly, differing from the embodiment shown in the FIG. 78 mentioned above, but no control is performed on the current. The number of the MOS transistors constructing the speed monitor DMN61 is very small comparing to that of the main circuit LSI1, then the increase of the leak current does not cause a matter. By the speed monitor DMN1 is performed no current control, but the substrate bias is set at the most suitable value thereby while the current control is performed by the main circuit LSI1, thereby it is possible to prevent from the erroneous operations, etc.

Though the power limiting circuit, such as that shown in the FIG. 1 mentioned above, measures the leak current at a certain position and gives a limit, so that the leak current will not exceed the preset value, in that case, it sometimes fails to achieve the role thereof, such as a power limiter, when there is a discrepancy between the leak current at the position where the leak current is measured and that of the main circuit LSI1 as a whole on the contrary to this, with such the constructions as shown in the FIGS. 78 and 83 mentioned above, it is possible to limit the current which the LSI1 consumes actually.

Figure 84:
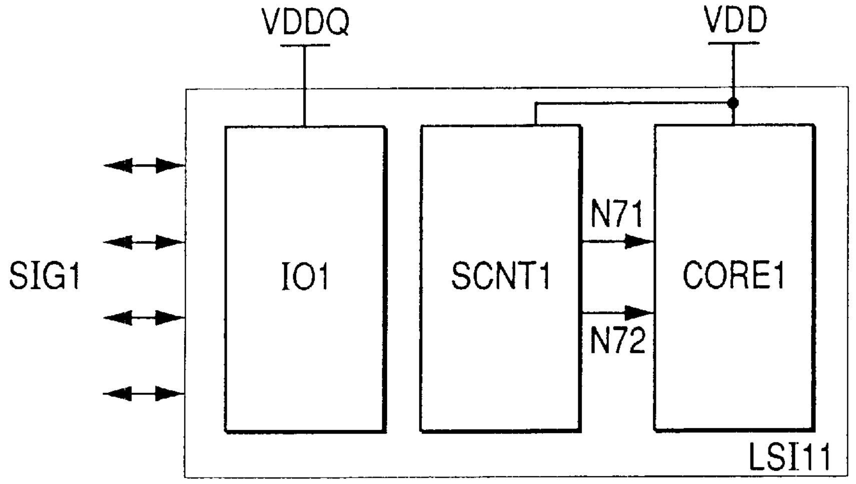
FIG. 84 is a block diagram for showing a further other embodiment of the semiconductor integrated circuit, according to the present invention.

In FIG. 84 is shown a block diagram of an embodiment of the semiconductor integrated circuit device, according to the present invention. An integrated circuit (i.e., the main circuit) LSI11 is constructed with an input/output module IO1, a processor core CORE1 and a substrate control circuit SCNT1. Transmission of signals between the main circuit LSI11 and an outside is conducted by the I/O module IO1, with using an input/output signal SIG1. For the I/O module IO1 is used a voltage supply VDDQ of 3.3 V, for example. For the processor core CORE1 is used the voltage source VDD of 1.5 V, for example.

In the device, where for the semiconductor region in which the MOS transistors are formed or the substrate is supplied only the bias voltage of positive voltage, as was shown in the FIG. 45 mentioned above, since the substrate biases which the substrate control circuit SCNT1 produces are only the forward bias, it is enough to use VDD as the power supply. Namely, there is no such the necessity of using the other power supply as shown in the FIG. 79 mentioned above, nor necessity of having a charge pump circuit as shown in the FIG. 80, thereby bringing the designing thereof to be easy, as well as, reducing the electric power thereof.

Further, in the case where the input/output module IO1 and the processor core CORE1 operate with the power supply of the same potential, there is an advantage that it can be supplied only with one (1) kind of power supply. The substrate biases N71 and N72 for use of the control, which the substrate control circuit SCNT1 outputs, can be produced only by reducing the power supply VDD. This is also true to the case where the operating speed of the main circuit LSI11 is improved by applying the forward bias while fixing the bias value thereof, or where the fluctuation in the characteristics is compensated by changing the substrate bias within the range of the forward bias.

Figure 85:
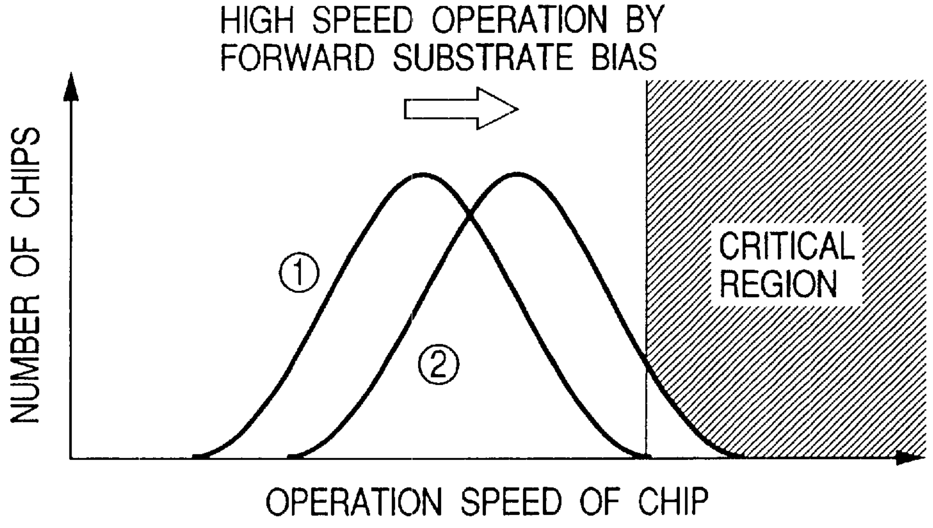
FIG. 85 is a graph for showing operating speed distribution of the semiconductor integrated circuit, for the purpose of explaining the present invention.

In FIG. 85 is shown a distribution of speeds of the semiconductor integrated circuit devices, for explanation of the present invention. The operating speeds of the integrated circuits have the distribution due to the fluctuation in the manufacturing processes. For example, when the gate insulation film, etc., of the MOS transistor is formed to be thick, so as to make the threshold voltage thereof large, the speed of the chip comes to be low as shown by the characteristic curve ①. On the contrary to this, by applying the forward bias thereto, it is shifted to the distribution curve ② as a whole, i.e., it is possible to make the operating speed of the integrated circuit fast, as a whole.

In this instance, the right-hand side edge of the distribution curve ① is a limit of the operating speed due to the electric power in the operation. When applying the forward bias thereto, the right-hand edge portion of distribution curve ② comes to lie within a range of the power limit, then the integrated circuits in this portion have a problem of occurring, such as, heat runaway, or the erroneous operations, therefore they cannot be used as the products. Namely, the chips which come into this power limit range are unqualified chips, and they cannot be applied to the practical use. In an actual practice, it is necessary to set the power limit range into a lower portion of the operating speed, by taking the changes of temperature and safety margin thereof into the consideration. However, if doing so, the unqualified chips increases in the number thereof, thereby deteriorating the yield rate of the products.

Figure 86:
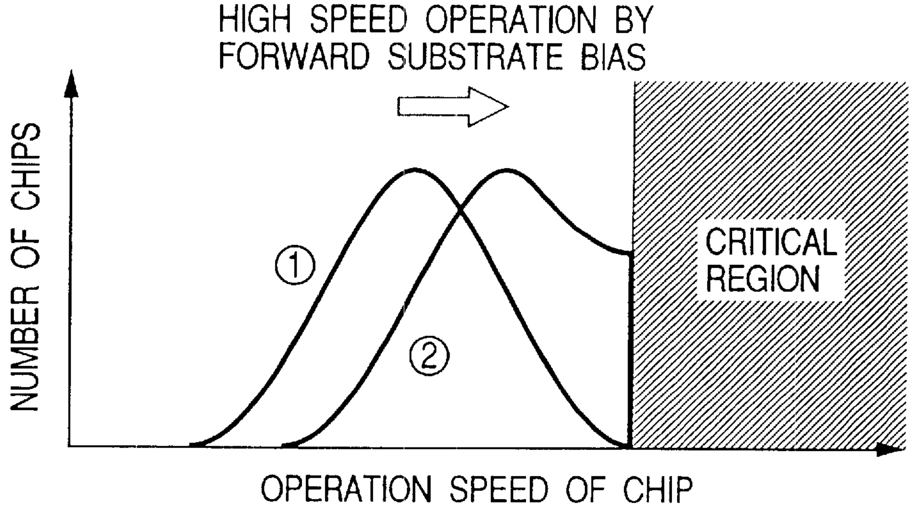
FIG. 86 is also a graph for showing the operating speed distribution of the semiconductor integrated circuit, for the purpose of explaining the present invention.

Then, if using the current limiting circuit according to the present invention, it is possible to obtain the limitation without accelerating the speed of the integrated circuits up to the power limit range thereof. Due to this, it comes to be as such indicated by the speed distribution curve shown in FIG. 86, therefore it is possible to prevent from a possibility of occurring the integrated circuits being useless due to the power limit. Namely, applying the forward bias mentioned above to the chips having the speed distribution curve, such as ①, due to the threshold voltage which is set up in the manufacturing process mentioned above, and further adding thereto a safety circuit for conducting the current limiting in response to the leak current flowing through the main circuit, the chips, which show the problem of entering into the limit range of the electric power mentioned above thereby occurring the heat runaway or the erroneous operations, are restricted not to enter into such the power limit range by the current limiting circuit mentioned above.

With such the structure, the chips on which the above-mentioned current limiting circuit is operable for conducting the current limiting thereby come to operate just before entering into the power limit range mentioned above, where the integrated circuit causes the problems of such as the heat runaway and the erroneous operations, then it is possible to ensure the safety and the reliability of the chips, while maintaining the operating speed thereof at the maximum level, therefore it is possible to improve the yield rate of the products, greatly.

Figure 87:
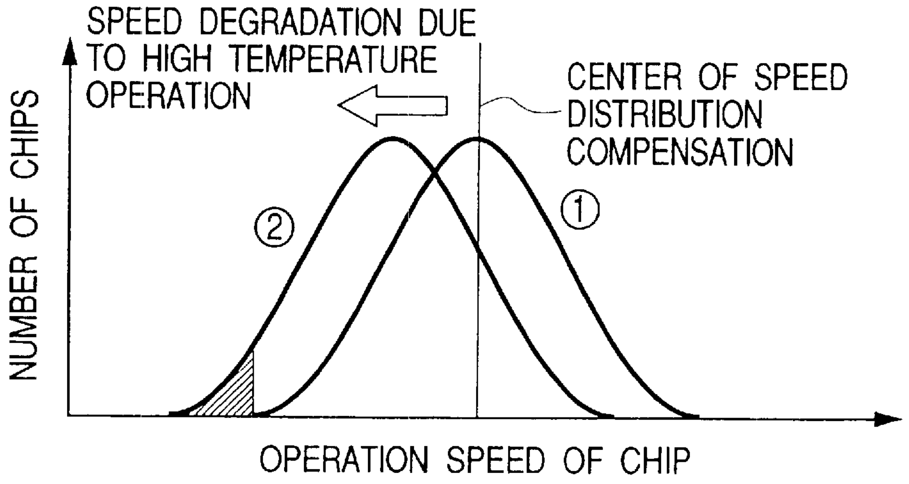
FIG. 87 is also a graph for showing the operating speed distribution of the semiconductor integrated circuit, for the purpose of explaining the present invention.

In FIG. 87 is shown an example, wherein the operating speed thereof is compensated to be constant by changing the value of the forward bias. For the integrated circuits having a constant fluctuation therewith, the speeds of all the integrated circuits are centralized or collected to the center of compensation, as shown by the distribution characteristic ①, i.e., by bringing the forward bias to be small to slow down the speed thereof, for those being faster than the center of compensation, while bringing the forward bias to be large to accelerate it, for those being slower that the center of compensation.

However, in a case where the temperature of the integrated circuits rise up due to the circumferences thereof when they are in operation, the speed of the integrated circuits slow down, as is shown by the distribution curve ②. Then, in the range along the distribution curve where it is netted, for the purpose of compensating the speed reduction due to the rise-up of temperature, further it is necessary to apply the forward bias thereto, therefore, it sometimes results that the electric power exceeds the limit thereof. Even in such the case, with provision of the current limiting circuit, it is possible to protect the integrated circuits from exceeding over the limit in electric power thereof.

The followings are functions and/or effects obtainable from the embodiments mentioned in the above:

(1) According to the semiconductor integrated circuit device, in which for a main circuit being constructed with CMOS are provided a speed monitor circuit for forming a speed signal corresponding to an operating speed thereof, and a substrate bias controller for supplying corresponding substrate bias voltages to semiconductor regions, where the P-channel type MOSFET and the N-channel type MOSFET are formed for constructing the main circuit and the speed monitor circuit mentioned above therewith, respectively, wherein the substrate bias voltages are formed by means of the substrate bias controller mentioned above, so that a speed signal to be set at corresponding one of plural kinds of the operating speeds and the speed signal mentioned above are coincident with, thereby obtaining an effect of achieving the semiconductor integrated circuit device, which can realize the low electric power consumption, as well as the improvement on the yield rate of products, while maintaining the reducing of the circuit scale thereof.

(2) In addition thereto, according to the semiconductor integrated circuit device mentioned above, wherein the speed of operation comprises at least two of either a low speed mode, a middle speed mode, a high speed mode or a speed for standby mode, therefore it is possible to obtain an effect that the low electric power consumption can be realized corresponding to respective circuit functions thereof.

(3) In addition thereto, according to the semiconductor integrated circuit device mentioned above, the above-mentioned substrate bias controller gives desired substrate bias potentials to the above-mentioned P-channel type MOSFET and N-channel type MOSFET constructing the above-mentioned main circuit and speed monitor circuit, respectively, within a region from a forward direction to a back direction of the above-mentioned semiconductor region and source region thereof, whereby it is possible to perform the bias control, effectively, and at the same time, to obtain an effect of fitting for the miniaturization of elements since it is possible to suppress the fluctuation in the threshold voltage due to the Short-Channel effect.

(4) In addition thereto, according to the semiconductor integrated circuit device mentioned above, the above-mentioned speed monitor circuit is constructed with a clock duty converter and a train of delay elements, so as to convert a clock signal inputted as a speed information in a form of frequency into a signal having a desired duty ratio through the clock duty converter, thereby providing a reference signal, while inputting the above-mentioned reference signal through the above-mentioned train of delay elements so as to output at least one (1) delay signal after the desired delay time, and the substrate bias controller is constructed with a phase and frequency comparator and a substrate bias generator, so as to output an UP signal or a DOWN signal depending upon difference in the phases of two (2) signals while inputting the above-mentioned reference signal and the delay signal, thereby producing the substrate biases for the above-mentioned P-channel type MOSFET and the N-channel type MOSFET, by means of the substrate bias generator, whereby an effect can be obtained that it is possible to set the above-mentioned main circuit at the desired operating speed, through combining the frequency of the above-mentioned clock signal and the delay time of the above-mentioned train of delay elements, with a simple construction, and also by means of inputting a software-like signal of changing the frequency of the above-mentioned clock.

(5) In addition thereto, according to the semiconductor integrated circuit device mentioned above, the above-mentioned speed monitor circuit is constructed with a ring oscillator, changing the frequency thereof depending upon the above-mentioned bias voltage, while the substrate bias controller is constructed with the phase and frequency comparator and the substrate bias generator, wherein two (2) signals, i.e., the clock signal, being inputted as the speed information in a form of frequency, and the above-mentioned oscillation signal are inputted to be compared in frequency difference therebetween, so as to output the UP signal or the DOWN signal depending upon the frequency difference, thereby producing the substrate biases for the above-mentioned P-channel type MOSFET and the N-channel type MOSFET, by means of the substrate bias generator, wherein an effect can be obtained that it is possible to set the above-mentioned main circuit at the desired operating speed, through combining the frequency of the above-mentioned clock signal and the number of a delay stage of the above-mentioned ring oscillator, with a simple construction, and also by means of inputting a software-like signal of changing the frequency of the above-mentioned clock signal.

(6) In addition thereto, according to the semiconductor integrated circuit device mentioned above, there is further provided a current limiting circuit, wherein at least one control signal is generated corresponding to current or temperature of the above-mentioned main circuit, while giving a limit upon the control of the above-mentioned substrate bias controller from the above-mentioned speed monitor circuit, so as to prevent the current flowing through the above-mentioned main circuit or the operating temperature of the above-mentioned main circuit from becoming larger than a desired value thereof, thereby obtaining an effect that high reliability of the semiconductor can be achieved, while using the above-mentioned substrate bias up to the forward bias region.

(7) In addition thereto, according to the semiconductor integrated circuit device mentioned above, the above-mentioned current limiting circuit transmits the above-mentioned control signal to at least one of the phase and frequency comparator and the substrate bias generator mentioned above, thereby obtaining an effect that high reliability of the semiconductor can be achieved, while using the above-mentioned substrate bias up to the forward bias region.

(8) In addition thereto, according to the semiconductor integrated circuit device mentioned above, there is further provided a control signal generator, to form a speed signal being set at corresponding one of the plural kinds of the operating signals mentioned above, upon receipt of the clock signal and a mode change signal indicative of the operating speed, thereby enabling to form a speed setting signal within the semiconductor integrated circuit device, therefore it is possible to obtain an effect of improving the usability thereof.

(9) In addition thereto, according to the semiconductor integrated circuit device mentioned above, the control signal generator mentioned above is constructed with a clock generator, a frequency divider and a first selector, wherein the clock signal having a predetermined frequency is formed by the clock generator mentioned above, while outputting frequency divided signals having at least two (2) kinds of frequencies by the above-mentioned frequency divider, and one of the above-mentioned frequency divided signals is selected by the above-mentioned first selector corresponding to the above-mentioned mode change signal, so as to be outputted, thereby obtaining an effect that the above-mentioned plural kinds of speed information can be generated within the semiconductor integrated circuit device with the simple construction thereof.

(10) In addition thereto, according to the semiconductor integrated circuit device mentioned above, there is provided an output selector circuit in the train of delay elements of the speed monitor circuit mentioned above, inputting the above-mentioned reference signal so as to output one of the plural number of the delay signals after elapsing desired delay times corresponding to the mode change signal indicative of the operating speed, thereby obtaining an effect that the above-mentioned plural kinds of speed information can be generated within the semiconductor integrated circuit device with the simple construction thereof.

(11) In addition thereto, according to the semiconductor integrated circuit device mentioned above, a plural number of selector circuits for feedback loops are provided in the ring oscillator of the speed monitor circuit mentioned above, so as to select one from the plural number of the feedback loops corresponding to the mode change signal indicative of the operating speed, thereby obtaining an effect that the above-mentioned plural kinds of speed information can be generated within the semiconductor integrated circuit device with the simple construction thereof.

(12) In addition thereto, according to the semiconductor integrated circuit device mentioned above, the above-mentioned main circuit is divided into a plural number of circuit blocks, and for each one of the above-mentioned circuit blocks is provided the speed monitor circuit and the substrate bias controller mentioned above, thereby enabling to perform fine speed control for each the circuit block, as well as obtaining an effect that further low electric power consumption can be achieved therewith.

(13) In addition thereto, according to the semiconductor integrated circuit device mentioned above, wherein as such the substrate bias controller mentioned above, a control signal generator for forming a digital signal corresponding to the substrate voltage and a D/A converter for forming an analog voltage upon receipt of the above-mentioned digital signal are provided for each of the above-mentioned plural number of the circuit blocks divided, thereby obtaining an effect achieving the simplification of the circuit while achieving the stability of the substrate bias.

(14) In addition thereto, according to the semiconductor integrated circuit device mentioned above, the above-mentioned substrate bias controller is constructed with a control signal generator for forming the digital signal corresponding to the substrate voltage, and a D/A converter for forming the above-mentioned substrate voltage upon receipt of the above-mentioned digital signal is provided in an outside of the semiconductor integrated circuit device mentioned above, thereby obtaining an effect that it is possible to select the voltage supply for substrate bias, being most suitable for each the semiconductor integrated circuit device.

(15) In addition thereto, according to the semiconductor integrated circuit device mentioned above, there are provided impedance means, each being provided in a voltage supply passage for supplying a corresponding substrate bias voltage to each of regions, where the P-channel type MOSFET and the N-channel type MOSFET are formed, respectively, for constructing at least the above-mentioned main circuit, wherein by limiting positive bias voltages which are supplied to the above-mentioned semiconductor regions depending upon the current flowing such the impedance means, an operation of limiting electric power is enabled with high accuracy, corresponding to the leak current being actually consumed by the LSI1, thereby obtaining an effect of achieving an improvement on the reliability thereof.

(16) In addition thereto, according to the semiconductor integrated circuit device mentioned above, wherein as the above-mentioned impedance means are used resistor elements, being formed in the semiconductor integrated circuit device, thereby obtaining an effect that high integration can be maintained.

(17) In addition thereto, according to the semiconductor integrated circuit device mentioned above, wherein as the above-mentioned impedance means is used a MOSFET, which is turned into ON state by applying a predetermined voltage to the gate thereof, steadily, thereby obtaining an effect that high integration can be maintained.

(18) In addition thereto, according to the semiconductor integrated circuit device mentioned above, wherein as the above-mentioned impedance means are used a plural number of resistor elements and switching elements for selecting such the plural number of resistor elements, and a plural number of resistance values can be set through selective switching control of the switching elements mentioned above, thereby obtaining an effect that the most suitable power control can be selected.

(19) In addition thereto, according to the semiconductor integrated circuit device mentioned above, wherein the above-mentioned impedance means is constructed with a plural number of MOSFETs and a control circuit for selectively turning such the plural number of MOSFETs into ON state, and a plural number of resistance values can be set through selective operation of the MOSFET, thereby obtaining an effect that the most suitable power control can be selected.

(20) According to a semiconductor integrated circuit device, wherein, for a main circuit being constructed with CMOS are provided a speed monitor circuit for forming a speed signal corresponding to an operating speed thereof, and a power voltage generator, thereby, while reducing the scale of circuits for controlling the operating voltages of the main circuit and the speed monitor circuit mentioned above, so that the speed signal being set at corresponding one of the plural kinds of operating speeds and the above-mentioned speed signal are coincident with, by means of the power voltage generator mentioned above, obtaining an effect of achieving the semiconductor integrated circuit device, which can realize the low electric power consumption, as well as the improvement on the yield rate of products.

(21) According to a semiconductor integrated circuit device mentioned above, while supplying a positive bias voltage to the semiconductor regions where MOSFET is formed for constructing the main circuit by means of the substrate bias circuit, there is provided current limiting circuits for limiting the current supplied to the above-mentioned semiconductor region in response to the substrate current flowing between the semiconductor region and the source, thereby obtaining an effect of achieving the semiconductor integrated circuit device, which can realize the high speed, while maintaining an improvement on the yield rate of products as well as the reliability thereof.

(22) In addition thereto, according to the semiconductor integrated circuit device mentioned above, the above-mentioned current limiting circuit is constructed by using an output impedance of an output circuit, which is provided in the above-mentioned substrate bias circuit for outputting the substrate voltage mentioned above, thereby obtaining an effect that the number of the circuit elements can be reduced.

(23) In addition thereto, according to the semiconductor integrated circuit device mentioned above, the above-mentioned current limiting circuit is constructed by using the resistor elements formed in the semiconductor integrated circuit device, thereby obtaining an effect that it is easy to make circuit design for the current limiting operation depending upon the circuit scale of the main circuit, while maintaining the high integration thereof.

(24) In addition thereto, according to the semiconductor integrated circuit device mentioned above, wherein as the above-mentioned current limiting circuit is used the MOSFET, which is turned into ON state by applying the predetermined voltage to the gate thereof, steadily, thereby obtaining an effect that it is easy to make circuit designing for the current limiting operation depending upon the circuit scale of the main circuit, while maintaining the high integration thereof.

(25) In addition thereto, according to the semiconductor integrated circuit device mentioned above, as the above-mentioned current limiting circuit are provided a plural number of resistor elements and switching elements for selecting such the plural number of resistor elements, wherein a plural number of resistance values can be set through selective switching control of the switching elements mentioned above, thereby obtaining an effect that the most suitable power control can be selected.

(26) In addition thereto, according to the semiconductor integrated circuit device mentioned above, the above-mentioned current limiting circuit is constructed with a plural number of MOSFETs and a control circuit for selectively turning such the plural number of MOSFETs into ON state, wherein a plural number of resistance values can be set through the selective operation of the MOSFETs, thereby obtaining an effect that the most suitable power control can be selected.

(27) In addition thereto, according to the semiconductor integrated circuit device mentioned above, the above-mentioned MOSFET is constructed with CMOS circuit comprising P-channel type MOSFET and N-channel type MOSFET, wherein the above-mentioned substrate bias circuit is constructed with a first substrate bias circuit corresponding to the P-channel type MOSFET mentioned above and a second substrate bias circuit corresponding to the N-channel type MOSFET mentioned above, thereby obtaining an effect of obtaining the substrate voltages corresponding to the respective MOSFETs.

(28) According to a semiconductor integrated circuit device, while supplying a positive bias voltage to the semiconductor regions where the MOSFET is formed for constructing the main circuit by means of the substrate voltage bias circuit, as well as transmitting the above-mentioned bias voltage to the semiconductor region, there is provided a MOSFET in which the maximum current thereof is limited to be constant, thereby obtaining an effect of achieving the semiconductor integrated circuit device, which can realize the high speed, while maintaining an improvement on the yield rate of products, and the reliability thereof as well.

(29) In addition thereto, according to the semiconductor integrated circuit device mentioned above, the MOSFET circuit performing the above-mentioned current limit operation uses a MOSFET, through which only a predetermined constant current can flow, and a circuit connected in the current-mirror connection, thereby obtaining an effect of enabling a stable operation for the current limit.

In the above, though the explanation was fully given on the embodiments which are made by the present inventors, however it is needless to say, the present invention should not be restricted only to the embodiments mentioned above, and may be changed or altered in various manners, but within a scope not deviated beyond the gist of the present invention. For example, the concrete structures of the speed monitor circuit, the substrate bias controller, the phase and frequency comparator and the substrate bias voltage generator may take various modes of embodiments thereof. And, the present invention can be utilized widely into the semiconductor integrated circuit devices constructed with the MOSFET.

Explaining briefly the effects obtained by the representative ones of the present invention which is disclosed in the present application, they are as follows. In the semiconductor integrated circuit device, according to the present invention, for a main circuit being constructed with CMOS are provided a speed monitor circuit for forming a speed signal corresponding to an operating speed thereof, and a substrate bias controller for supplying substrate bias voltages corresponding to semiconductor regions, where P-channel type MOSFET and N-channel type MOSFET constructing the main circuit and the speed monitor circuit mentioned above are formed, respectively, wherein the substrate bias voltage is formed by means of the substrate bias controller mentioned above, so that a speed signal being set at corresponding one of plural kinds of the operating speeds and the speed signal mentioned above are coincident with, thereby obtaining the semiconductor integrated circuit device, realizing the low electric power consumption, as well as the improvement on the yield rate of products, while reducing the circuit scale thereof.

In the semiconductor integrated circuit device, according to the present invention, for a main circuit being constructed with CMOS are provided a speed monitor circuit for forming a speed signal corresponding to an operating speed thereof, and a power voltage generator, thereby, while reducing the scale of circuits for controlling the operation voltages of the main circuit and the speed monitor circuit mentioned above, so that the speed signal being set at corresponding one of the plural kinds of operating speeds and the above-mentioned speed signal are coincident with, by means of the power voltage generator mentioned above, obtaining the semiconductor integrated circuit device, realizing the low electric power consumption, and the improvement on the yield rate of products, as well.

In the semiconductor integrated circuit device, according to the present invention, while supplying a positive bias voltage to the semiconductor regions where the MOSFET are formed for constructing the main circuit, by means of the substrate bias circuit, there is provided a current limiting circuit for limiting the current supplied to the above-mentioned semiconductor region, in response to the substrate current flowing between the semiconductor region and the source thereof, thereby obtaining the semiconductor integrated circuit device, which realizes the high speed, while maintaining improvements on the yield rate of products, as well as on the reliability thereof.

What is claimed is:

1. A semiconductor integrated circuit device, comprising:

a main circuit, comprised of a CMOS circuit, and being operative upon receiving a clock signal;

a speed monitor circuit, comprised of a CMOS circuit, and for generating a speed signal therefrom; and a substrate bias controller for supplying substrate bias voltage to semiconductor areas where P-channel type MOSFETs and N-channel type MOSFETs are formed so as to construct said CMOS circuits of said main circuit and said speed monitor circuit, respectively, wherein:

said substrate bias voltages are generated so that a frequency of said clock signal coincides with a delay time of said speed monitor circuit, so that said main circuit operates in synchronism with said clock signal, and, wherein speed of operation of said main circuit comprises at least two of a low speed, a middle speed, a high speed or a speed for standby.

2. A semiconductor integrated circuit device as defined in the claim 1, wherein said substrate bias controller gives desired substrate bias potentials to said P-channel type MOSFET and said N-channel type MOSFET constructing said CMOS circuits of said main circuit and said speed monitor circuit, respectively, within a region from a forward direction to a reverse direction thereof.

3. A semiconductor integrated circuit device as defined in the claim 2, further comprising a power limiting circuit, wherein:

said power limiting circuit generates at least one limiting signal depending upon current or temperature of said main circuit, so as to give a limit on control to said substrate bias controller, thereby preventing the current flowing through said main circuit or the temperature in operation of said main circuit or the temperature in operation of said main circuit from being larger than desired values thereof.

4. A semiconductor integrated circuit device as defined in the claim 3, wherein said substrate bias controller includes a phase comparator, a frequency comparator and a substrate bias generator, and said power limiting circuit transmits said one limiting signal to at least one of said phase comparator, said frequency comparator and said substrate bias generator.

5. A semiconductor integrated circuit device as defined in the claim 4 wherein, said speed monitor circuit comprises a clock duty converting circuit and a train of delay elements;

said clock duty converting circuit, upon receipt of a clock signal into which speed information is inputted in a form of frequency, converts said clock signal into a signal having a desired duty ratio, so as to be output as a reference signal;

said train of delay elements, upon receipt of said reference signal, outputs at least a delay signal after a desired delay time;

said phase and frequency comparators of said substrate bias controller input said reference signal and said delay signal for comparing a phase difference between those two signals, so as to output an UP or DOWN signal therefrom depending upon the phase difference; and said substrate bias generator, upon receipt of said UP and DOWN signals, generates substrate biases for said P-channel type MOSFETs and said N-channel type MOSFETs corresponding thereto.

6. A semiconductor integrated circuit device as defined in the claim 2, further comprising a control signal generator, wherein, said control signal generator, upon receipt of the clock signal and a mode change signal indicating speed of operation, forms a control signal which is set corresponding to plural kinds of said speed of operation.

7. A semiconductor integrated circuit device as defined in the claim 6, wherein:

said control signal generator comprises a clock generator, a frequency divider and a first selector, wherein said clock generator forms a clock signal of a predetermined frequency;

said clock generator forms a clock signal of a predetermined frequency;

said frequency divider, upon receipt of the clock signal which is formed by said clock generator, outputs a frequency divided signal having a least two kinds of frequencies; and said first selector, upon receipt of said mode change signal, selects one divided signal having one frequency from the frequency divided signals, corresponding thereto, thereby to be output as said control signal.

8. A semiconductor integrated circuit device as defined in the claim 3, wherein:

said main circuit is divided into a plurality of circuit blocks; and each one of said circuit blocks includes said speed monitor circuit and said substrate bias controller.

9. A semiconductor integrated circuit device as defined in the claim 2, further comprising a current limiting means, wherein:

said current limiting means is provided on voltage supply passages for supplying substrate bias voltage corresponding to each one of semiconductor regions wherein said P-channel type MOSFET and said N-channel type MOSFET are formed respectively, thereby preventing from over-flow of current due to a positive bias voltage supplied to said semiconductor region.

10. A semiconductor integrated circuit device as defined in the claim 9, wherein:

said current limiting means is comprised of a resistor element formed in a semiconductor integrated circuit.

11. A semiconductor integrated circuit device as defined in the claim 9, wherein:

said current limiting means is comprised of a MOSFET which is turned into ON condition, being applied with a predetermined voltage at a gate thereof, steadily.

12. A semiconductor integrated circuit device as defined in the claim 9, wherein:

said current limiting means includes a plural number of resistor elements and switching elements for selecting the plural number of resistor elements, thereby being settable at a plural number of resistance values through selective switch control by said switching elements.

13. A semiconductor integrated circuit device as defined in the claim 9, wherein:

said current limiting means is comprised of a plural number of MOSFETs and a control circuit for turning such the plural number of MOSFETS into ON state, selectively, thereby being settable at a plural number of resistance values through selective operation of MOSFETs.

14. A semiconductor integrated circuit device comprising:

a main circuit, comprised of a CMOS circuit, and being operative upon receiving a clock signal;

a speed monitor circuit, comprised of a CMOS circuit, and for generating a speed signal therefrom; and a substrate bias controller for supplying substrate bias voltage to semiconductor areas where P-channel type MOSFETs and N-channel type MOSFETs are formed so as to construct said CMOS circuits of said main circuit and said speed monitor circuit, respectively, wherein:

said substrate bias voltages are generated so that a frequency of said clock signal coincides with a delay time of said speed monitor circuit, so that said main circuit operates in synchronism with said clock signal, and, wherein, said speed monitor circuit comprises a clock duty converting circuit and a train of delay elements;

said clock duty converting circuit, upon receipt of a clock signal into which a speed information is inputted in a form of frequency, converts said clock signal into a signal having a desired duty ratio, so as to output as a reference signal;

said train of delay elements, upon receipts of said reference signal, outputs at least-a delay signal after a desired delay time;

said substrate bias controller includes a phase and frequency comparator and a substrate bias generator;

said phase and frequency comparator inputs said reference signal and said delay signal for comparing a phase difference between those two signals, so as to output an UP or DOWN signal therefrom depending upon the phase difference; and said substrate bias generator, upon receipt of said UP and DOWN signals, generates substrate biases for said P-channel type MOSFET and said N-channel type MOSFET corresponding thereto.

15. A semiconductor integrated circuit device as defined in the claim 14, wherein:

the train of delay elements of said speed monitor circuit further comprises an output selecting circuit, wherein:

said output selecting circuit, inputting said reference signal, outputs one of plural number of the delay signals after lapsing the desired delay times thereof, corresponding to the mode change signal indicative of the speed of operation.

16. A semiconductor integrated circuit device comprising:

a main circuit, comprised of a CMOS circuit, and being operative upon receiving a clock signal;

a speed monitor circuit, comprised of a CMOS circuit, and for generating a speed signal therefrom; and a substrate bias controller for supplying substrate bias voltage to semiconductor areas where P-channel type MOSFETs and N-channel type MOSFETs are formed so as to construct said CMOS circuits of said main circuit and said speed monitor circuit, respectively, wherein:

said substrate bias voltages are generated so that a frequency of said clock signal coincides with a delay time of said speed monitor circuit, so that said main circuit operates in synchronism with said clock signal, and, wherein:

said substrate bias controller comprises a control signal generator for forming a digital signal corresponding to substrate voltage, and a D/A converter for generating an analog voltage upon receipt of said digital signal;

said main circuit is divided into a plurality of circuit blocks;

said D/A converter is provided for each one of said circuit blocks and said substrate bias controller transmits a digital signal to each said D/A converter respectively provided for each one of said circuit blocks.

17. A semiconductor integrated circuit device as defined in the claim 1, wherein:

said substrate bias controller comprises a control signal generator for forming a digital signal corresponding to substrate voltage; and a D/A converter is provided outside the semiconductor integrated circuit device, for forming said substrate voltage upon receipt of said digital signal.

18. A semiconductor integrated circuit device, comprising:

main circuit being comprised of at least one CMOS circuit;

a speed monitor circuit, comprised of at least one CMOS circuit in the same manner as said main circuit, for forming a speed signal therefrom, corresponding to operating speed in the CMOS circuit of said main circuit; and a power voltage generator, wherein:

operating voltages of said main circuit and said speed monitor circuit are controlled by said power voltage generator, so that said speed signal corresponding to operating speeds of the CMOS circuit of said main circuit becomes coincident with a reference speed signal corresponding to a desired operating speed of said CMOS circuit of said main circuit.

* * * * *